United States Patent
Cooper et al.

(10) Patent No.: US 12,164,768 B2
(45) Date of Patent: Dec. 10, 2024

(54) MEDICAL IMAGING DATA COMPRESSION UTILIZING CODEBOOKS

(71) Applicant: AtomBeam Technologies Inc., Moraga, CA (US)

(72) Inventors: Joshua Cooper, Columbia, SC (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 18/434,756

(22) Filed: Feb. 6, 2024

(65) Prior Publication Data

US 2024/0211133 A1 Jun. 27, 2024

Related U.S. Application Data

(63) Continuation-in-part of application No. 18/295,238, filed on Apr. 3, 2023, now Pat. No. 11,928,335, which is a continuation of application No. 17/974,230, filed on Oct. 26, 2022, now Pat. No. 11,687,241, which is a continuation-in-part of application No. 17/884,470, filed on Aug. 9, 2022, now abandoned, which is a continuation of application No. 17/727,913, filed on Apr. 25, 2022, now Pat. No. 11,620,051, which is a continuation of application No. 17/404,699, filed on Aug. 17, 2021, now Pat. No. 11,385,794, which is a continuation-in-part of application No. 16/455,655, filed on Jun. 27, 2019, now Pat. No. 10,509,771, which is a continuation-in-part of application No. 16/200,466, filed on Nov. 26, 2018, now Pat. No. 10,476,519, which is a continuation-in-part of
(Continued)

(51) Int. Cl.
  *G06F 3/06* (2006.01)
  *H03M 7/30* (2006.01)

(52) U.S. Cl.
  CPC .......... *G06F 3/0608* (2013.01); *G06F 3/0623* (2013.01); *G06F 3/0659* (2013.01); *G06F 3/067* (2013.01); *H03M 7/6005* (2013.01); *H03M 7/6011* (2013.01)

(58) Field of Classification Search
  None
  See application file for complete search history.

(56) References Cited

U.S. PATENT DOCUMENTS

| | | |
|---|---|---|
| 5,408,234 A | 4/1995 | Chu |
| 7,667,630 B2 | 2/2010 | Harada et al. |
| 9,294,589 B2 | 3/2016 | Crosta et al. |

(Continued)

*Primary Examiner* — Michael Alsip
(74) *Attorney, Agent, or Firm* — Galvin Patent Law LLC; Brian R. Galvin

(57) ABSTRACT

Compression of medical imaging data using codebooks and entropy encoding. Medical imaging data such as tomosynthesis imagery data may be compressed using codewords based on frequency analysis. In an implementation sequential registration technique may be applied to the medical imaging data to create a plurality transformation matrices. The plurality of transformation matrices may be compressed using a matrix codebook. The compressed medical imaging data may be represented as an image codebook and the matrix codebook, providing secure storage and lossless compression of sensitive medical information.

10 Claims, 43 Drawing Sheets

Related U.S. Application Data application No. 15/975,741, filed on May 9, 2018, now Pat. No. 10,303,391.

(60) Provisional application No. 63/232,050, filed on Aug. 11, 2021, provisional application No. 62/578,824, filed on Oct. 30, 2017.

(56) References Cited

U.S. PATENT DOCUMENTS

| | | |
|---|---|---|
| 10,255,315 B2 | 4/2019 | Kalevo et al. |
| 10,264,262 B2 | 4/2019 | Swaminathan et al. |
| 2017/0251212 A1* | 8/2017 | Swaminathan ...... H04N 19/196 |
| 2018/0196609 A1 | 7/2018 | Niesen |

* cited by examiner

MEDICAL IMAGING DATA COMPRESSION UTILIZING CODEBOOKS

CROSS-REFERENCE TO RELATED APPLICATIONS

Priority is claimed in the application data sheet to the following patents or patent applications, each of which is expressly incorporated herein by reference in its entirety:
Ser. No. 18/295,238
Ser. No. 17/974,230
Ser. No. 17/884,470
63/232,050
Ser. No. 17/727,913
Ser. No. 17/404,699
Ser. No. 16/455,655
Ser. No. 16/200,466
Ser. No. 15/975,741
62/578,824

BACKGROUND OF THE INVENTION

Field of the Invention

The present invention is in the field of computer data compression, and in particular the usage of codebook-based compression of data.

Discussion of the State of the Art

As computers become an ever-greater part of our lives, and especially in the past few years, data storage has become a limiting factor worldwide. Prior to about 2010, the growth of data storage far exceeded the growth in storage demand. In fact, it was commonly considered at that time that storage was not an issue, and perhaps never would be, again. In 2010, however, with the growth of social media, cloud data centers, high tech and biotech industries, global digital data storage accelerated exponentially, and demand hit the zettabyte (1 trillion gigabytes) level. Current estimates are that data storage demand will reach 175 zettabytes by 2025. By contrast, digital storage device manufacturers produced roughly 1 zettabyte of physical storage capacity globally in 2016. We are producing data at a much faster rate than we are producing the capacity to store it. In short, we are running out of room to store data, and need a breakthrough in data storage technology to keep up with demand.

The primary solutions available at the moment are the addition of additional physical storage capacity and data compression. As noted above, the addition of physical storage will not solve the problem, as storage demand has already outstripped global manufacturing capacity. Data compression is also not a solution. A rough average compression ratio for mixed data types is 2:1, representing a doubling of storage capacity. However, as the mix of global data storage trends toward multi-media data (audio, video, and images), the space savings yielded by compression either decreases substantially, as is the case with lossless compression which allows for retention of all original data in the set, or results in degradation of data, as is the case with lossy compression which selectively discards data in order to increase compression. Even assuming a doubling of storage capacity, data compression cannot solve the global data storage problem.

Transmission bandwidth is also increasingly becoming a bottleneck. Large data sets require tremendous bandwidth, and we are transmitting more and more data every year between large data centers. On the small end of the scale, we are adding billions of low bandwidth devices to the global network, and data transmission limitations impose constraints on the development of networked computing applications such as the "Internet of Things."

Furthermore, as quantum computing becomes more and more imminent, the security of data, both stored data and data streaming from one point to another via networks, becomes a critical concern as existing encryption technologies based on difficult-to-solve mathematical calculations are placed at risk.

Entropy encoding methods can be used to partially solve some of these data compression issues. However, existing entropy encoding methods either fail to account for, or inefficiently encode, data that has not previously been processed by the encoding method, and thus lead to inefficient compression of data in many cases.

What is needed is a system and method for compressing data that uses mismatch probability estimation to improve entropy encoding methods to account for, and efficiently handle, previously unseen data in data to be compressed.

SUMMARY OF THE INVENTION

The inventor has developed a system and method for compressing medical imaging data. Compression of medical imaging data using codebooks and entropy encoding. Medical imaging data such as tomosynthesis imagery data may be compressed using codewords based on frequency analysis. In an implementation sequential registration technique may be applied to the medical imaging data to create a plurality transformation matrices. The plurality of transformation matrices may be compressed using a matrix codebook. The compressed medical imaging data may be represented as an image codebook and the matrix codebook, providing secure storage and lossless compression of sensitive medical information.

According to a preferred embodiment, a system for compressing medical imaging data using codebooks is disclosed, comprising: a computing system comprising at least a memory and a processor; an encoder comprising a first plurality of programming instructions that, when operating on the processor, cause the computing system to: receive medical imaging data, the medical imaging data comprising a sequence of images; deconstruct the medical imaging data into a plurality of sourceblocks; and generate an image codebook from the plurality of sourceblocks using an entropy encoding method wherein codewords are assigned to each sourceblock based on its frequency of occurrence.

According to another preferred embodiment, a method for compressing medical imaging data using codebooks is disclosed, comprising the steps of: receiving medical imaging data, the medical imaging data comprising a sequence of images; deconstructing the medical imaging data into a plurality of sourceblocks; and generating an image codebook from the plurality of sourceblocks using an entropy encoding method wherein codewords are assigned to each sourceblock based on its frequency of occurrence.

According to an aspect of an embodiment, the medical imaging data comprises tomosynthesis imaging data.

According to an aspect of an embodiment, a transformation estimation subsystem comprising a second plurality of programming instructions that, when operating on the processor, cause the computing system to: receive the medical imaging data; select an image from the sequence of images to be a reference image; for each remaining image of the sequence of images: estimate a transformation between the reference image and the image by representing the estimate transformation as a matrix, wherein the matrix elements correspond to parameters of the transformation; construct a transformation matrix based on the estimated parameters; store the plurality of transformation matrices in a data storage system.

According to an aspect of an embodiment, the encoder is further configured to: obtain the plurality of transformation matrices; deconstruct the plurality of transformation matrices into a plurality of sourceblocks; generate a matrix codebook from the plurality of sourceblocks using an entropy encoding method wherein codewords are assigned to each sourceblock based on its frequency of occurrence; and store the matrix codebook and the image codebook in the data storage system.

According to an aspect of an embodiment, the transformation estimation subsystem is further configured to decompose each transformation matrix into two or more matrices. According to an aspect of an embodiment, the encoder is further configured to: obtain the decomposed transformation matrices; deconstruct the decomposed transformation matrices into a plurality of sourceblocks; generate a matrix codebook from the plurality of sourceblocks using an entropy encoding method wherein codewords are assigned to each sourceblock based on its frequency of occurrence; and store the matrix codebook and the image codebook in the data storage system.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary and are not to be considered as limiting of the scope of the invention or the claims herein in any way.

DETAILED DESCRIPTION OF THE INVENTION

Figure 1:
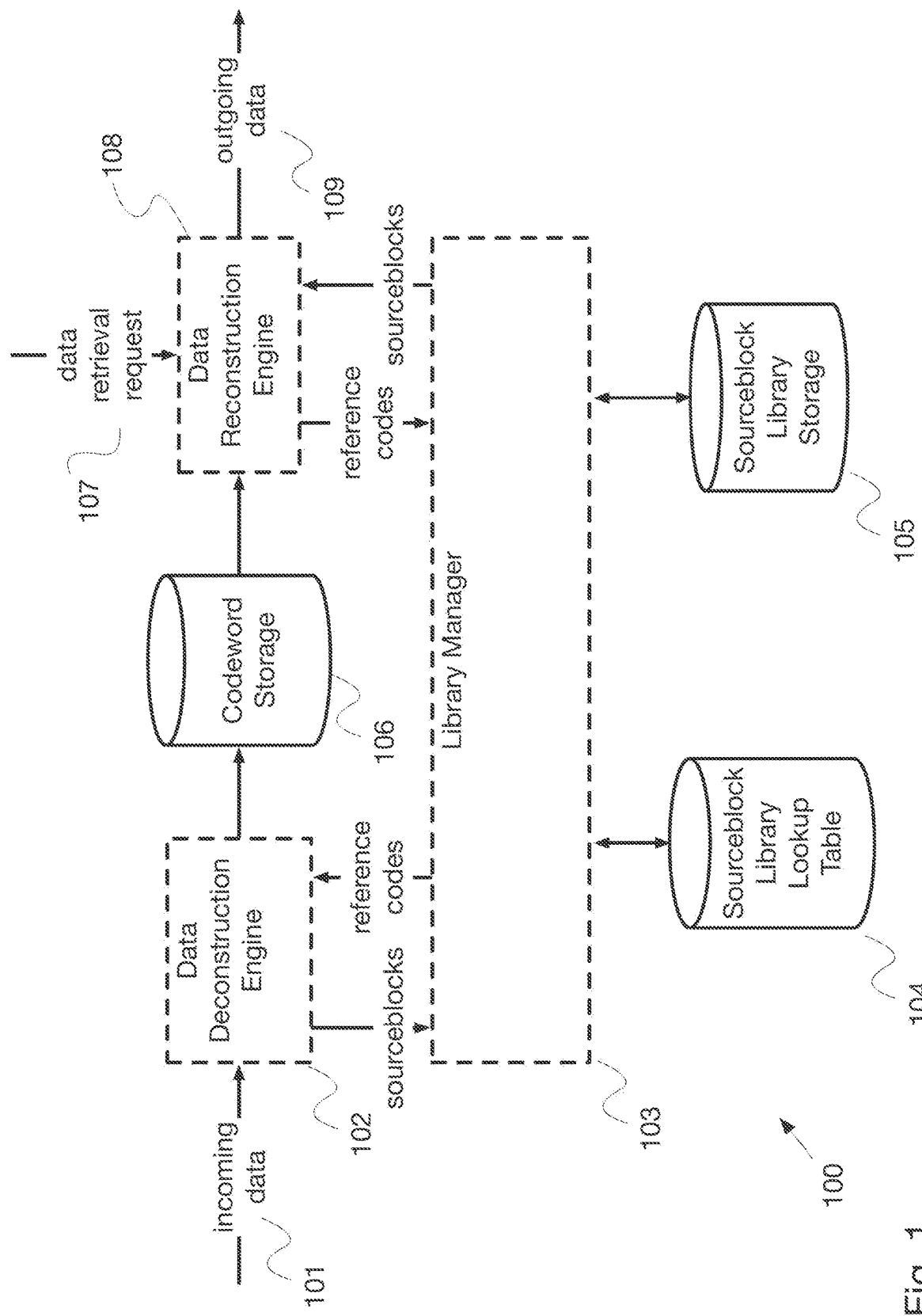
FIG. 1 is a diagram showing an embodiment of the system in which all components of the system are operated locally.

The inventor has conceived, and reduced to practice, a system and method for compressing data that uses mismatch probability estimation to improve entropy encoding methods to account for, and efficiently handle, previously unseen data in data to be compressed. Training data sets are analyzed to determine the frequency of occurrence of each sourceblock in the training data sets. A mismatch probability estimate is calculated comprising an estimated frequency at which any given data sourceblock received during encoding will not have a codeword in the codebook. Entropy encoding is used to generate codebooks comprising codewords for data sourceblocks based on the frequency of occurrence of each sourceblock. A "mismatch codeword" is inserted into the codebook based on the mismatch probability estimate to represent those cases when a block of data to be encoded does not have a codeword in the codebook. During encoding, if a mismatch occurs, a secondary encoding process is used to encode the mismatched sourceblock.

Entropy encoding methods (also known as entropy coding methods) are lossless data compression methods which replace fixed-length data inputs with variable-length prefix-free codewords based on the frequency of their occurrence within a given distribution. This reduces the number of bits required to store the data inputs, limited by the entropy of the total data set. The most well-known entropy encoding method is Huffman coding, which will be used in the examples herein.

Because any lossless data compression method must have a code length sufficient to account for the entropy of the data set, entropy encoding is most compress where the entropy of the data set is small. However, smaller entropy in a data set means that, by definition, the data set contains fewer variations of the data. So, the smaller the entropy of a data set used to create a codebook using an entropy encoding method, the larger is the probability that some piece of data to be encoded will not be found in that codebook. Adding new data to the codebook leads to inefficiencies that undermine the use of a low-entropy data set to create the codebook.

This disadvantage of entropy encoding methods can be overcome by mismatch probability estimation, wherein the probability of encountering data that is not in the codebook is calculated in advance, and a special "mismatch codework" is incorporated into the codebook (the primary encoding algorithm) to represent the expected frequency of encountering previously-unencountered data. When previously-unencountered data is encountered during encoding, attempting to encode the previously-unencountered data results in the mismatch codeword, which triggers a secondary encoding algorithm to encode that previously-unencountered data. The secondary encoding algorithm may result in a less-than-optimal encoding of the previously-unencountered data, but the efficiencies of using a low-entropy primary encoding make up for the inefficiencies of the secondary encoding algorithm. Because the use of the secondary encoding algorithm has been accounted for in the primary encoding algorithm by the mismatch probability estimation, the overall efficiency of compression is improved over other entropy encoding methods.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The term "codebook" refers to a database containing sourceblocks each with a pattern of bits and reference code unique within that library. The terms "library" and "encoding/decoding library" are synonymous with the term codebook.

The terms "compression" and "deflation" as used herein mean the representation of data in a more compress form than the original dataset. Compression and/or deflation may be either "lossless," in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio," and as used herein all mean the size of the original data relative to the size of the compressed data (e.g., if the new data is 70% of the size of the original, then the deflation/compression ratio is 70% or 0.7.)

The term "data" means information in any computer-readable form.

The term "data set" refers to a grouping of data for a particular purpose. One example of a data set might be a word processing file containing text and formatting information.

The term "effective compression" or "effective compression ratio" refers to the additional amount data that can be stored using the method herein described versus conventional data storage methods. Although the method herein described is not data compression, per se, expressing the additional capacity in terms of compression is a useful comparison.

The term "sourcepacket" as used herein means a packet of data received for encoding or decoding. A sourcepacket may be a portion of a data set.

The term "sourceblock" as used herein means a defined number of bits or bytes used as the block size for encoding or decoding. A sourcepacket may be divisible into a number of sourceblocks. As one non-limiting example, a 1 megabyte sourcepacket of data may be encoded using 512 byte sourceblocks. The number of bits in a sourceblock may be dynamically optimized by the system during operation. In one aspect, a sourceblock may be of the same length as the block size used by a particular file system, typically 512 bytes or 4,096 bytes.

The term "codeword" refers to the reference code form in which data is stored or transmitted in an aspect of the system. A codeword consists of a reference code or "codeword" to a sourceblock in the library plus an indication of that sourceblock's location in a particular data set.

Conceptual Architecture

FIG. 1 is a diagram showing an embodiment 100 of the system in which all components of the system are operated locally. As incoming data 101 is received by data deconstruction engine 102. Data deconstruction engine 102 breaks the incoming data into sourceblocks, which are then sent to library manager 103. Using the information contained in sourceblock library lookup table 104 and sourceblock library storage 105, library manager 103 returns reference codes to data deconstruction engine 102 for processing into codewords, which are stored in codeword storage 106. When a data retrieval request 107 is received, data reconstruction engine 108 obtains the codewords associated with the data from codeword storage 106, and sends them to library manager 103. Library manager 103 returns the appropriate sourceblocks to data reconstruction engine 108, which assembles them into the proper order and sends out the data in its original form 109.

Figure 2:
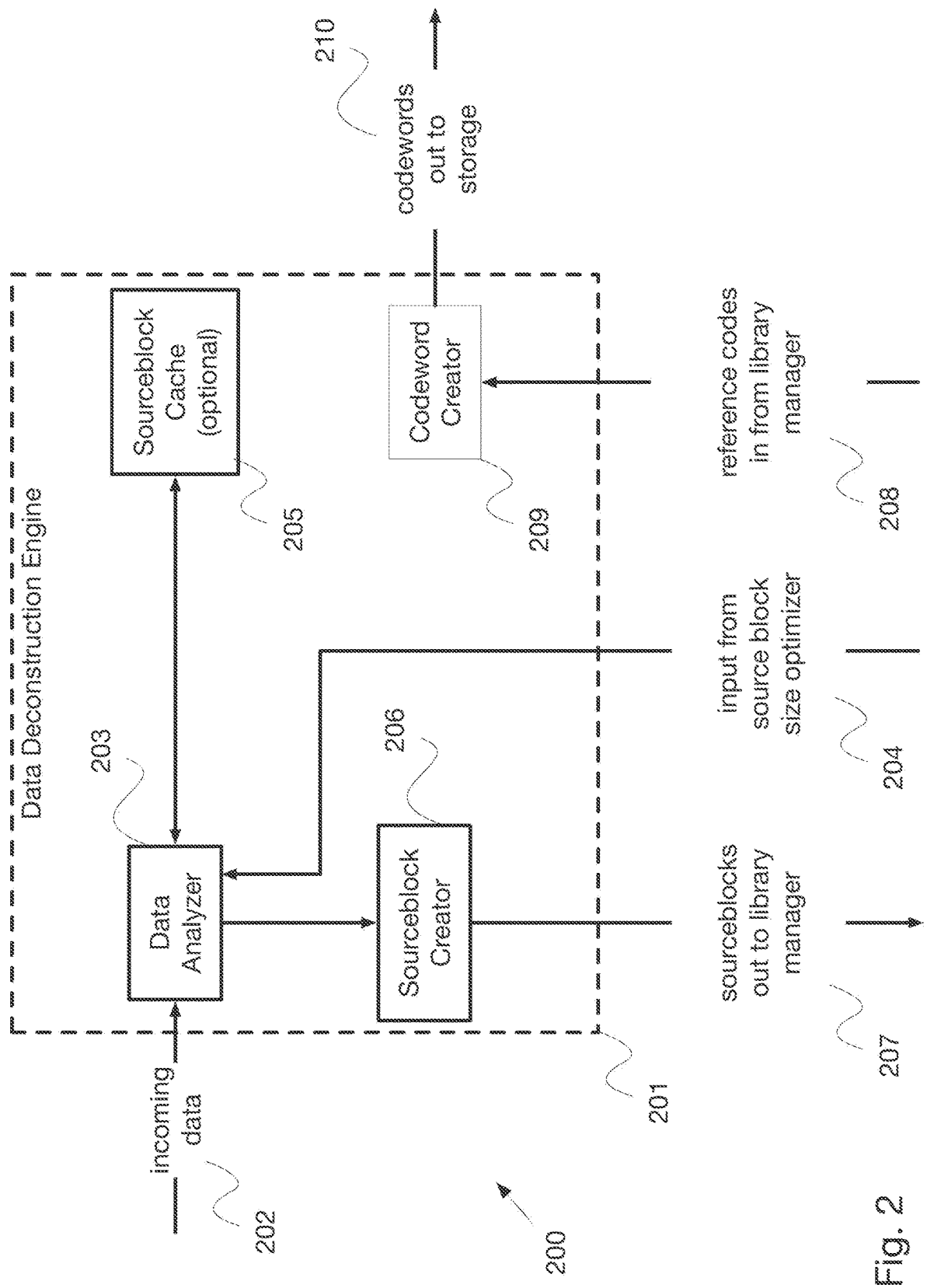
FIG. 2 is a diagram showing an embodiment of one aspect of the system, the data deconstruction engine.

FIG. 2 is a diagram showing an embodiment of one aspect 200 of the system, specifically data deconstruction engine 201. Incoming data 202 is received by data analyzer 203, which optimally analyzes the data based on machine learning algorithms and input 204 from a sourceblock size optimizer, which is disclosed below. Data analyzer may optionally have access to a sourceblock cache 205 of recently-processed sourceblocks, which can increase the speed of the system by avoiding processing in library manager 103. Based on information from data analyzer 203, the data is broken into sourceblocks by sourceblock creator 206, which sends sourceblocks 207 to library manager 203 for additional processing. Data deconstruction engine 201 receives reference codes 208 from library manager 103, corresponding to the sourceblocks in the library that match the sourceblocks sent by sourceblock creator 206, and codeword creator 209 processes the reference codes into codewords comprising a reference code to a sourceblock and a location of that sourceblock within the data set. The original data may be discarded, and the codewords representing the data are sent out to storage 210.

Figure 3:
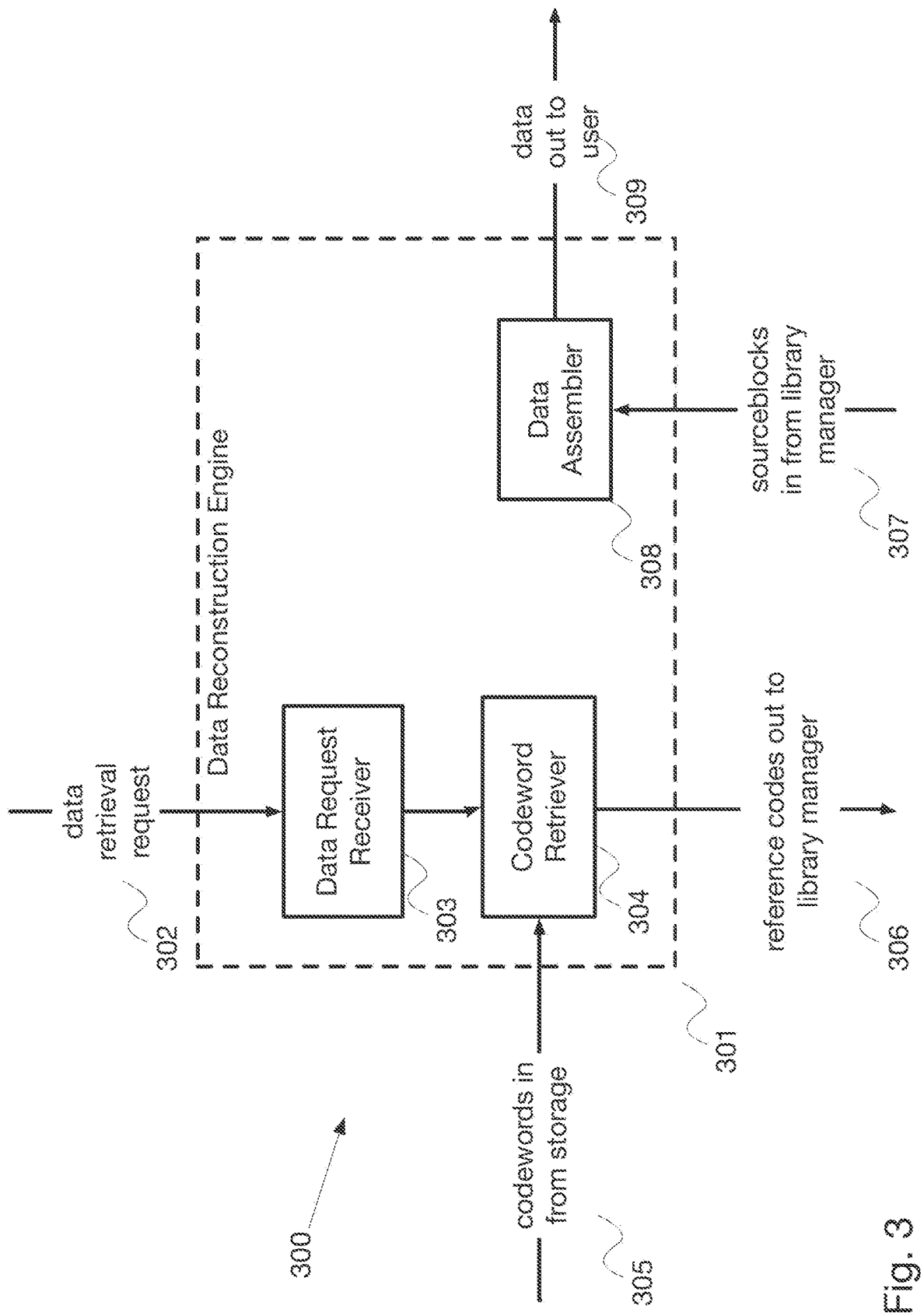
FIG. 3 is a diagram showing an embodiment of one aspect of the system, the data reconstruction engine.

FIG. 3 is a diagram showing an embodiment of another aspect of system 300, specifically data reconstruction engine 301. When a data retrieval request 302 is received by data request receiver 303 (in the form of a plurality of codewords corresponding to a desired final data set), it passes the information to data retriever 304, which obtains the requested data 305 from storage. Data retriever 304 sends, for each codeword received, a reference codes from the codeword 306 to library manager 103 for retrieval of the specific sourceblock associated with the reference code. Data assembler 308 receives the sourceblock 307 from library manager 103 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 309 in its original form.

Figure 4:
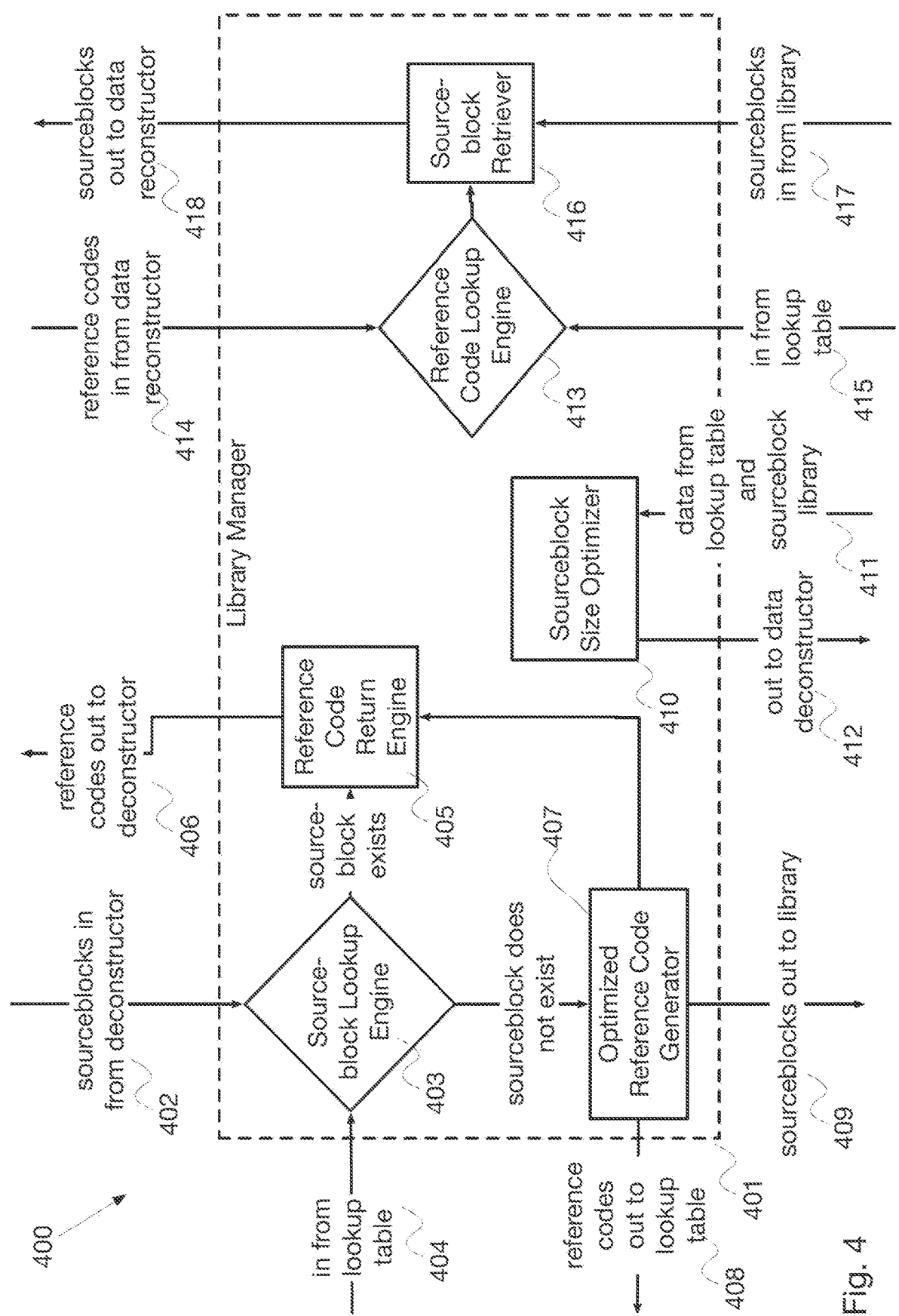
FIG. 4 is a diagram showing an embodiment of one aspect of the system, the library management module.

FIG. 4 is a diagram showing an embodiment of another aspect of the system 400, specifically library manager 401. One function of library manager 401 is to generate reference codes from sourceblocks received from data deconstruction engine 301. As sourceblocks are received 402 from data deconstruction engine 301, sourceblock lookup engine 403 checks sourceblock library lookup table 404 to determine whether those sourceblocks already exist in sourceblock library storage 105. If a particular sourceblock exists in sourceblock library storage 105, reference code return engine 405 sends the appropriate reference code 406 to data deconstruction engine 301. If the sourceblock does not exist in sourceblock library storage 105, optimized reference code generator 407 generates a new, optimized reference code based on machine learning algorithms. Optimized reference code generator 407 then saves the reference code 408 to sourceblock library lookup table 104; saves the associated sourceblock 409 to sourceblock library storage 105; and passes the reference code to reference code return engine 405 for sending 406 to data deconstruction engine 301. Another function of library manager 401 is to optimize the size of sourceblocks in the system. Based on information 411 contained in sourceblock library lookup table 104, sourceblock size optimizer 410 dynamically adjusts the size of sourceblocks in the system based on machine learning algorithms and outputs that information 412 to data analyzer 203. Another function of library manager 401 is to return sourceblocks associated with reference codes received from data reconstruction engine 301. As reference codes are received 414 from data reconstruction engine 301, reference code lookup engine 413 checks sourceblock library lookup table 415 to identify the associated sourceblocks; passes that information to sourceblock retriever 416, which obtains the sourceblocks 417 from sourceblock library storage 105; and passes them 418 to data reconstruction engine 301.

Figure 5:
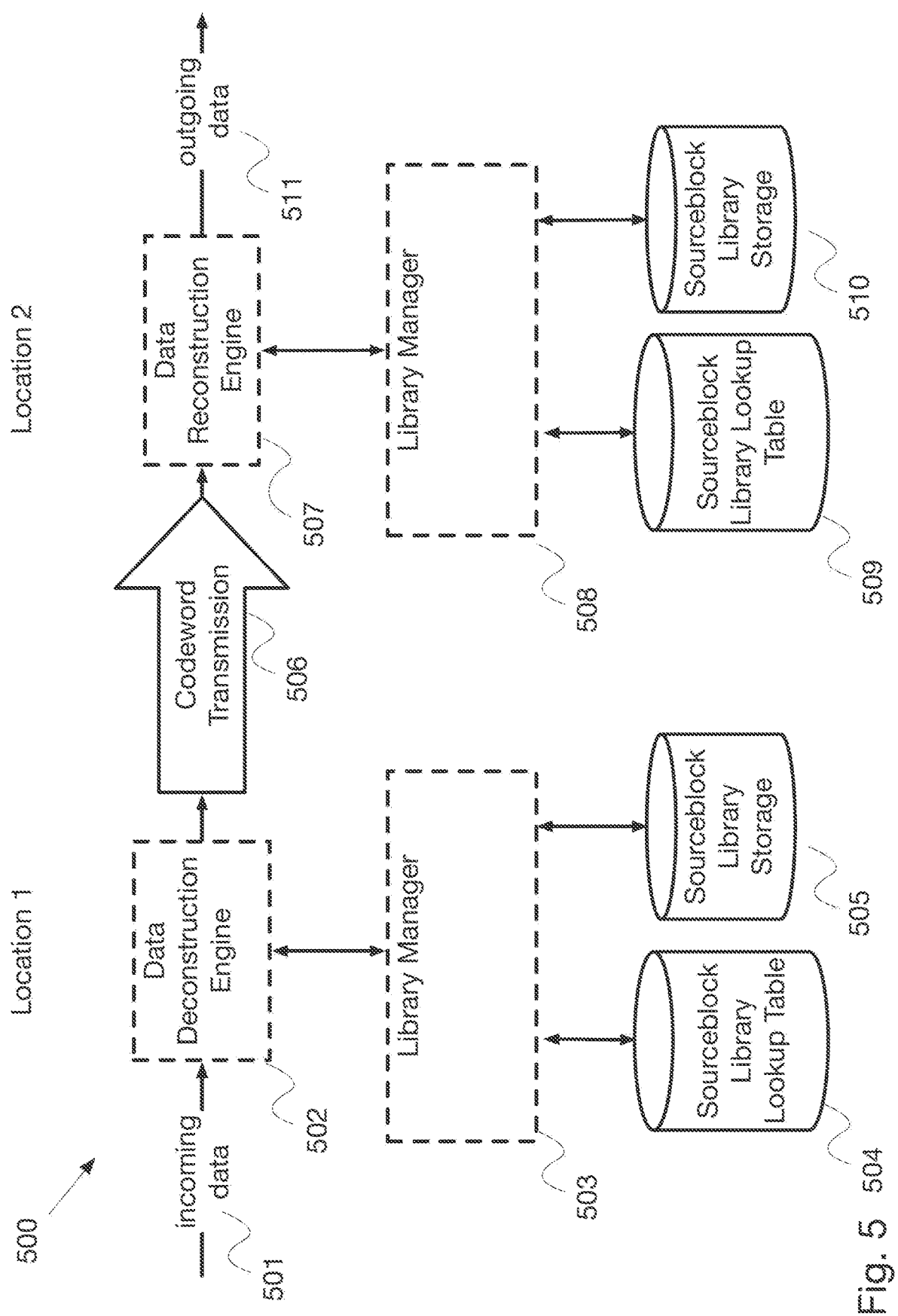
FIG. 5 is a diagram showing another embodiment of the system in which data is transferred between remote locations.

FIG. 5 is a diagram showing another embodiment of system 500, in which data is transferred between remote locations. As incoming data 501 is received by data deconstruction engine 502 at Location 1, data deconstruction engine 301 breaks the incoming data into sourceblocks, which are then sent to library manager 503 at Location 1. Using the information contained in sourceblock library lookup table 504 at Location 1 and sourceblock library storage 505 at Location 1, library manager 503 returns reference codes to data deconstruction engine 301 for processing into codewords, which are transmitted 506 to data reconstruction engine 507 at Location 2. In the case where the reference codes contained in a particular codeword have been newly generated by library manager 503 at Location 1, the codeword is transmitted along with a copy of the associated sourceblock. As data reconstruction engine 507 at Location 2 receives the codewords, it passes them to library manager module 508 at Location 2, which looks up the sourceblock in sourceblock library lookup table 509 at Location 2 and retrieves the associated from sourceblock library storage 510. Where a sourceblock has been transmitted along with a codeword, the sourceblock is stored in sourceblock library storage 510 and sourceblock library lookup table 504 is updated. Library manager 503 returns the appropriate sourceblocks to data reconstruction engine 507, which assembles them into the proper order and sends the data in its original form 511.

Figure 6:
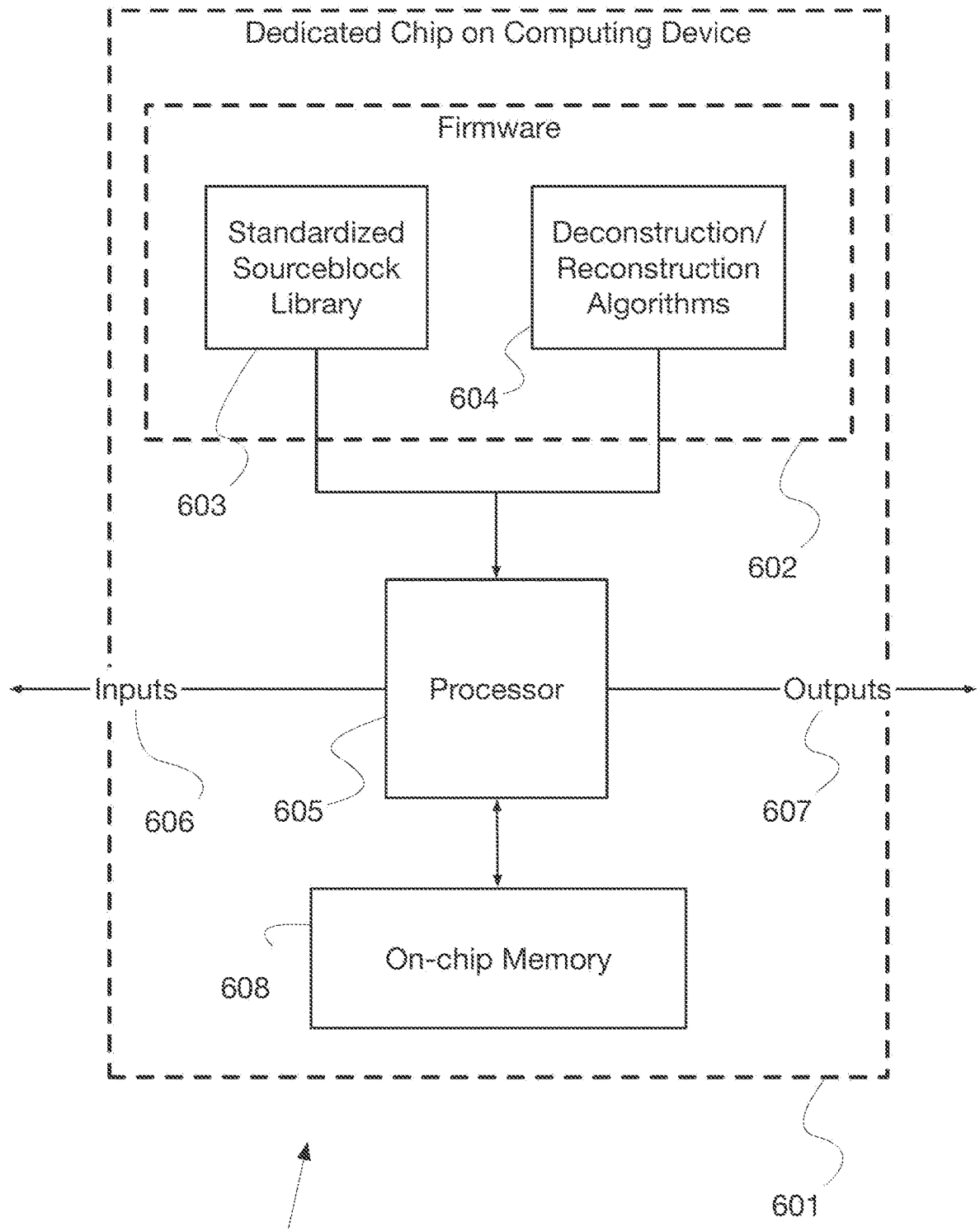
FIG. 6 is a diagram showing an embodiment in which a standardized version of the sourceblock library and associated algorithms would be encoded as firmware on a dedicated processing chip included as part of the hardware of a plurality of devices.

FIG. 6 is a diagram showing an embodiment 600 in which a standardized version of a sourceblock library 603 and associated algorithms 604 would be encoded as firmware 602 on a dedicated processing chip 601 included as part of the hardware of a plurality of devices 600. Contained on dedicated chip 601 would be a firmware area 602, on which would be stored a copy of a standardized sourceblock library 603 and deconstruction/reconstruction algorithms 604 for processing the data. Processor 605 would have both inputs 606 and outputs 607 to other hardware on the device 600. Processor 605 would store incoming data for processing on on-chip memory 608, process the data using standardized sourceblock library 603 and deconstruction/reconstruction algorithms 604, and send the processed data to other hardware on device 600. Using this embodiment, the encoding and decoding of data would be handled by dedicated chip 601, keeping the burden of data processing off device's 600 primary processors. Any device equipped with this embodiment would be able to store and transmit data in a highly optimized, bandwidth-efficient format with any other device equipped with this embodiment.

Figure 12:
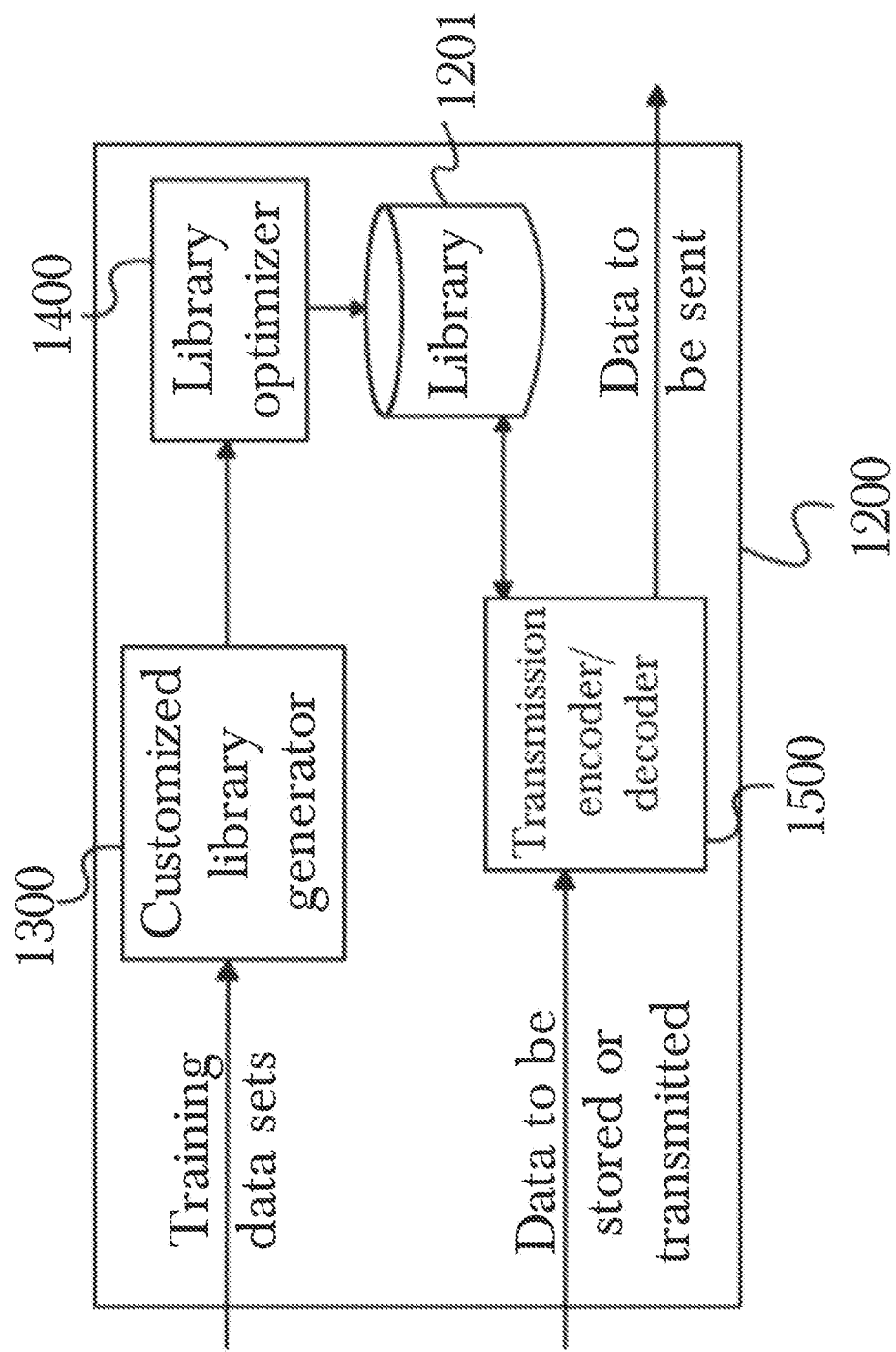
FIG. 12 is a diagram showing an exemplary system architecture, according to a preferred embodiment of the invention.

FIG. 12 is a diagram showing an exemplary system architecture 1200, according to a preferred embodiment of the invention. Incoming training data sets may be received at a customized library generator 1300 that processes training data to produce a customized word library 1201 comprising key-value pairs of data words (each comprising a string of bits) and their corresponding calculated binary Huffman codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data intended for storage or transmission, process the data using a word library 1201 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1200 provides near-instantaneous source coding that is dictionary-based and learned in advance from sample training data, so that encoding and decoding may happen concurrently with data transmission. This results in computational latency that is near zero but the data size reduction is comparable to classical compression. For example, if N bits are to be transmitted from sender to receiver, the compression ratio of classical compression is C, the ratio between the deflation factor of system 1200 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1200 will be (assuming that encoding and decoding happen at least as quickly as network latency):

$$T_{new} = \frac{Np}{CS}$$

so that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C=1.1 \cdot 10^{12}$, $R_D=4.2 \cdot 10^{12}$, $S=10^{11}$, giving $$\frac{CS}{R_C} + \frac{S}{R_D} = 0.053. \ldots ,$$

such that system 1200 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e. $\text{delay}_{invention}$=tp/CS since encoding and decoding occur concurrently with data transmission. On the other hand, the latency associated with classical compression is $$\text{delay}_{priorart} = \frac{N}{R_C} + \frac{N}{CS} + \frac{N}{CR_D}$$

where N is the packet/file size. Even with the generous values chosen above as well as N=512K, t=10, and p=1.05, this results in $\text{delay}_{invention} \approx 1.3 \cdot 10^{-10}$ while $\text{delay}_{priorart} \approx 1.3 \cdot 10^{-7}$, a more than 400-fold reduction in latency.

A key factor in the efficiency of Huffman coding used by system 1200 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1200 addresses this by restriction of data types and density estimation; training data is provided that is representative of the type of data anticipated in "real-world" use of system 1200, which is then used to model the distribution of binary strings in the data in order to build a Huffman code word library 1200.

Figure 13:
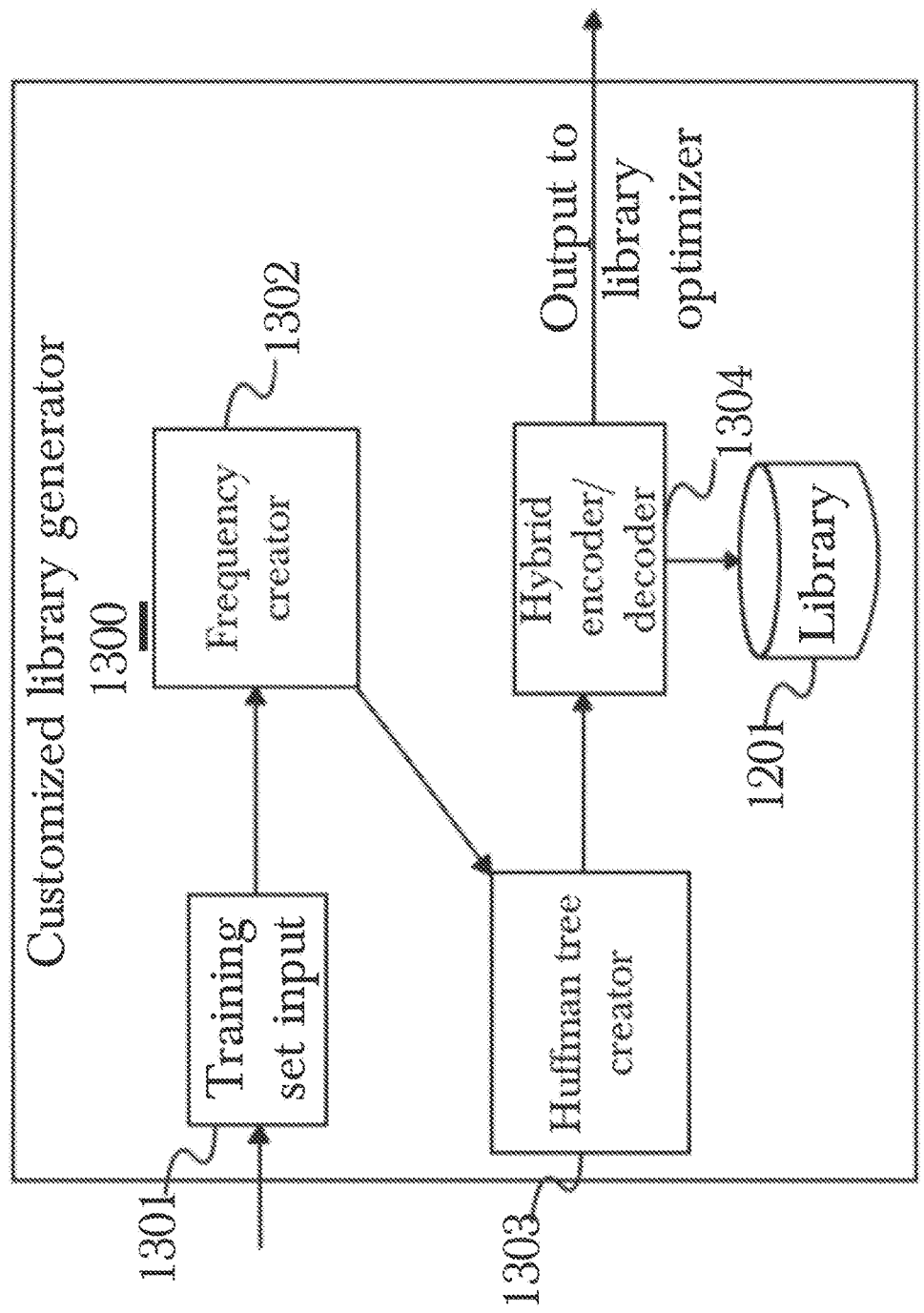
FIG. 13 is a diagram showing a more detailed architecture for a customized library generator.

FIG. 13 is a diagram showing a more detailed architecture for a customized library generator 1300. When an incoming training data set 1301 is received, it may be analyzed using a frequency creator 1302 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yield better results when used with real-world data (rather than, for example, being only based on a single training data set that may not be very similar to a received non-training data set). A second Huffman tree creator 1303 may be utilized to identify words that do not match any existing entries in a word library 1201 and pass them to a hybrid encoder/decoder 1304, that then calculates a binary Huffman codeword for the mismatched word and adds the codeword and original data to the word library 1201 as a new key-value pair. In this manner, customized library generator 1300 may be used both to establish an initial word library 1201 from a first training set, as well as expand the word library 1201 using additional training data to improve operation.

Figure 14:
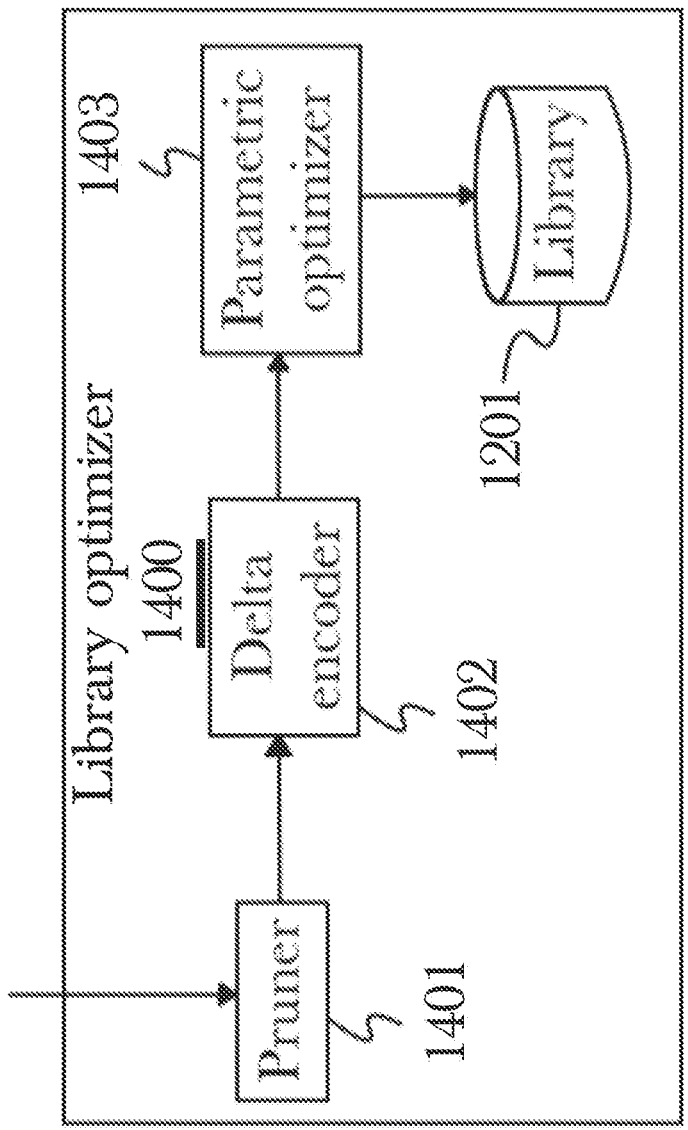
FIG. 14 is a diagram showing a more detailed architecture for a library optimizer.

FIG. 14 is a diagram showing a more detailed architecture for a library optimizer 1400. A pruner 1401 may be used to load a word library 1201 and reduce its size for efficient operation, for example by sorting the word library 1201 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1201 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1402 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1403 may load configuration parameters for operation to optimize the use of the word library 1201 during operation. Best-practice parameter/hyperparameter optimization strategies such as stochastic gradient descent, quasi-random grid search, and evolutionary search may be used to make optimal choices for all interdependent settings playing a role in the functionality of system 1200. In cases where lossless compression is not required, the delta value may be discarded at the expense of introducing some limited errors into any decoded (reconstructed) data.

Figure 15:
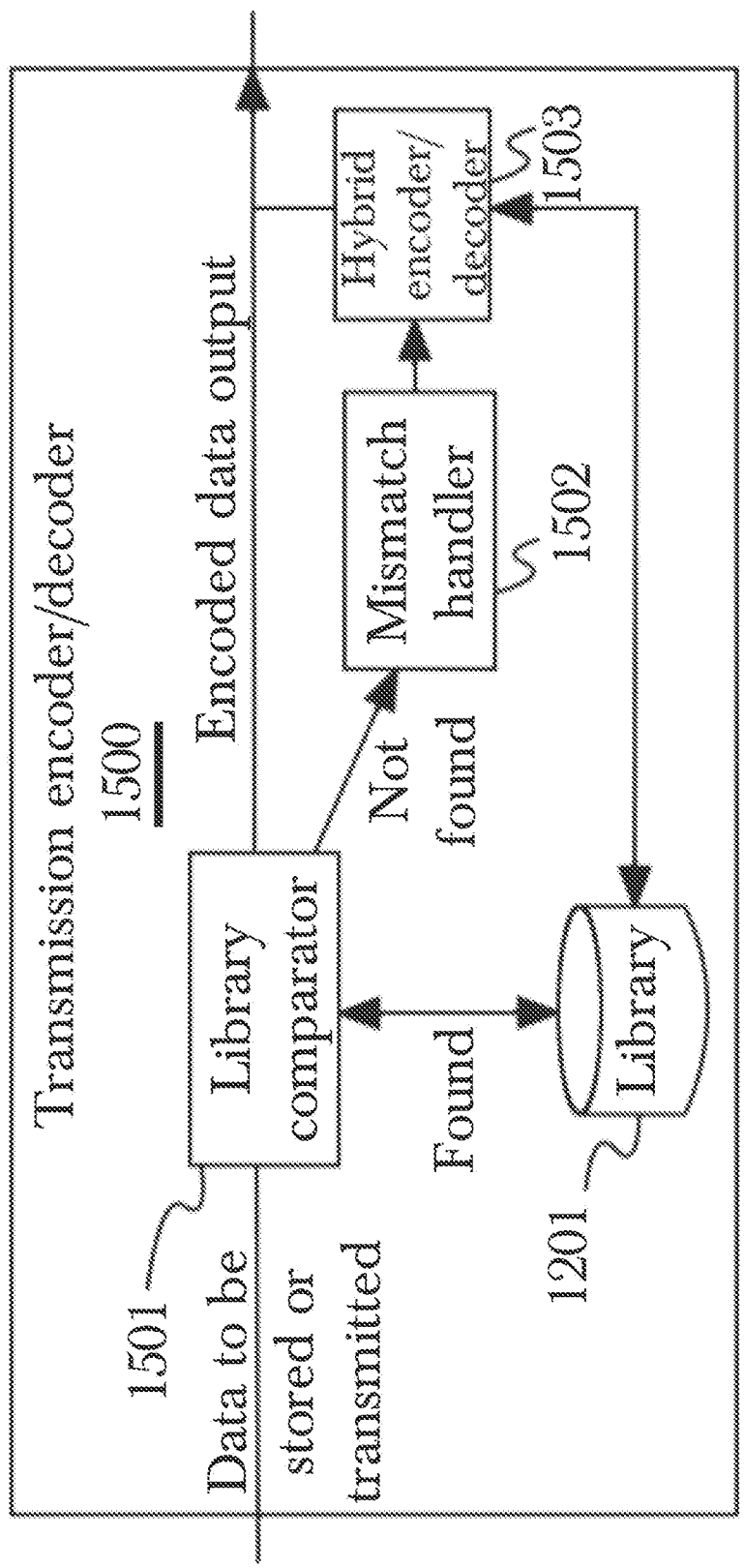
FIG. 15 is a diagram showing a more detailed architecture for a transmission and storage engine.

FIG. 15 is a diagram showing a more detailed architecture for a transmission encoder/decoder 1500. According to various arrangements, transmission encoder/decoder 1500 may be used to deconstruct data for storage or transmission, or to reconstruct data that has been received, using a word library 1201. A library comparator 1501 may be used to receive data comprising words or codewords and compare against a word library 1201 by dividing the incoming stream into substrings of length t and using a fast hash to check word library 1201 for each substring. If a substring is found in word library 1201, the corresponding key/value (that is, the corresponding source word or codeword, according to whether the substring used in comparison was itself a word or codeword) is returned and appended to an output stream. If a given substring is not found in word library 1201, a mismatch handler 1502 and hybrid encoder/decoder 1503 may be used to handle the mismatch similarly to operation during the construction or expansion of word library 1201. A mismatch handler 1502 may be utilized to identify words that do not match any existing entries in a word library 1201 and pass them to a hybrid encoder/decoder 1503, that then calculates a binary Huffman codeword using shorter block-length encoding for the mismatched word and adds the codeword and original data to the word library 1201 as a new key-value pair. The newly-produced codeword may then be appended to the output stream. In arrangements where a mismatch indicator is included in a received data stream, this may be used to preemptively identify a substring that is not in word library 1201 (for example, if it was identified as a mismatch on the transmission end), and handled accordingly without the need for a library lookup.

Figure 19:
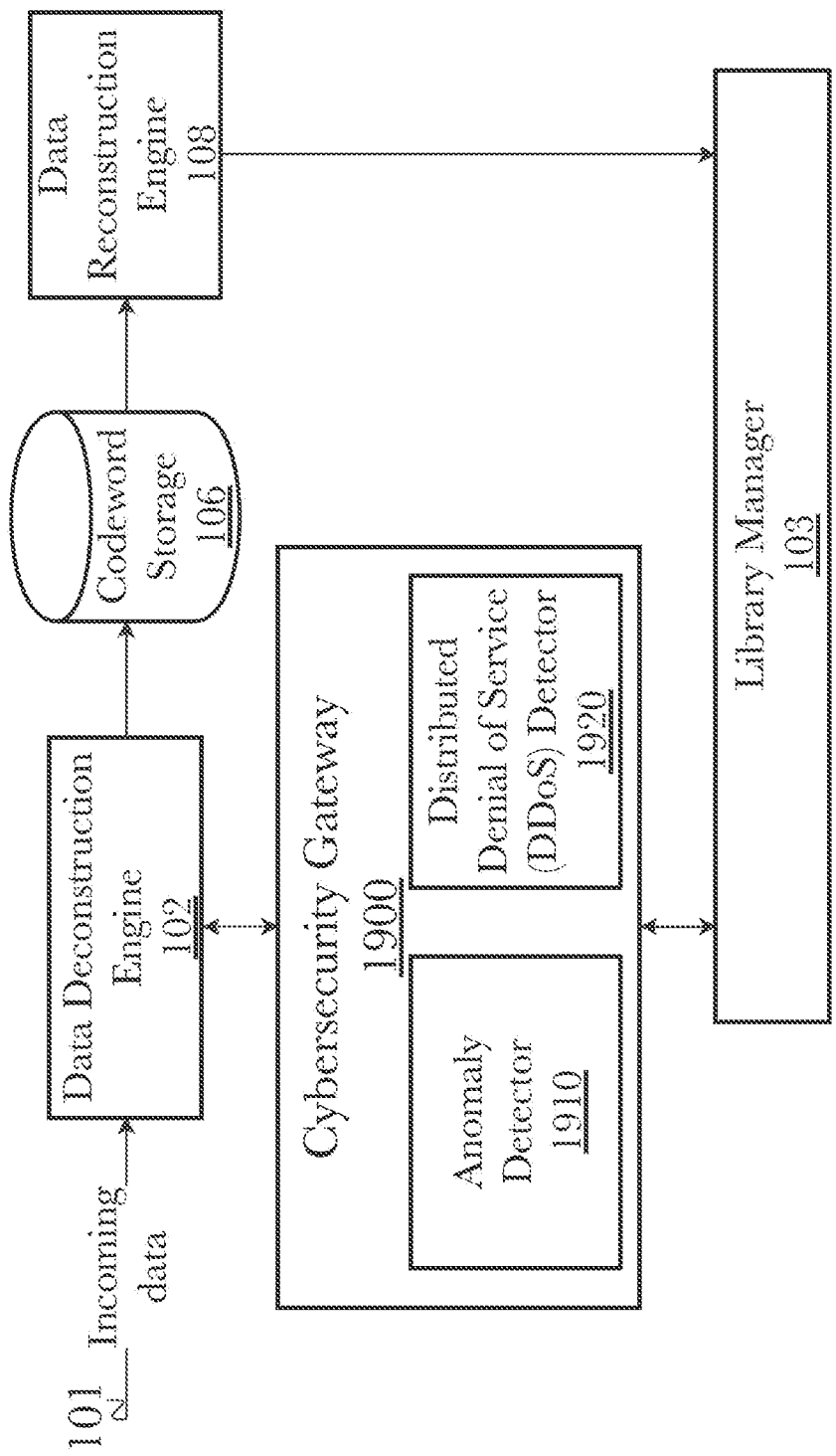
FIG. 19 is an exemplary system architecture of a data encoding system used for cyber security purposes.

FIG. 19 is an exemplary system architecture of a data encoding system used for cyber security purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. However, a cybersecurity gateway 1900 is present, communicating in-between a library manager 103 and a deconstruction engine 102, and containing an anomaly detector 1910 and distributed denial of service (DDOS) detector 1920. The anomaly detector examines incoming data to determine whether there is a disproportionate number of incoming reference codes that do not match reference codes in the existing library. A disproportionate number of non-matching reference codes may indicate that data is being received from an unknown source, of an unknown type, or contains unexpected (possibly malicious) data. If the disproportionate number of non-matching reference codes exceeds an established threshold or persists for a certain length of time, the anomaly detector 1910 raises a warning to a system administrator. Likewise, the DDOS detector 1920 examines incoming data to determine whether there is a disproportionate amount of repetitive data. A disproportionate amount of repetitive data may indicate that a DDOS attack is in progress. If the disproportionate amount of repetitive data exceeds an established threshold or persists for a certain length of time, the DDOS detector 1910 raises a warning to a system administrator. In this way, a data encoding system may detect and warn users of, or help mitigate, common cyber-attacks that result from a flow of unexpected and potentially harmful data, or attacks that result from a flow of too much irrelevant data meant to slow down a network or system, as in the case of a DDOS attack.

Figure 22:
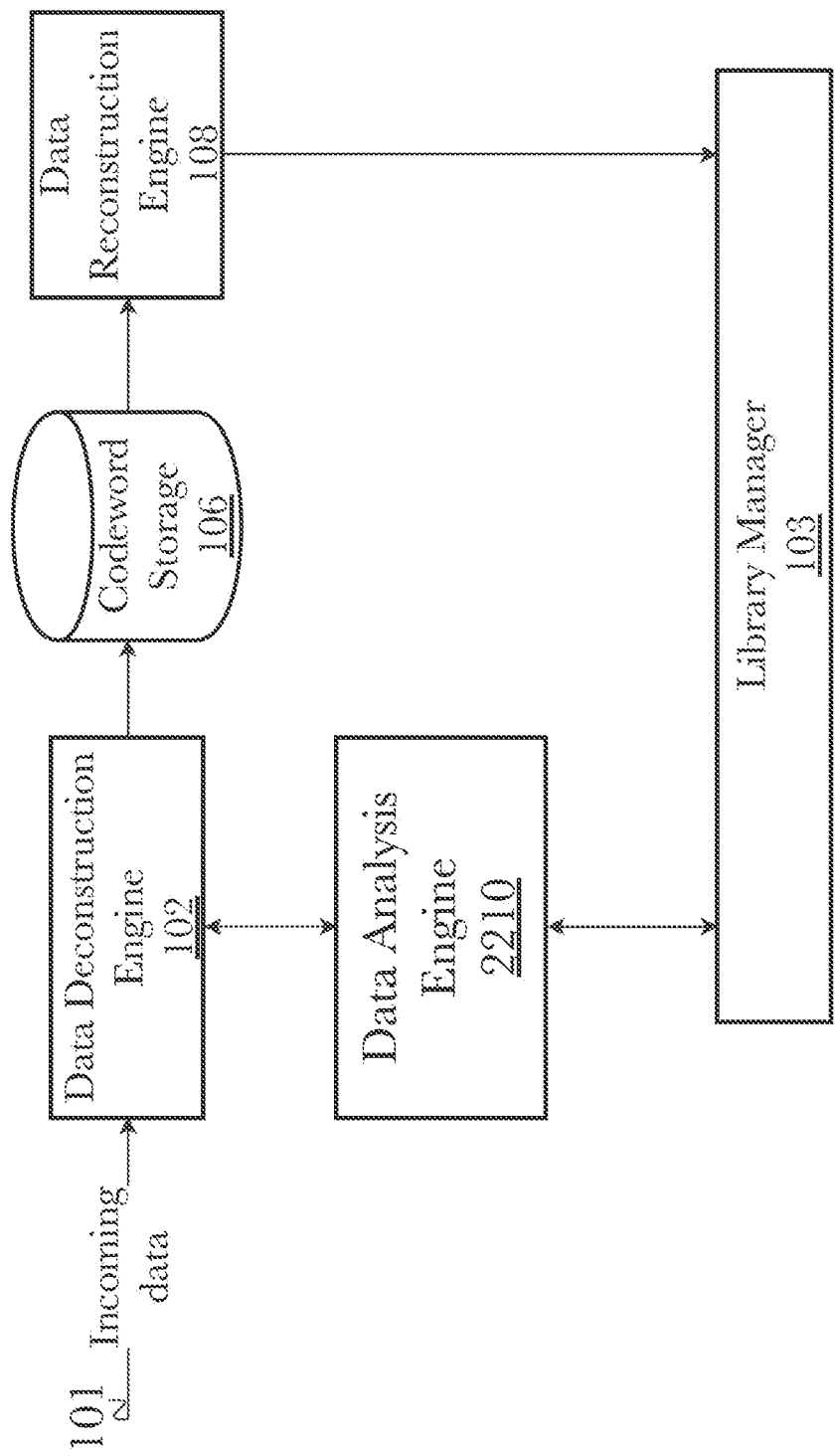
FIG. 22 is an exemplary system architecture of a data encoding system used for data mining and analysis purposes.

FIG. 22 is an exemplary system architecture of a data encoding system used for data mining and analysis purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process and may be queried by a data reconstruction engine 108 which may reconstruct the original data from the codewords, using a library manager 103. A data analysis engine 2210, typically operating while the system is otherwise idle, sends requests for data to the data reconstruction engine 108, which retrieves the codewords representing the requested data from codeword storage 106, reconstructs them into the data represented by the codewords, and send the reconstructed data to the data analysis engine 2210 for analysis and extraction of useful data (i.e., data mining). Because the speed of reconstruction is significantly faster than decompression using traditional compression technologies (i.e., significantly less decompression latency), this approach makes data mining feasible. Very often, data stored using traditional compression is not mined precisely because decompression lag makes it unfeasible, especially during shorter periods of system idleness. Increasing the speed of data reconstruction broadens the circumstances under which data mining of stored data is feasible.

Figure 24:
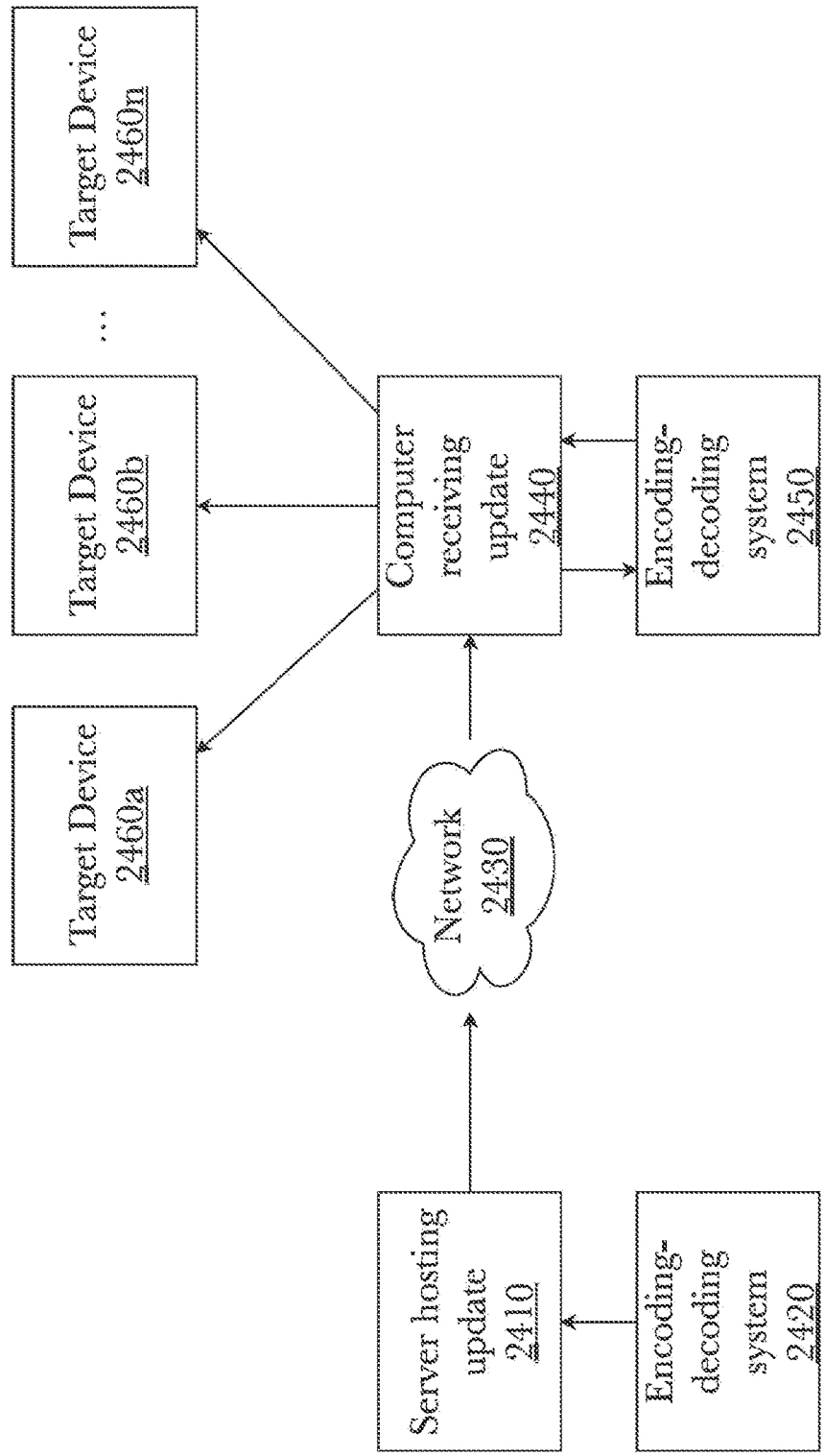
FIG. 24 is an exemplary system architecture of a data encoding system used for remote software and firmware updates.

FIG. 24 is an exemplary system architecture of a data encoding system used for remote software and firmware updates. Software and firmware updates typically require smaller, but more frequent, file transfers. A server which hosts a software or firmware update 2410 may host an encoding-decoding system 2420, allowing for data to be encoded into, and decoded from, sourceblocks or codewords, as disclosed in previous figures. Such a server may possess a software update, operating system update, firmware update, device driver update, or any other form of software update, which in some cases may be minor changes to a file, but nevertheless necessitate sending the new, completed file to the recipient. Such a server is connected over a network 2430, which is further connected to a recipient computer 2440, which may be connected to a server 2410 for receiving such an update to its system. In this instance, the recipient device 2440 also hosts the encoding and decoding system 2450, along with a codebook or library of reference codes that the hosting server 2410 also shares. The updates are retrieved from storage at the hosting server 2410 in the form of codewords, transferred over the network 2430 in the form of codewords, and reconstructed on the receiving computer 2440. In this way, a far smaller file size, and smaller total update size, may be sent over a network. The receiving computer 2440 may then install the updates on any number of target computing devices 2460a-n, using a local network or other high-bandwidth connection.

Figure 26:
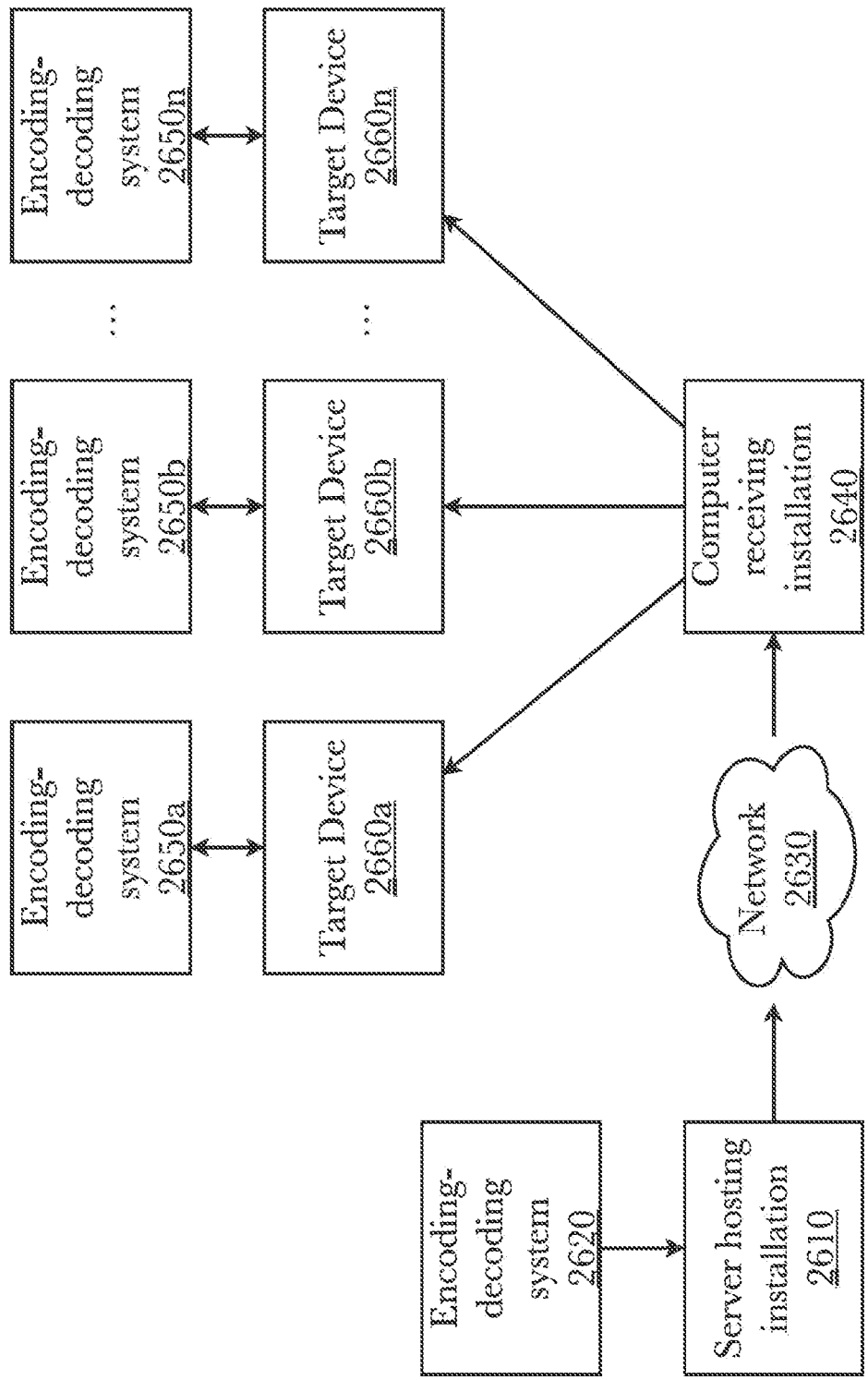
FIG. 26 is an exemplary system architecture of a data encoding system used for large-scale software installation such as operating systems.

FIG. 26 is an exemplary system architecture of a data encoding system used for large-scale software installation such as operating systems. Large-scale software installations typically require very large, but infrequent, file transfers. A server which hosts an installable software 2610 may host an encoding-decoding system 2620, allowing for data to be encoded into, and decoded from, sourceblocks or codewords, as disclosed in previous figures. The files for the large scale software installation are hosted on the server 2610, which is connected over a network 2630 to a recipient computer 2640. In this instance, the encoding and decoding system 2650a-n is stored on or connected to one or more target devices 2660a-n, along with a codebook or library of reference codes that the hosting server 2610 shares. The software is retrieved from storage at the hosting server 2610 in the form of codewords and transferred over the network 2630 in the form of codewords to the receiving computer 2640. However, instead of being reconstructed at the receiving computer 2640, the codewords are transmitted to one or more target computing devices, and reconstructed and installed directly on the target devices 2660a-n. In this way, a far smaller file size, and smaller total update size, may be sent over a network or transferred between computing devices, even where the network 2630 between the receiving computer 2640 and target devices 2660a-n is low bandwidth, or where there are many target devices 2660a-n.

Figure 28:
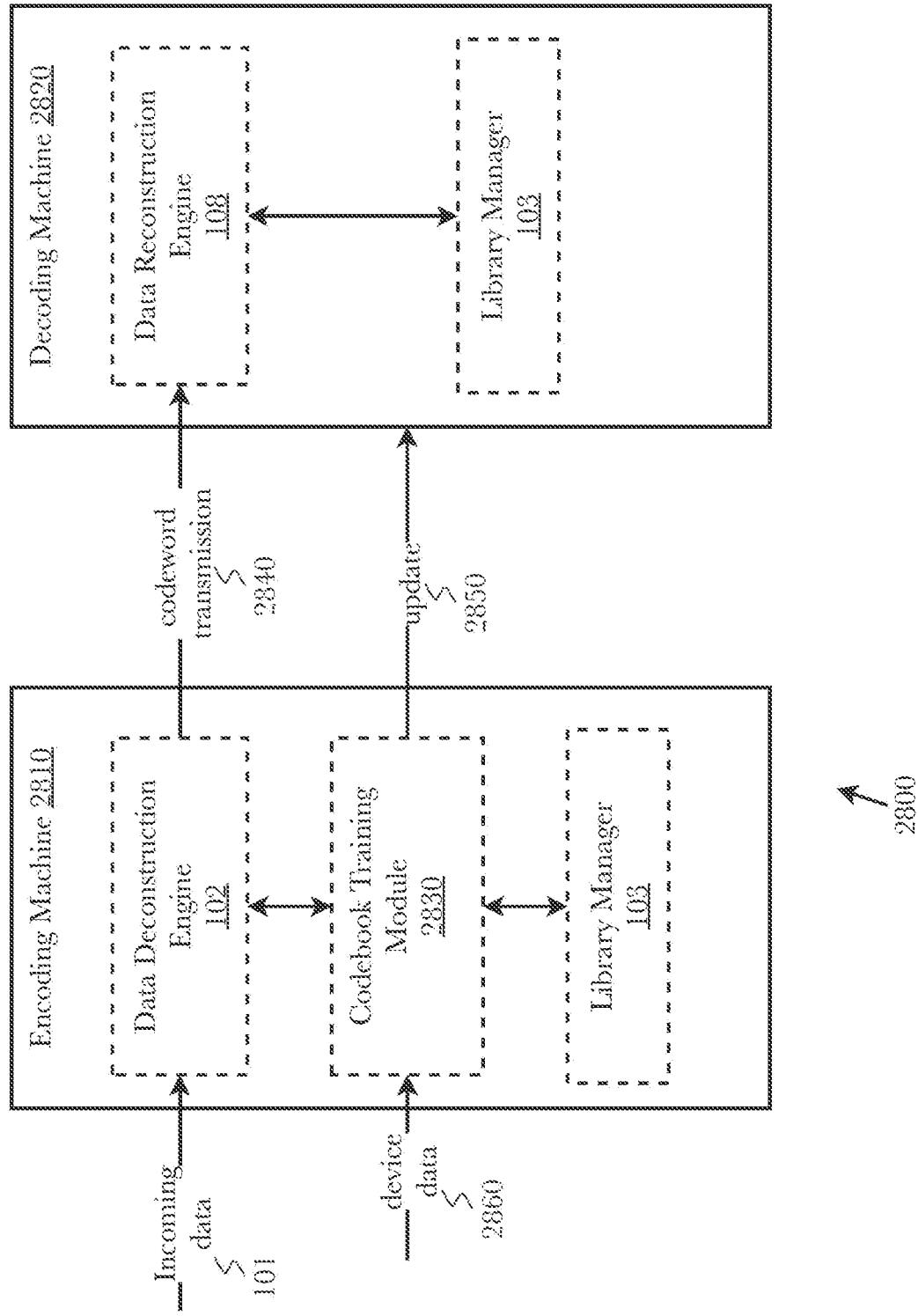
FIG. 28 is a block diagram of an exemplary system architecture of a codebook training system for a data encoding system, according to an embodiment.

FIG. 28 is a block diagram of an exemplary system architecture 2800 of a codebook training system for a data encoding system, according to an embodiment. According to this embodiment, two separate machines may be used for encoding 2810 and decoding 2820. Much like in FIG. 1, incoming data 101 to be deconstructed is sent to a data deconstruction engine 102 residing on encoding machine 2810, which may attempt to deconstruct the data and turn it into a collection of codewords using a library manager 103. Codewords may be transmitted 2840 to a data reconstruction engine 108 residing on decoding machine 2820, which may reconstruct the original data from the codewords, using a library manager 103. However, according to this embodiment, a codebook training module 2830 is present on the decoding machine 2810, communicating in-between a library manager 103 and a deconstruction engine 102. According to other embodiments, codebook training module 2830 may reside instead on decoding machine 2820 if the machine has enough computing resources available; which machine the module 2830 is located on may depend on the system user's architecture and network structure. Codebook training module 2830 may send requests for data to the data reconstruction engine 2810, which routes incoming data 101 to codebook training module 2830. Codebook training module 2830 may perform analyses on the requested data in order to gather information about the distribution of incoming data 101 as well as monitor the encoding/decoding model performance. Additionally, codebook training module 2830 may also request and receive device data 2860 to supervise network connected devices and their processes and, according to some embodiments, to allocate training resources when requested by devices running the encoding system. Devices may include, but are not limited to, encoding and decoding machines, training machines, sensors, mobile computer devices, and Internet-of-things ("IoT") devices. Based on the results of the analyses, the codebook training module 2830 may create a new training dataset from a subset of the requested data in order to counteract the effects of data drift on the encoding/decoding models, and then publish updated 2850 codebooks to both the encoding machine 2810 and decoding machine 2820.

Figure 29:
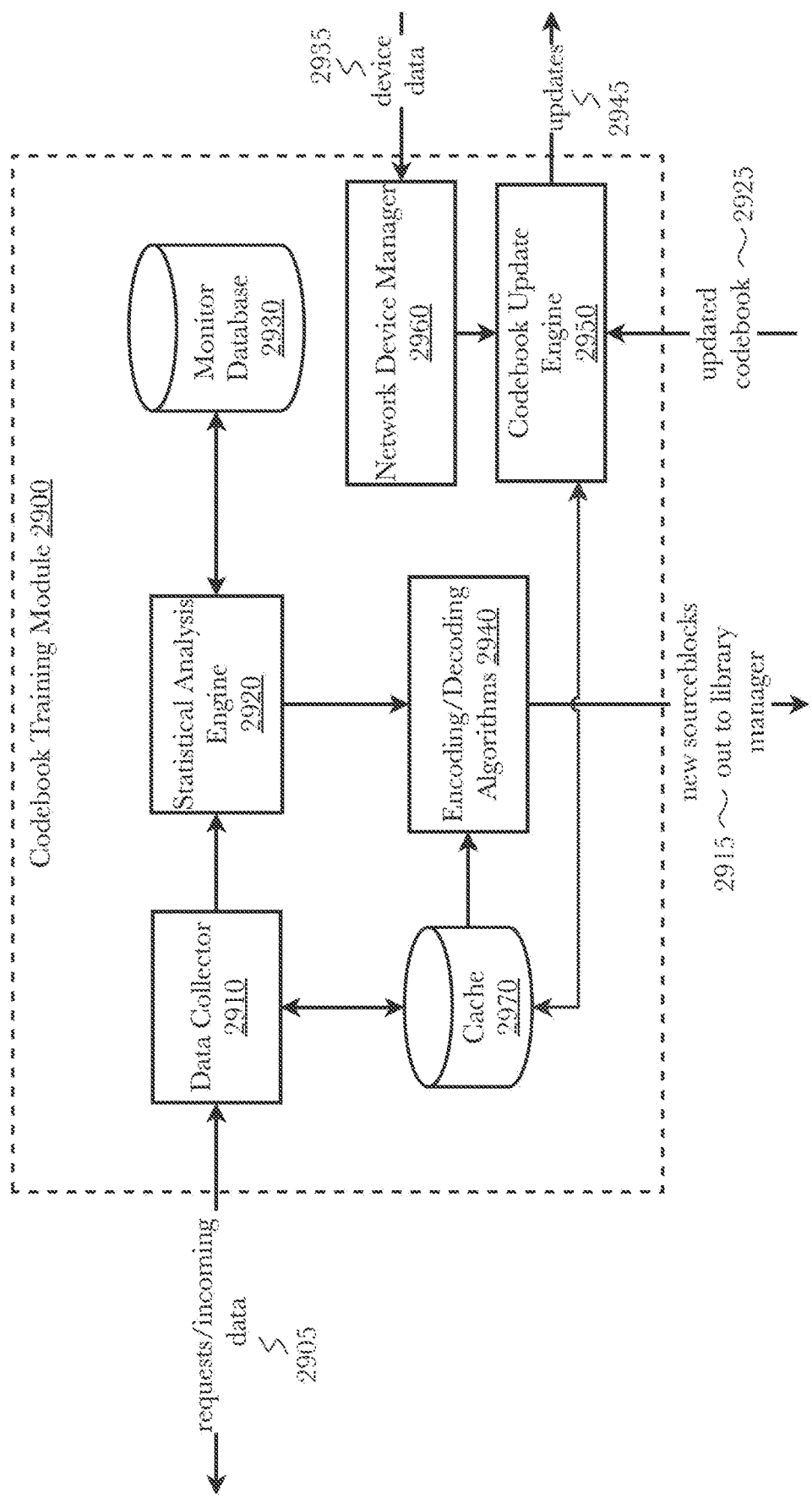
FIG. 29 is a block diagram of an exemplary architecture for a codebook training module, according to an embodiment.

FIG. 29 is a block diagram of an exemplary architecture for a codebook training module 2900, according to an embodiment. According to the embodiment, a data collector 2910 is present which may send requests for incoming data 2905 to a data deconstruction engine 102 which may receive the request and route incoming data to codebook training module 2900 where it may be received by data collector 2910. Data collector 2910 may be configured to request data periodically such as at schedule time intervals, or for example, it may be configured to request data after a certain amount of data has been processed through the encoding machine 2810 or decoding machine 2820. The received data may be a plurality of sourceblocks, which are a series of binary digits, originating from a source packet otherwise referred to as a datagram. The received data may compiled into a test dataset and temporarily stored in a cache 2970. Once stored, the test dataset may be forwarded to a statistical analysis engine 2920 which may utilize one or more algorithms to determine the probability distribution of the test dataset. Best-practice probability distribution algorithms such as Kullback-Leibler divergence, adaptive windowing, and Jensen-Shannon divergence may be used to compute the probability distribution of training and test datasets. A monitoring database 2930 may be used to store a variety of statistical data related to training datasets and model performance metrics in one place to facilitate quick and accurate system monitoring capabilities as well as assist in system debugging functions. For example, the original or current training dataset and the calculated probability distribution of this training dataset used to develop the current encoding and decoding algorithms may be stored in monitor database 2930.

Since data drifts involve statistical change in the data, the best approach to detect drift is by monitoring the incoming data's statistical properties, the model's predictions, and their correlation with other factors. After statistical analysis engine 2920 calculates the probability distribution of the test dataset it may retrieve from monitor database 2930 the calculated and stored probability distribution of the current training dataset. It may then compare the two probability distributions of the two different datasets in order to verify if the difference in calculated distributions exceeds a predetermined difference threshold. If the difference in distributions does not exceed the difference threshold, that indicates the test dataset, and therefore the incoming data, has not experienced enough data drift to cause the encoding/decoding system performance to degrade significantly, which indicates that no updates are necessary to the existing codebooks. However, if the difference threshold has been surpassed, then the data drift is significant enough to cause the encoding/decoding system performance to degrade to the point where the existing models and accompanying codebooks need to be updated. According to an embodiment, an alert may be generated by statistical analysis engine 2920 if the difference threshold is surpassed or if otherwise unexpected behavior arises.

In the event that an update is required, the test dataset stored in the cache 2970 and its associated calculated probability distribution may be sent to monitor database 2930 for long term storage. This test dataset may be used as a new training dataset to retrain the encoding and decoding algorithms 2940 used to create new sourceblocks based upon the changed probability distribution. The new sourceblocks may be sent out to a library manager 2915 where the sourceblocks can be assigned new codewords. Each new sourceblock and its associated codeword may then be added to a new codebook and stored in a storage device. The new and updated codebook may then be sent back 2925 to codebook training module 2900 and received by a codebook update engine 2950. Codebook update engine 2950 may temporarily store the received updated codebook in the cache 2970 until other network devices and machines are ready, at which point codebook update engine 2950 will publish the updated codebooks 2945 to the necessary network devices.

A network device manager 2960 may also be present which may request and receive network device data 2935 from a plurality of network connected devices and machines. When the disclosed encoding system and codebook training system 2800 are deployed in a production environment, upstream process changes may lead to data drift, or other unexpected behavior. For example, a sensor being replaced that changes the units of measurement from inches to centimeters, data quality issues such as a broken sensor always reading zero, and covariate shift which occurs when there is a change in the distribution of input variables from the training set. These sorts of behavior and issues may be determined from the received device data 2935 in order to identify potential causes of system error that is not related to data drift and therefore does not require an updated codebook. This can save network resources from being unnecessarily used on training new algorithms as well as alert system users to malfunctions and unexpected behavior devices connected to their networks. Network device manager 2960 may also utilize device data 2935 to determine available network resources and device downtime or periods of time when device usage is at its lowest. Codebook update engine 2950 may request network and device availability data from network device manager 2960 in order to determine the most optimal time to transmit updated codebooks (i.e., trained libraries) to encoder and decoder devices and machines.

Figure 30:
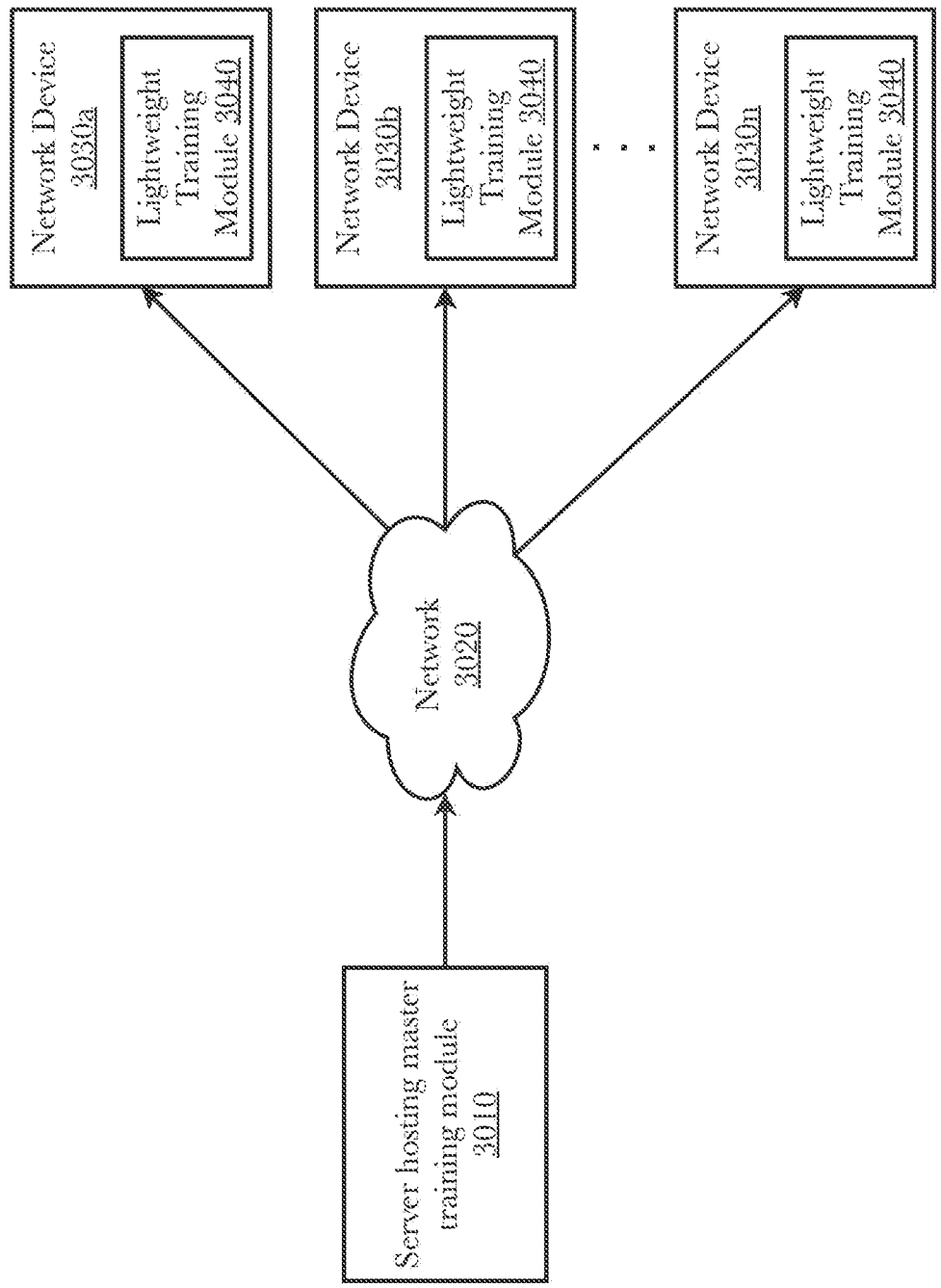
FIG. 30 is a block diagram of another embodiment of the codebook training system using a distributed architecture and a modified training module.

FIG. 30 is a block diagram of another embodiment of the codebook training system using a distributed architecture and a modified training module. According to an embodiment, there may be a server which maintains a master supervisory process over remote training devices hosting a master training module 3010 which communicates via a network 3020 to a plurality of connected network devices 3030*a-n*. The server may be located at the remote training end such as, but not limited to, cloud-based resources, a user-owned data center, etc. The master training module located on the server operates similarly to the codebook training module disclosed in FIG. 29 above, however, the server 3010 utilizes the master training module via the network device manager 2960 to farm out training resources to network devices 3030*a-n*. The server 3010 may allocate resources in a variety of ways, for example, round-robin, priority-based, or other manner, depending on the user needs, costs, and number of devices running the encoding/decoding system. Server 3010 may identify elastic resources which can be employed if available to scale up training when the load becomes too burdensome. On the network devices 3030*a-n* may be present a lightweight version of the training module 3040 that trades a little suboptimality in the codebook for training on limited machinery and/or makes training happen in low-priority threads to take advantage of idle time. In this way the training of new encoding/decoding algorithms may take place in a distributed manner which allows data gathering or generating devices to process and train on data gathered locally, which may improve system latency and optimize available network resources.

Figure 32:
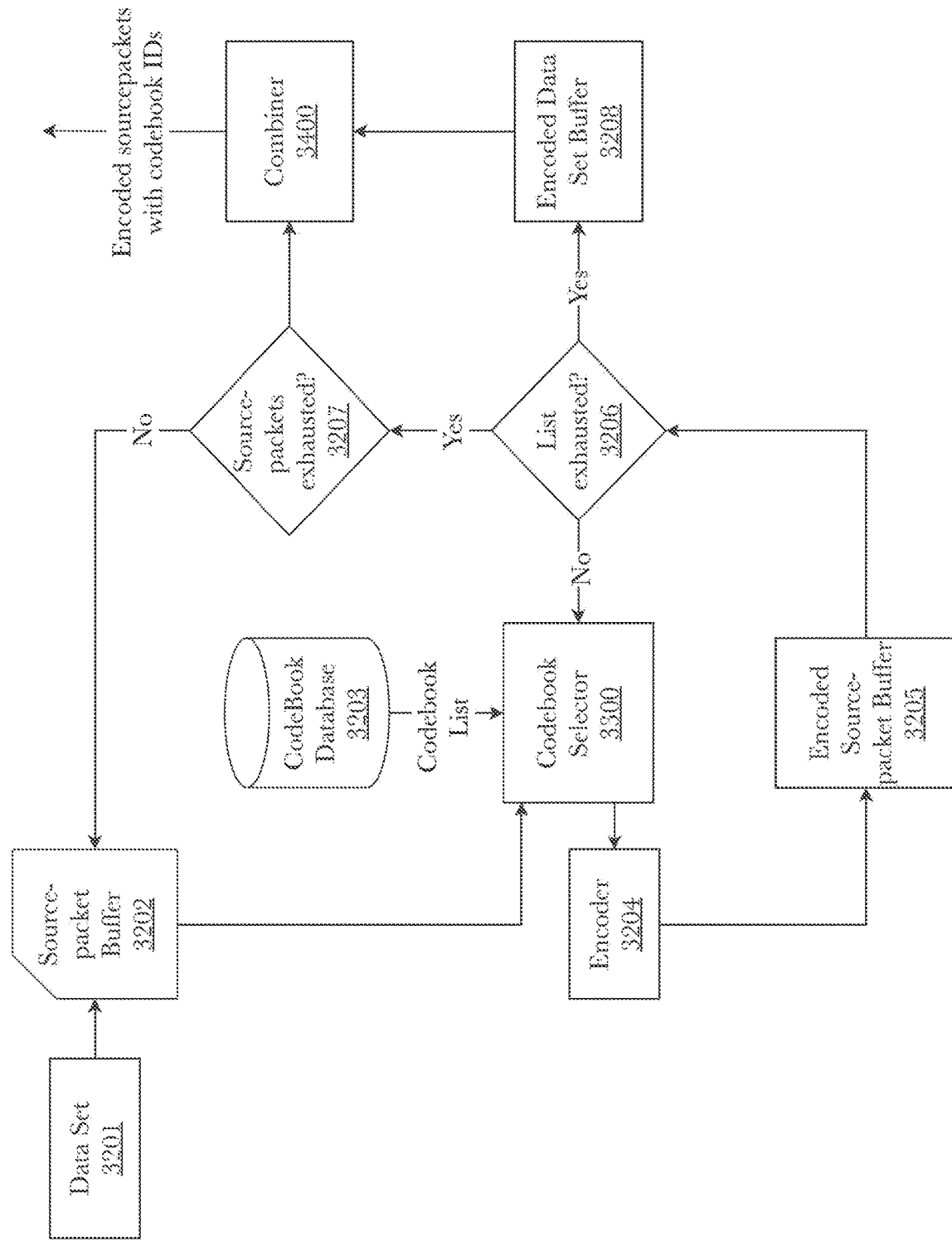
FIG. 32 is an exemplary system architecture for an encoding system with multiple codebooks.

FIG. 32 is an exemplary system architecture for an encoding system with multiple codebooks. A data set to be encoded 3201 is sent to a sourcepacket buffer 3202. The sourcepacket buffer is an array which stores the data which is to be encoded and may contain a plurality of sourcepackets. Each sourcepacket is routed to a codebook selector 3300, which retrieves a list of codebooks from a codebook database 3203. The sourcepacket is encoded using the first codebook on the list via an encoder 3204, and the output is stored in an encoded sourcepacket buffer 3205. The process is repeated with the same sourcepacket using each subsequent codebook on the list until the list of codebooks is exhausted 3206, at which point the most compressed encoded version of the sourcepacket is selected from the encoded sourcepacket buffer 3205 and sent to an encoded data set buffer 3208 along with the ID of the codebook used to produce it. The sourcepacket buffer 3202 is determined to be exhausted 3207, a notification is sent to a combiner 3400, which retrieves all of the encoded sourcepackets and codebook IDs from the encoded data set buffer 3208 and combines them into a single file for output.

According to an embodiment, the list of codebooks used in encoding the data set may be consolidated to a single codebook which is provided to the combiner 3400 for output along with the encoded sourcepackets and codebook IDs. In this case, the single codebook will contain the data from, and codebook IDs of, each of the codebooks used to encode the data set. This may provide a reduction in data transfer time, although it is not required since each sourcepacket (or sourceblock) will contain a reference to a specific codebook ID which references a codebook that can be pulled from a database or be sent alongside the encoded data to a receiving device for the decoding process.

In some embodiments, each sourcepacket of a data set 3201 arriving at the encoder 3204 is encoded using a different sourceblock length. Changing the sourceblock length changes the encoding output of a given codebook. Two sourcepackets encoded with the same codebook but using different sourceblock lengths would produce different encoded outputs. Therefore, changing the sourceblock length of some or all sourcepackets in a data set 3201 provides additional security. Even if the codebook was known, the sourceblock length would have to be known or derived for each sourceblock in order to decode the data set 3201. Changing the sourceblock length may be used in conjunction with the use of multiple codebooks.

Figure 33:
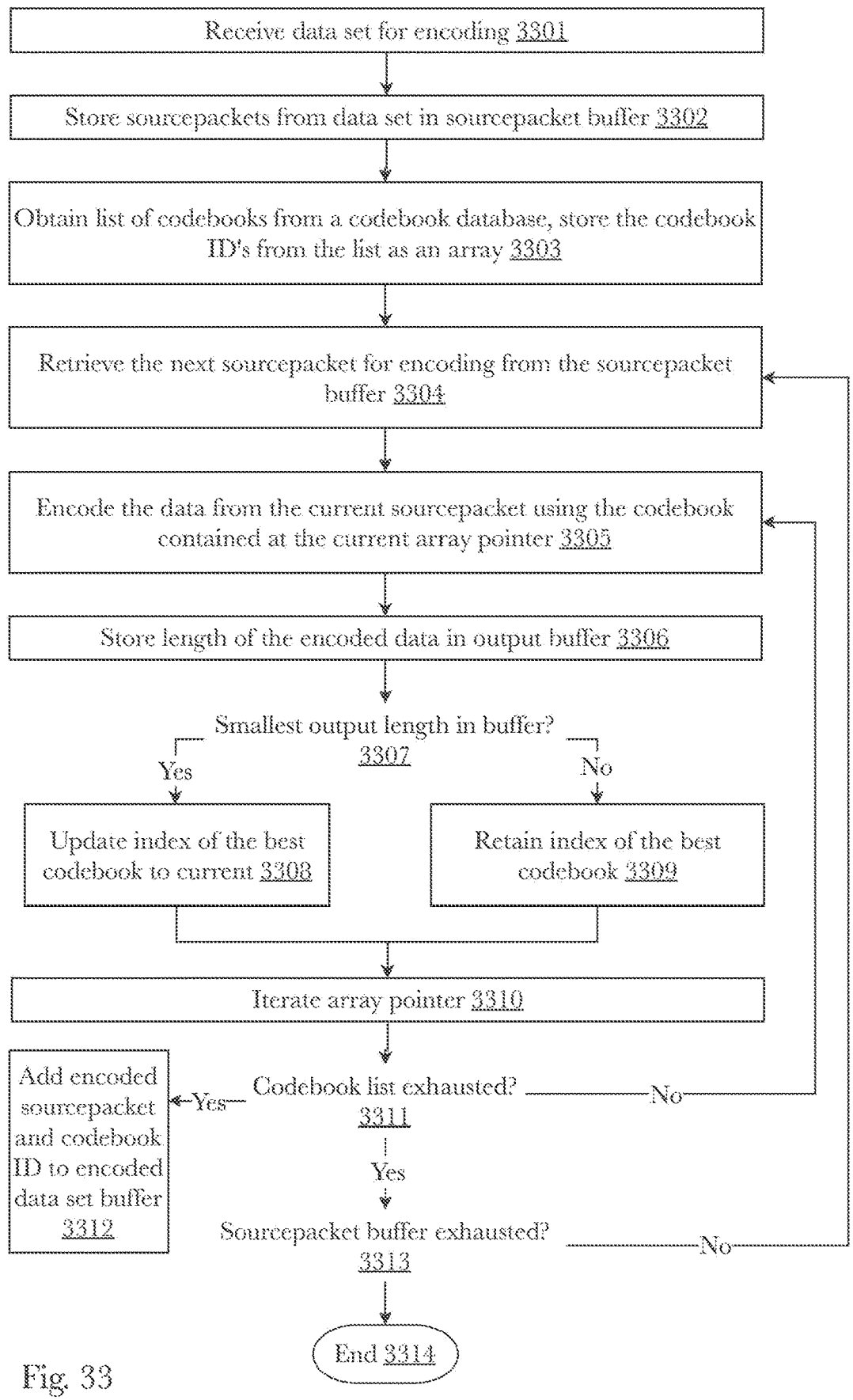
FIG. 33 is a flow diagram describing an exemplary algorithm for encoding of data using multiple codebooks.

FIG. 33 is a flow diagram describing an exemplary algorithm for encoding of data using multiple codebooks. A data set is received for encoding 3301, the data set comprising a plurality of sourcepackets. The sourcepackets are stored in a sourcepacket buffer 3302. A list of codebooks to be used for multiple codebook encoding is retrieved from a codebook database (which may contain more codebooks than are contained in the list) and the codebook IDs for each codebook on the list are stored as an array 3303. The next sourcepacket in the sourcepacket buffer is retrieved from the sourcepacket buffer for encoding 3304. The sourcepacket is encoded using the codebook in the array indicated by a current array pointer 3305. The encoded sourcepacket and length of the encoded sourcepacket is stored in an encoded sourcepacket buffer 3306. If the length of the most recently stored sourcepacket is the shortest in the buffer 3607, an index in the buffer is updated to indicate that the codebook indicated by the current array pointer is the most efficient codebook in the buffer for that sourcepacket. If the length of the most recently stored sourcepacket is not the shortest in the buffer 3607, the index in the buffer is not updated because a previous codebook used to encode that sourcepacket was more efficient 3309. The current array pointer is iterated to select the next codebook in the list 3310. If the list of codebooks has not been exhausted 3311, the process is repeated for the next codebook in the list, starting at step 3305. If the list of codebooks has been exhausted 3311, the encoded sourcepacket in the encoded sourcepacket buffer (the most compressed version) and the codebook ID for the codebook that encoded it are added to an encoded data set buffer 3312 for later combination with other encoded sourcepackets from the same data set. At that point, the sourcepacket buffer is checked to see if any sourcepackets remain to be encoded 3313. If the sourcepacket buffer is not exhausted, the next sourcepacket is retrieved 3304 and the process is repeated starting at step 3304. If the sourcepacket buffer is exhausted 3313, the encoding process ends 3314. In some embodiments, rather than storing the encoded sourcepacket itself in the encoded sourcepacket buffer, a universal unique identification (UUID) is assigned to each encoded sourcepacket, and the UUID is stored in the encoded sourcepacket buffer instead of the entire encoded sourcepacket.

Figure 34:
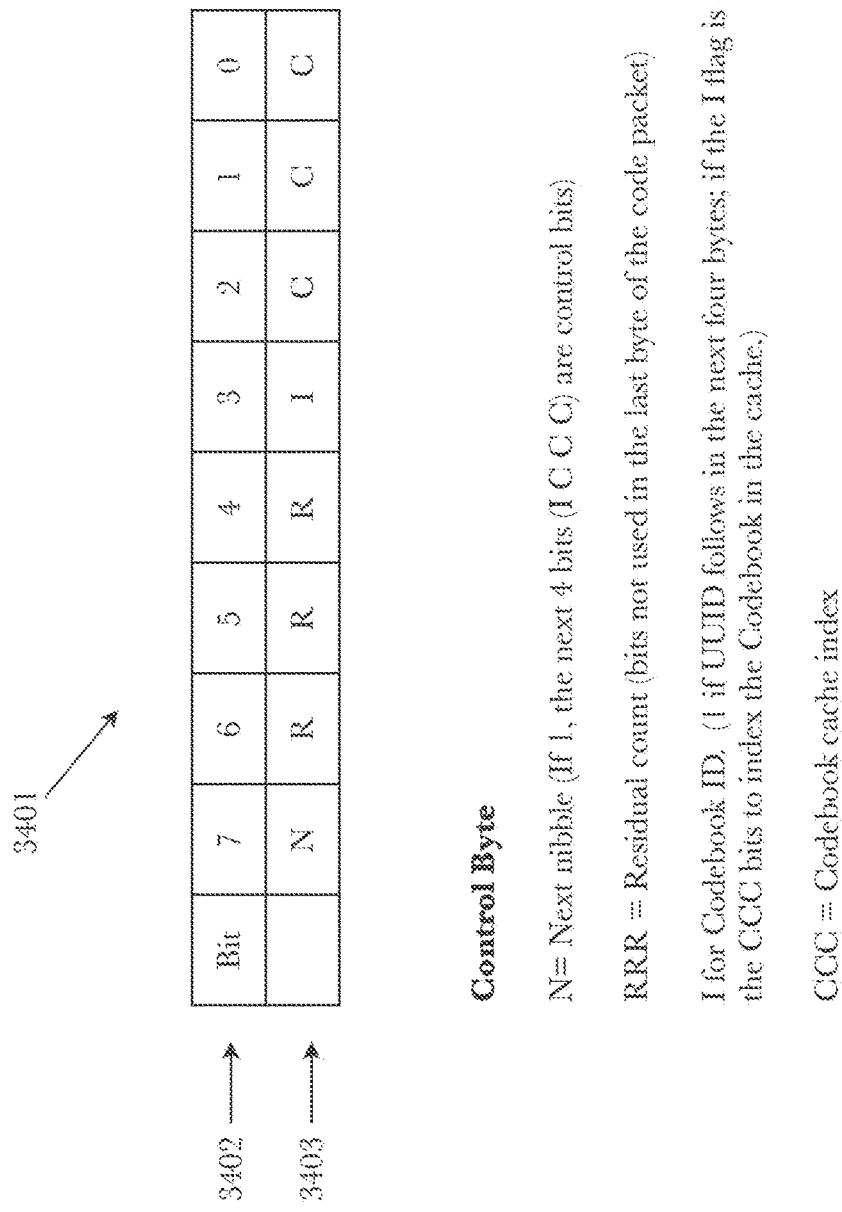
FIG. 34 is a flow diagram describing an exemplary codebook sorting algorithm for determining a plurality of codebooks to be shuffled between during the encoding process.

FIG. 34 is a diagram showing an exemplary control byte used to combine sourcepackets encoded with multiple codebooks. In this embodiment, a control byte 3401 (i.e., a series of 8 bits) is inserted at the before (or after, depending on the configuration) the encoded sourcepacket with which it is associated, and provides information about the codebook that was used to encode the sourcepacket. In this way, sourcepackets of a data set encoded using multiple codebooks can be combined into a data structure comprising the encoded sourcepackets, each with a control byte that tells the system how the sourcepacket can be decoded. The data structure may be of numerous forms, but in an embodiment, the data structure comprises a continuous series of control bytes followed by the sourcepacket associated with the control byte. In some embodiments, the data structure will comprise a continuous series of control bytes followed by the UUID of the sourcepacket associated with the control byte (and not the encoded sourcepacket, itself). In some embodiments, the data structure may further comprise a UUID inserted to identify the codebook used to encode the sourcepacket, rather than identifying the codebook in the control byte. Note that, while a very short control code (one byte) is used in this example, the control code may be of any length, and may be considerably longer than one byte in cases where the sourceblocks size is large or in cases where a large number of codebooks have been used to encode the sourcepacket or data set.

In this embodiment, for each bit location 3402 of the control byte 3401, a data bit or combinations of data bits 3403 provide information necessary for decoding of the sourcepacket associated with the control byte. Reading in reverse order of bit locations, the first bit N (location 7) indicates whether the entire control byte is used or not. If a single codebook is used to encode all sourcepackets in the data set, N is set to 0, and bits 3 to 0 of the control byte 3401 are ignored. However, where multiple codebooks are used, N is set to 1 and all 8 bits of the control byte 3401 are used. The next three bits RRR (locations 6 to 4) are a residual count of the number of bits that were not used in the last byte of the sourcepacket. Unused bits in the last byte of a sourcepacket can occur depending on the sourceblock size used to encode the sourcepacket. The next bit I (location 3) is used to identify the codebook used to encode the sourcepacket. If bit I is 0, the next three bits CCC (locations 2 to 0) provide the codebook ID used to encode the sourcepacket. The codebook ID may take the form of a codebook cache index, where the codebooks are stored in an enumerated cache. If bit I is 1, then the codebook is identified using a four-byte UUID that follows the control byte.

Figure 35:
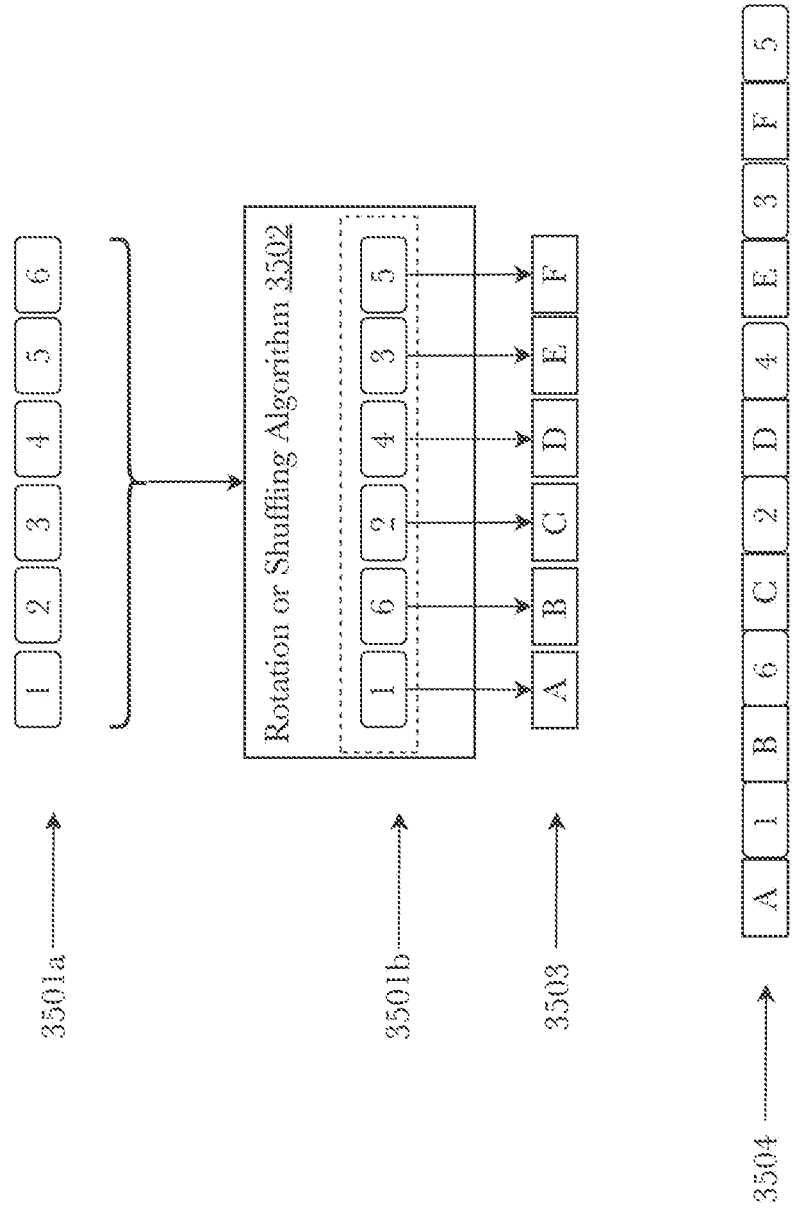
FIG. 35 is a diagram showing an exemplary codebook shuffling method.

FIG. 35 is a diagram showing an exemplary codebook shuffling method. In this embodiment, rather than selecting codebooks for encoding based on their compression efficiency, codebooks are selected either based on a rotating list or based on a shuffling algorithm. The methodology of this embodiment provides additional security to compressed data, as the data cannot be decoded without knowing the precise sequence of codebooks used to encode any given sourcepacket or data set.

Here, a list of six codebooks is selected for shuffling, each identified by a number from 1 to 6 3501a. The list of codebooks is sent to a rotation or shuffling algorithm 3502 and reorganized according to the algorithm 3501b. The first six of a series of sourcepackets, each identified by a letter from A to E, 3503 is each encoded by one of the algorithms, in this case A is encoded by codebook 1, B is encoded by codebook 6, C is encoded by codebook 2, D is encoded by codebook 4, E is encoded by codebook 13 A is encoded by codebook 5. The encoded sourcepackets 3503 and their associated codebook identifiers 3501b are combined into a data structure 3504 in which each encoded sourcepacket is followed by the identifier of the codebook used to encode that particular sourcepacket.

According to an embodiment, the codebook rotation or shuffling algorithm 3502 may produce a random or pseudo-random selection of codebooks based on a function. Some non-limiting functions that may be used for shuffling include:

1. given a function f(n) which returns a codebook according to an input parameter n in the range 1 to N are, and given t the number of the current sourcepacket or sourceblock: f(t*M modulo p), where M is an arbitrary multiplying factor (1<=M<=p−1) which acts as a key, and p is a large prime number less than or equal to N;
2. f(A^t modulo p), where A is a base relatively prime to p−1 which acts as a key, and p is a large prime number less than or equal to N;
3. f(floor(t*x) modulo N), and x is an irrational number chosen randomly to act as a key;
4. f(t XOR K) where the XOR is performed bit-wise on the binary representations of t and a key K with same number of bits in its representation of N. The function f(n) may return the nth codebook simply by referencing the nth element in a list of codebooks, or it could return the nth codebook given by a formula chosen by a user.

In one embodiment, prior to transmission, the endpoints (users or devices) of a transmission agree in advance about the rotation list or shuffling function to be used, along with any necessary input parameters such as a list order, function code, cryptographic key, or other indicator, depending on the requirements of the type of list or function being used. Once the rotation list or shuffling function is agreed, the endpoints can encode and decode transmissions from one another using the encodings set forth in the current codebook in the rotation or shuffle plus any necessary input parameters.

In some embodiments, the shuffling function may be restricted to permutations within a set of codewords of a given length.

Note that the rotation or shuffling algorithm is not limited to cycling through codebooks in a defined order. In some embodiments, the order may change in each round of encoding. In some embodiments, there may be no restrictions on repetition of the use of codebooks.

In some embodiments, codebooks may be chosen based on some combination of compression performance and rotation or shuffling. For example, codebook shuffling may be repeatedly applied to each sourcepacket until a codebook is found that meets a minimum level of compression for that sourcepacket. Thus, codebooks are chosen randomly or pseudo-randomly for each sourcepacket, but only those that produce encodings of the sourcepacket better than a threshold will be used.

Figure 36:
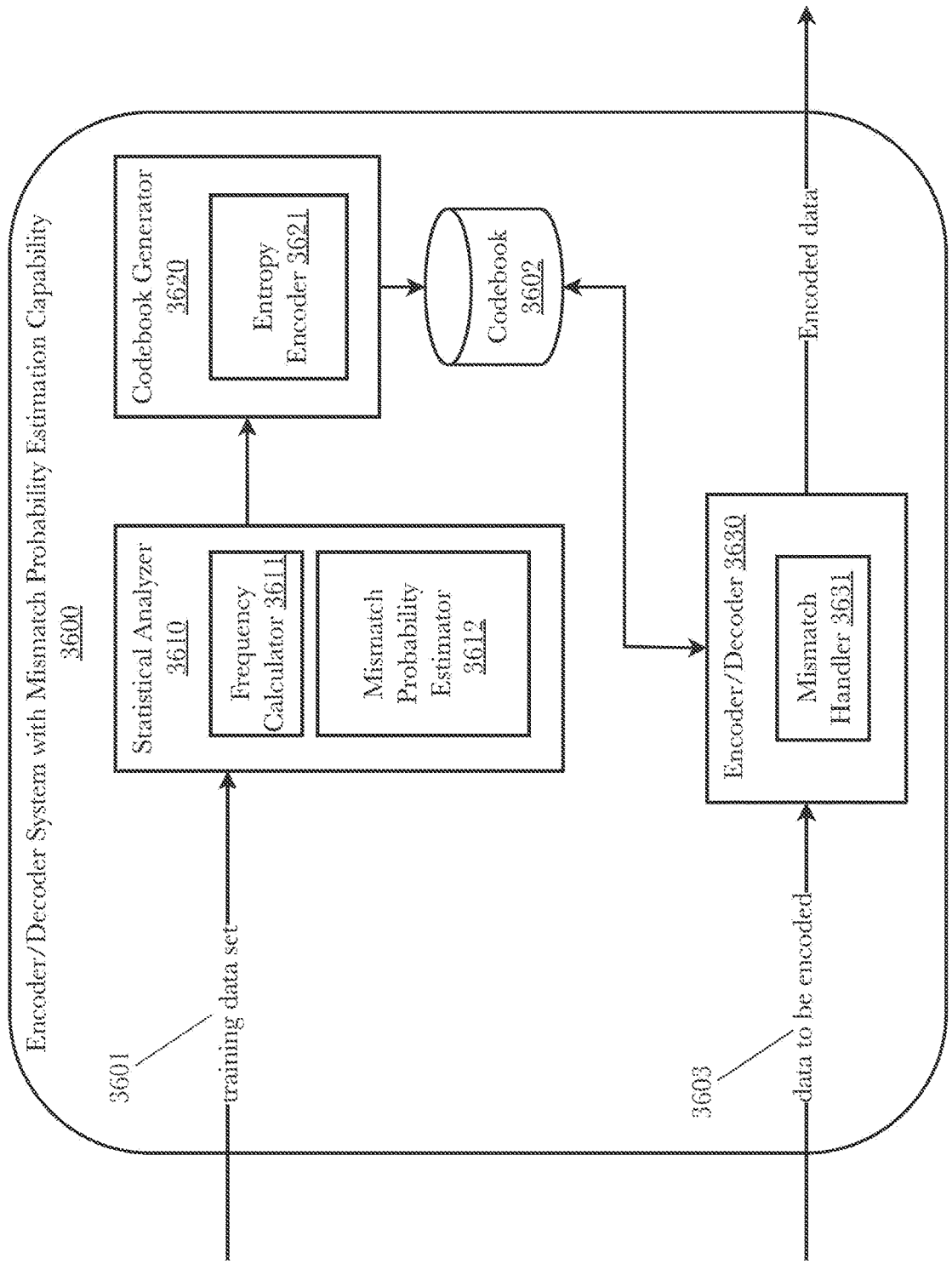
FIG. 36 is a block diagram of an exemplary system architecture for encoding data using mismatch probability estimates, according to an embodiment.

FIG. 36 is a block diagram of an exemplary system architecture for encoding data using mismatch probability estimates, according to an embodiment. According to an embodiment, encoder/decoder system with mismatch probability estimation capability 3600 comprises a statistical analyzer 3610, a codebook generator 3620, a reference codebook 3602, and an encoder/decoder 3630.

Entropy encoding methods (also known as entropy coding methods) are lossless data compression methods which replace fixed-length data inputs with variable-length prefix-free codewords based on the frequency of their occurrence within a given distribution. This reduces the number of bits required to store the data inputs, limited by the entropy of the total data set. The most well-known entropy encoding method is Huffman coding, which will be used in the examples herein.

Because any lossless data compression method must have a code length sufficient to account for the entropy of the data set, entropy encoding is most compressed where the entropy of the data set is small. However, smaller entropy in a data set means that, by definition, the data set contains fewer variations of the data. So, the smaller the entropy of a data set used to create a codebook using an entropy encoding method, the larger is the probability that some piece of data to be encoded will not be found in that codebook. Adding new data to the codebook leads to inefficiencies that undermine the use of a low-entropy data set to create the codebook.

System 3600 receives a training data set 3601 comprising one or more sourcepackets of data, wherein each of the one or more sourcepackets of data may further comprise a plurality of sourceblocks. Ideally, training data set 3601 will be selected to closely match data that will later be input into the system for encoding (a low-entropy data set relative to expected data to be encoded). As sourceblocks of training data set data 3601 are processed, statistical analyzer 3610 uses frequency calculator 3611 to keep track of sourceblock frequency, which is the frequency at which each distinct sourceblock occurs in the training data set. Once the training data set 3601 has been fully processed and the sourceblock frequency is known, system 3600 has sufficient information to create a codebook using an entropy encoding method such as Huffman coding. While a codebook can be created at this point, the codebook will not contain codewords for sourceblocks that were either not encountered in the training data sets 3601, or that were included in the training data sets 3601 but were pruned from the codebook for various reasons (as one example, sourceblocks that do not appear frequently enough in a given data set may be pruned for purposes of efficiency or space-saving).

To address the problem of mismatched sourceblocks during encoding (i.e., sourceblocks in data to be encoded which do not have a codeword in the codebook), mismatch probability estimation is used, wherein the probability of encountering data that is not in the codebook is calculated in advance, and a special "mismatch codework" is incorporated into the codebook (the primary encoding algorithm) to represent the expected frequency of encountering previously-unencountered sourceblocks. When a previously-unencountered sourceblock is encountered during encoding, attempting to encode the sourceblock using the codebook results in the mismatch codeword, which triggers a secondary encoding algorithm to encode that sourceblock. The secondary encoding algorithm may result in a less-than-optimal encoding of the previously-unencountered data, but the efficiencies of using a low-entropy primary encoding make up for the inefficiencies of the secondary encoding algorithm. Because the use of the secondary encoding algorithm has been accounted for in the codebook (the primary encoding algorithm) by the mismatch probability estimation, the overall efficiency of compression is improved over other entropy encoding methods.

Mismatch probability estimator 3612 calculates the probability that a sourceblock to be encoded will not be in the codebook generated from the training data. This probability is difficult to estimate because it is the probability that a sourceblock is not one which was seen in the training data (i.e., the system needs to estimate the probability of a previously-unseen event). Several algorithms for calculating the mismatch probability follow. The mismatch probability in these algorithms is defined as q. These algorithms are intended to be exemplary, and not exclusive of other algorithms that could be used to calculate this probability.

In a first algorithm, q is taken to be the number M of times a mismatch occurred during training (i.e., when a previous-unobserved sourceblock appeared in the training data), dividing by the total number N of sourceblocks observed during training, i.e., q=M/N. However, for many training data sets, a static q=M/N may not be an accurate estimate for q, as the mismatch frequency may fall with time as training data is ingested, resulting in a q that is too high. This is likely to be the case where the training and real-world data are drawn from the same data type.

A second algorithm that improves on the first uses a sum of probabilities to calculate q. Suppose that sourceblocks $S_1$, $S_2$, ..., $S_N$ are observed during training. For j=1, ..., N, let the variable $X_j$ denote the indicator of the event that sourceblock $S_j$ is a mismatch, i.e., $$X_j = \begin{cases} 1 & \text{if } S_j \notin \{S_i: 1 \leq i < j\} \\ 0 & \text{otherwise} \end{cases}$$

Then we can write $q=M/N=(\Sigma_{j=1}^N X_j)/N$.

A third algorithm that improves on the second, employs a modified exponentially-weighted moving average (EWMA) to calculate changes in q over time:

$$\mu_j = \begin{cases} 1 & \text{if } j = 0 \\ (1-\beta_j)\mu_{j-1} + \beta_j X_j & \text{if } j > 0 \end{cases}$$

If $\beta_j$, a quantity between 0 and 1, were constant (i.e., not depending on j), then this is a classical EWMA. However, there are two issues to balance in choosing $\beta_j$: a value too close to 1 causes extreme volatility in the estimate $\mu_j$, since it will depend only on very recent occurrences/nonoccurrences of mismatches; and a value too close to 0 will cause difficult round-off errors or else cause the estimate to depend on very early training data (when mismatch frequencies will be misleadingly high). Therefore, we take $\beta_j$=C log(j)/j (and $\beta_1$=1 to avoid initialization problems), for some constant C. In practice, we have observed C=1 to be a good choice here, though it is by no means the only possibility, and some applications with particularly stable or unstable mismatch distributions will benefit from a different value. The effect of this choice is to cause the mismatch probability estimate $\mu_j$ to depend only on the recent O(1/log(j)) fraction of the data when sourceblock j is observed, a quantity tending to zero slowly.

Two additional adjustments may be made to deal with certain cases. First, when training begins, the statistic $\mu_j$ is highly volatile, resulting in poor estimates if the training data is very small. Therefore, an adjustment to the algorithm for this case is to monitor the sample standard deviation $\sigma_j$ of $\mu_j$ and use the aforementioned M/N estimate until $\sigma_j$ falls below some pre-set tolerance, for example the condition that $\sigma_j/\mu_j$<10%. This value of 10% can be replaced with another value if experimentation shows that a difference value is warranted for a particular data type. Second, the quantity $\mu_j$ tends to be a slight overestimate because it will fall over time during training, so it may be biased slightly above the true mismatch probability. Therefore, am adjustment to the algorithm for this case is to use the smallest recent value of $\mu_j$ instead of $\mu_j$ itself, i.e., $$\mu'_j = \min_{j-B \leq i \leq j} \mu_i$$

where B is a "windowing" parameter reflecting how far back in the history of the training process to incorporate in the estimate, and negative indices are ignored. It may be useful in some circumstances to take a variable value for B=$B_j$ instead of a constant, a reasonable choice being $B_j$=j/(C log j), the effective window size for the EWMA discussed above.

After the mismatch probability estimate is made, codebook generator 3620 generates a codebook using entropy encoder 3621. Entropy encoder 3621 uses an entropy encoding method to create a codebook based on the frequency of occurrences of each sourceblock in the training data set, including the estimated frequency of occurrence of mismatched sourceblocks, for which a special "mismatch codeword" is inserted into the codebook. The resulting codebook is stored in a database 3602, which is accessed by encoder/decoder 3630 to encode data to be encoded 3603. When a mismatch occurs and the mismatch codeword is returned, mismatch handler 3631 receives the mismatched sourceblock and encodes it using a secondary encoding method, inserting the secondary encoding into the encoded data stream and returning the encoding process to encoding using the codebook (the primary encoding method).

Figure 39:
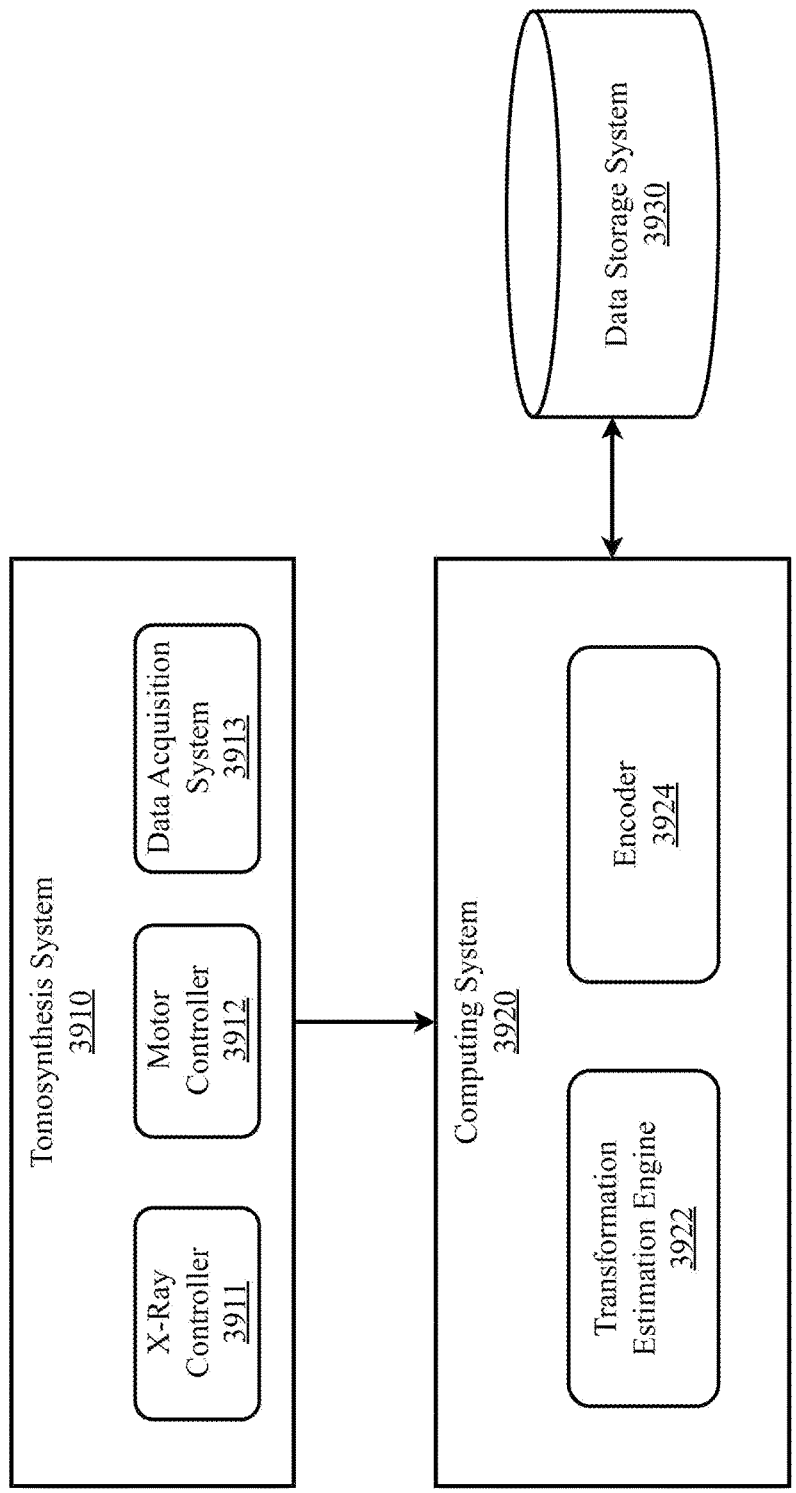
FIG. 39 is a block diagram illustrating an exemplary system for compressing a video or series of images received from an imaging device, according to an embodiment.

FIG. 39 is a block diagram illustrating an exemplary system for compressing a video or series of images received from an imaging device, according to an embodiment. According to the embodiment, the video or series of images may be received from various information sources including medical imaging devices such as, for example, x-ray imaging, computed tomography, magnetic resonance imaging (MRI), ultrasound imaging, positron emission tomography, single-photon emission computed tomography, mammography, fluoroscopy, nuclear medicine, function MRI, and cone beam computed tomography. The video data or series of images may also be obtained from sources such as satellites. In a preferred embodiment, the video or series of images may be obtained from or otherwise associated with tomosynthesis imaging data.

An exemplary tomosynthesis system 3910 is illustrated for acquiring, processing, and displaying tomosynthesis images, including images of various slices or slabs through a subject of interest in accordance with the present techniques. In this embodiment, tomosynthesis system includes a source of X-ray radiation which is movable generally in a plane, or in three dimensions. In this exemplary embodiment, the X-ray source 3911 typically include an X-ray tube and associated support and filtering components.

A stream of radiation is emitted by the source 3911 and passes into a region of a subject, such as human patient. A collimator serves to define the size and shape of the X-ray beam that emerges from the X-ray source toward the subject. A portion of the radiation passes through and around the subject, it impacts a detector array. Detector elements of the array produce electrical signals that represent the intensity of the incident X-ray beam. These signals are acquired and processed to reconstruct an image of the features within the subject.

The X-ray source 3911 is controlled by a system controller 3912 which furnishes both power and control signals for tomosynthesis examination sequences, including position of the source 3911 relative to the subject and detector. Moreover, detector is coupled to the system controller 3912 which commands acquisition of the signals generated by the detector The system controller 3912 may also execute various signal processing and filtration functions, such as for initial adjustments of dynamic ranges, interleaving of digital image data, and/or the like. In general, the system controller 3912 commands operation of the imaging system to execute examination protocols and to process acquired data. In the present context, system controller 3912 may also include signal processing circuitry, typically based upon a general purpose or application specific digital computer, associated memory circuitry for storing programs and routines executed by the computer, as well as configuration parameters and image data, interface circuits, and/or the like. The X-ray detector is coupled to a data acquisition system 3913 that receives data collected by various electronics of the detector. For example, data acquisition system 3913 may receive analog signals from detector and convert them to digital signals for subsequent processing by a computing system 3920.

Computing system 3920 may generally be coupled to system controller 3912. Data collected by data acquisition system 3913 may be transmitted to computing system 3920 and/or data storage system 3930. Any suitable memory device may be utilized to implement data storage system and or as memory for computing system, particularly memory devices adapted to process and store large amounts of data produced by the system. In some embodiment, computing system 3920 may be configured to receive commands and scanning parameters from an operator via an operator workstation, typically equipped with a keyboard, mouse, or other input devices. For example, an operator may operate these devices and begin examinations for acquiring image data.

Whether processed directly at the imaging system or within a post-processing system, the data gathered by the system undergoes manipulation to reconstruct a three-dimensional representation of the imaged volume. As an illustration, a process known as back-projection is employed, wherein the system executes mathematical operations to compute the spatial distribution of X-ray attenuation within the imaged object. This computed information is then utilized to generate slices. These slices are typically oriented parallel to the plane of the detector, although alternative arrangements are also feasible. For instance, a reconstructed dataset might be reformatted to consist of vertical slices instead of the horizontal slices. In an exemplary embodiment, the spacing between these slices could be 1 mm or less. In the context of an ultrasound implementation, a tomosynthesis dataset for an object with a compressed thickness of 4 cm may include 40 or more slices, each possessing the resolution of a single ultrasound image. For a thicker object, additional slices may be reconstructed. These slices can be more-or-less stacked together to form the three-dimensional representation of the imaged object.

To preserve small structures within the three-dimensional (3D) representation with a high degree of accuracy, the representation may be composed of a plurality of slices spaced very close together. This close spacing of the slices may imply that larger structures in the 3D representations are visible across numerous slices. Thus, there may be redundant data from one slice to the next. Typically, the smaller the distance between the slices, the higher their degree of similarity or redundancy. For instance, adjacent slices may contain a great deal of similar data with only minor differences. Additionally, the vertical resolution of tomosynthesis imaging may be limited by the angular range of the acquired projection images, therefore lower spatial frequencies may have a higher degree of similarity between adjacent slices.

According to some implementations, a tomosynthesis image dataset may be compressed by an encoder 3924 configured to leverage the redundancies inherent the tomosynthesis image dataset to create a codebook comprising a plurality of codewords, wherein the codewords represent compressed tomosynthesis imagery data. As an example, consider the use case of using ultrasound tomography to identify the distributions of breast density in a patient undergoing a mammogram. Breast density has usually been defined using mammography as the ratio of fibro-glandular tissue to breast area. Ultrasound tomography is an emerging modality that can also be used to measure breast density. Each slice of an tomographic image may share redundant data associated with density parameters between adjacent slices. For example, healthy breast tissue may be characterized by a density or set of densities, and unhealth breast tissue (e.g., a cancer tumor) may be characterized by a separate density or set of densities. A tomosynthesis imagery dataset may comprise slices which share redundant data between adjacent slices in the form of density data.

According to the embodiment, encoder 3924 may receive the tomosynthesis image dataset comprising a plurality of image slices and perform a data processing step of dividing the dataset into a plurality of data sourceblocks, wherein the sourceblocks may be any fixed or variable length. In an embodiment, encoder may utilize a data deconstruction engine or some variant thereof (e.g., such as codebook generator 3620) to perform the step of dividing the dataset into a plurality of sourceblocks. In some implementations, encoder 3924 may be trained on a training dataset comprising a plurality of tomosynthesis imagery data, wherein the training dataset is used to train a customized library of soureblocks or codewords or both.

Encoder leverages the redundancies in slices which are close together (e.g., sequential slices of a sequence of image slices) during data deconstruction to optimally create data sourceblocks of the appropriate size to capture the redundancies contained therein. Codewords are then assigned to each data sourceblock based on various statistical analysis techniques. For example, codewords may be assigned to sourceblocks based on a frequency of occurrence in the dataset as described herein. Because sequential slices of tomosynthesis imagery data can contain a lot of similar data and only minor differences, the two slices may be represented as a small collection of codewords instead, representing a lossless compression of tomosynthesis imagery data. A codeword and its associated sourceblock may be referred to herein as a codeword pair, and a codebook comprising a plurality of codeword pairs may be constructed by encoder 3924 wherein the codebook represents the compressed tomosynthesis image data. Encoded data (as well as raw data) may be sent to data storage system 3930 which can store and maintain the data with respect to any local rules, regulations, or other protocols that may constrain how sensitive data such a medical imaging data may be stored and/or processed. In some embodiments, data storage system 3930 may be implemented as a picture archiving and communication system (PACS). PACS is a medical imaging technology used primarily by healthcare organizations to securely store and digitally transmit electronic images clinically-relevant reports.

According to the embodiment, computing system 3920 further comprises a transformation estimation engine 3922 configured to perform one or more data compression operations. In an embodiment, the one or more data compression steps may be associated with sequential registration and the creation of a transformation matrix wherein transformation estimation engine 3922 performs one or more steps corresponding to the creation of a transformation matrix. The transformation matrix may be created based on two images slices of obtained tomography imagery data. The two image slices may be adjacent slices in a sequence of slices. Transformation estimation engine 3922 may create a transformation matrix by first extracting feature points from each image of the plurality of images that make up a sequence of images such as tomosynthesis imagery data. Next, engine 3922 may estimate the corresponding points matching each other between successive slices of the tomosynthesis imagery dataset. Generally, transformation estimation engine 3922 receives, at least a first slice, and a second slice, and a plurality of slices thereafter including the features extracted previously. The estimated corresponding points that match can include the extracted features. As a next step, transformation estimation engine 3922 estimates the underlying geometric transformation between the successive slices based on the matches identified in the previous step. This may be estimated based on pixel transformations between the first slice and the second slice (each successive slice thereafter), and uses, for example, an automation function to generate a transformation matrix of a new position of the pixels. This step may be repeated until it fails to estimate a reliable transformation. In the tomosynthesis imagery dataset, a global transformation matrix for each slice can be calculated.

Transformation estimation engine 3922 may transform each slice to the first slice, by alignment, using the global transformation matrix generated in the previous step. At this step, each slice in succession may be aligned such that an overlapping area is aligned between each frame using the global transformation matrix. Next, transformation estimation engine 3922 may encode each slice in the dataset in terms of the residual and the global transformation matrix. The transformations are accumulative, meaning that the transformation applied to slice is composed with the transformations applied to the previous slices in the sequence.

In an implementation, transformation estimation engine 3922 may be further configured to apply matrix factorization techniques to decompose a transformation matrix into a product of two or more matrices. For example, singular value decomposition can be used to represent a matrix as a product of three matrices. The singular values can be truncated or compressed via codebooks to achieve compression. Because the transformation matrices are so closely related, they can be decomposed into multiple matrices wherein at least one or the matrices are the same. This is particularly useful for matrices with repeated transformations. This redundancy can be leveraged by an encoder 3924 which uses a codebook to compress the decomposed matrices. The result is a compressed transformation matrix. In other embodiments, the transformation matrix (and/or any decomposed matrices) may be serialized and compressed using a codebook as described herein.

Figure 40:
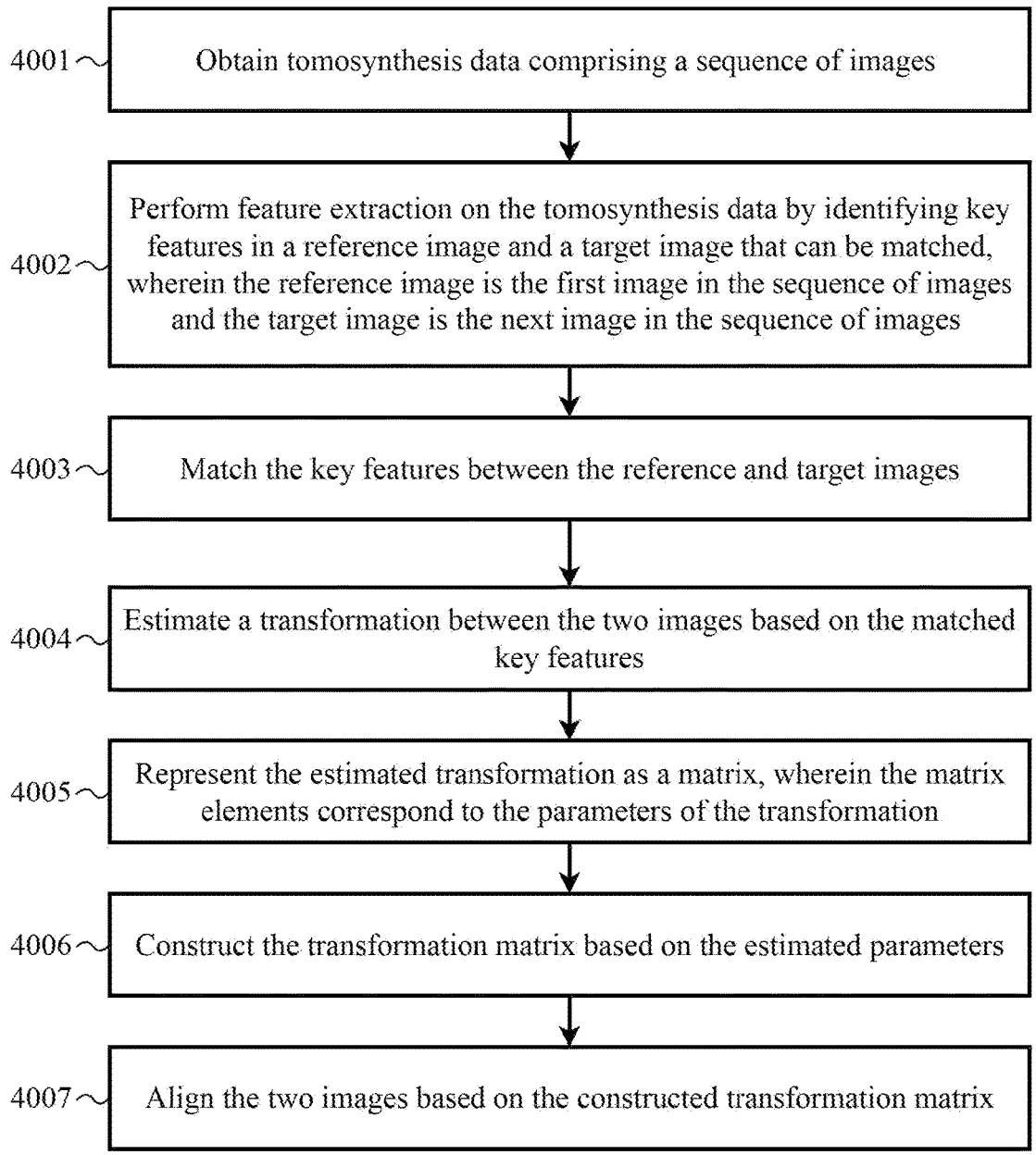
FIG. 40 is a flow diagram illustrating an exemplary method for sequential registration of medical imaging data comprising tomosynthesis data, according to an embodiment.

FIG. 40 is a flow diagram illustrating an exemplary method 4000 for sequential registration of medical imaging data comprising tomosynthesis data, according to an embodiment. The transformation matrix describes the geometric relationship between the pixels in one image (the reference image) and the pixels in another image (the target image) that corresponds to a different point in time, position, or viewpoint. According to the embodiment, the process begins at step 4001 when a transformation estimation subsystem (e.g., transformation estimation engine 3922) receives, retrieves, or otherwise obtains a plurality tomosynthesis data comprising a sequence of images. The sequence of images may be acquired at different time points or fames in a temporal sequence. The order in which these images are captured defines the temporal relationship between them. The images in a sequential order may exhibit motion or change over time. This motion can be due to various factors, including camera/equipment movement, object motion, or changes in the scene.

At step 4002 the subsystem performs feature extraction on the tomosynthesis data by identifying key features in a reference image and a target image that can easily be matched. According to an embodiment, initially the reference images is the first image in the sequence of images and the target image is the next image in the sequence of images and subsequent images thereafter. According to the embodiment, initially the reference image and the target image are adjacent images of the sequence of images. One of the images in the sequence is often chosen as the reference image, to which all other images are aligned. The choice of the reference image may depend on factors such as image quality, information content, or specific requirements of the application. At step 4003, the subsystem can match the key features between the reference and target image(s). This may be performed using various algorithms such as the Scale-Invariant Feature Transform, Speeded Up Robust Features, or others.

At step 4004, the subsystem can estimate a transformation between the two images based on the matched key features. Possible transformations include (but are not limited to) translation, rotation, scaling, and affine transformations. In some implementations, an estimated transformation may be evaluated to determine its accuracy with respect to how well it aligns the corresponding features or structures in the transformed images. One method of evaluation that can be implemented is residual analysis, wherein residuals, which represent the difference between the observed transformed points and the corresponding points in the reference image, are calculated. Similar residuals indicate a more accurate transformation. The residual analysis helps to identify any systemic errors or patterns in the misalignment. Overlap measures may be used to evaluate an estimated transformation matrix. Overlap measures evaluate the overlap or similarity between the transformed image the reference image. Common measures include the Dice coefficient, Jaccard index, or mutual information. Higher overlap values suggest a better alignment. Other methods of evaluation are possible and may be implemented in part or in combination with other methods to evaluate an estimated transformation matrix. Step 4004 may be repeated until the estimated transformation matrix satisfies a predetermined criteria with respect to accuracy as determined by one or more accuracy evaluations.

The transformation estimation subsystem can perform step 4005 by representing the estimated transformation as a matrix, wherein the matrix elements correspond to the parameters of the transformation. The subsystem may then construct the transformation matrix based on the estimated parameters at step 4006. As a last step 4007, the subsystem aligns the two images based on the constructed transformation matrix. The subsystem can apply the transformation matrix to warp or resample one image onto the coordinate space of the other. This step aligns the images based on the estimated transformation. As an optional step, the subsystem may assess the quality of the alignment by evaluating the alignment of additional features or structures in the images. In some embodiments, an iterative refinement process may be applied to improve the accuracy of the transformation estimation. This may involve refining the transformation matrix based on additional iterations of feature matching. In sequences with more than two sequential images, the subsystem can apply the same transformation matrix to align each subsequent image with the reference image, creating a sequence of transformed images. The transformations are accumulative, meaning that the transformation applied to an image is composed with the transformations applied to the previous images in the sequence.

The transformation matrix, and all other subsequently generated transformation matrices (e.g., as each image in the sequence will have an associated estimated transformation matrix) may be stored in a database for storage.

Figure 41:
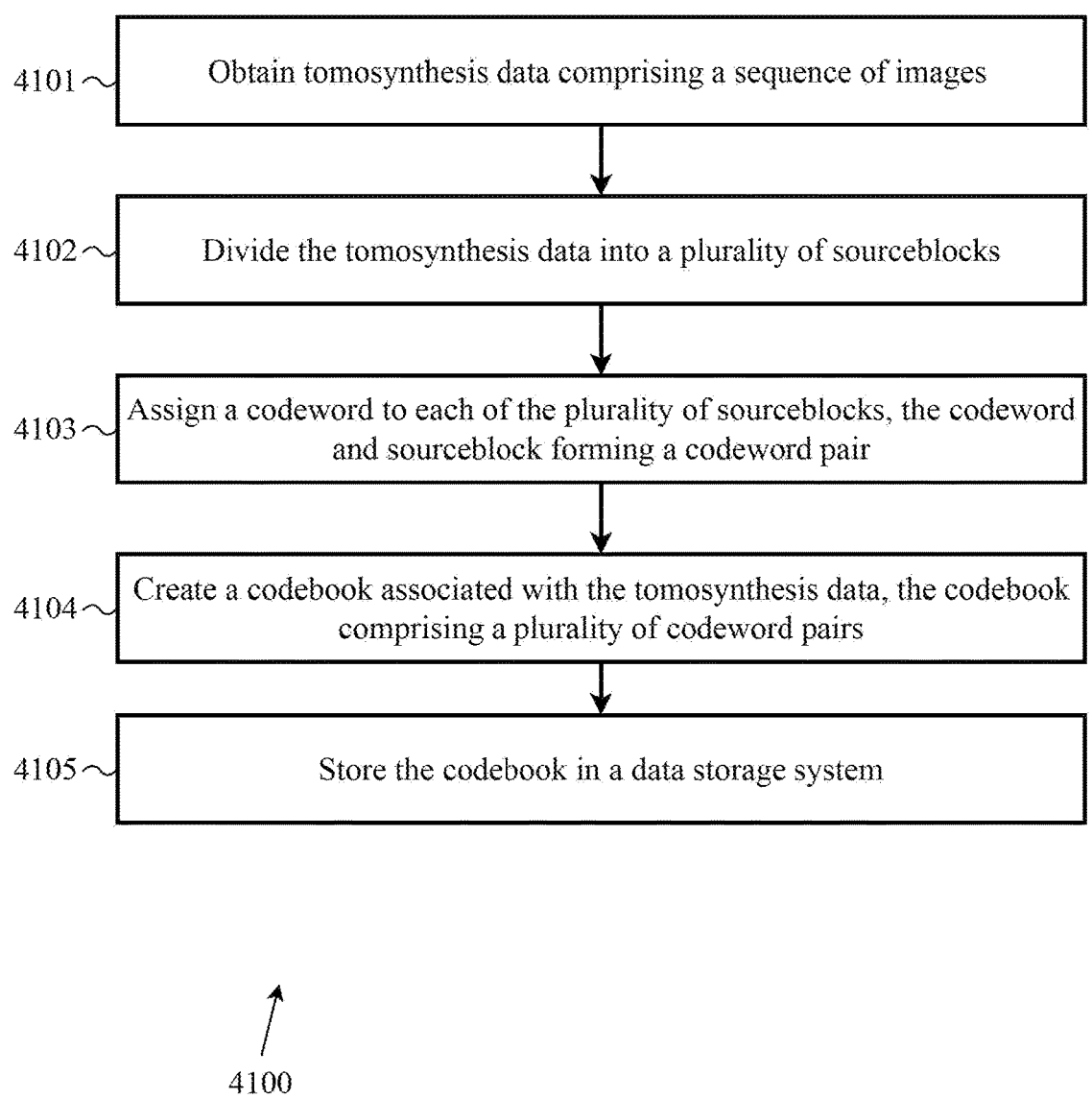
FIG. 41 is a flow diagram illustrating an exemplary method for compressing medical imaging data using a codebook, according to an embodiment.

FIG. 41 is a flow diagram illustrating an exemplary method 4100 for compressing medical imaging data using a codebook, according to an embodiment. According to the embodiment, the process begins at step 4101 when an encoder retrieves, receives, or otherwise obtains medical imaging data, wherein the medical imaging data is tomosynthesis data comprising a sequence of image/image slices. At step 4102 the encoder divides the tomosynthesis data into a plurality of sourceblocks. At step 4103 the encoder assigns a codeword to each of the plurality of sourceblocks, the codeword and the sourceblock forming a codeword pair. At step 4104, the encoder creates a codebook associated with the tomosynthesis data, the codebook comprising the plurality of codeword pairs created in the previous step. As a last step 4105, the encode can store the codebook in a data storage system, wherein the codebook represents the compressed tomosynthesis data.

Figure 42:
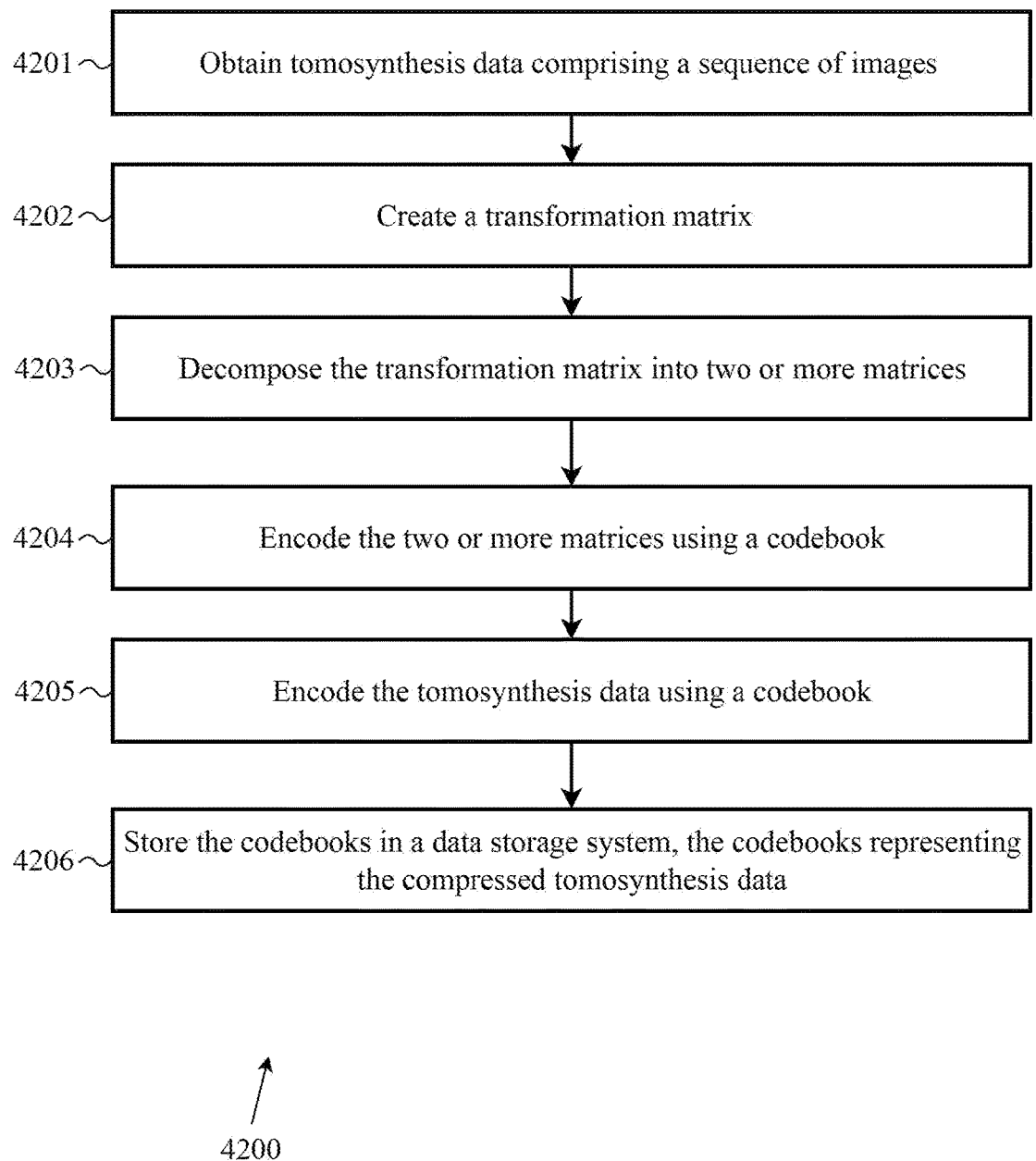
FIG. 42 is a flow diagram illustrating an exemplary method for compressing medical imaging data which has been sequentially registered, according to an embodiment.

FIG. 42 is a flow diagram illustrating an exemplary method 4200 for compressing medical imaging data which has been sequentially registered, according to an embodiment. According to the embodiment, the process begins at step 4201 when a computing system configured to compress medical imaging data receives, retrieves, or otherwise obtains medical imaging data, the medical imaging data comprising tomosynthesis data comprising a sequence of images. At a next step 4202 a transformation estimation subsystem creates a transformation matrix for each image in the sequence of images. At step 4203, the subsystem can decompose each transformation matrix into two or more matrices. At step 4204, an encoder may receive each of the transformation matrices and/or the decomposed matrices and then compress the received matrices using a codebook (matrix codebook). At step 4205 the encoder can compress the tomosynthesis data using a codebook (image codebook). As a last step 4206, the matrix and image codebooks are be stored in a data storage system, the two codebooks representing the compressed tomosynthesis data. In an embodiment, the two codebooks may be implemented as a single unified codebook.

It should be appreciated that the order of the steps illustrated (in this method and others described herein) are merely exemplary and do not limit in any way the order of operations that may be performed in various embodiments of the disclosed system and methods. For example, the tomosynthesis data may be compressed by encoder simultaneously as the creation of the transformation matrices.

Detailed Description of Exemplary Aspects

Since the library consists of re-usable building sourceblocks, and the actual data is represented by reference codes to the library, the total storage space of a single set of data would be much smaller than conventional methods, wherein the data is stored in its entirety. The more data sets that are stored, the larger the library becomes, and the more data can be stored in reference code form.

As an analogy, imagine each data set as a collection of printed books that are only occasionally accessed. The amount of physical shelf space required to store many collections would be quite large and is analogous to conventional methods of storing every single bit of data in every data set. Consider, however, storing all common elements within and across books in a single library, and storing the books as references codes to those common elements in that library. As a single book is added to the library, it will contain many repetitions of words and phrases. Instead of storing the whole words and phrases, they are added to a library, and given a reference code, and stored as reference codes. At this scale, some space savings may be achieved, but the reference codes will be on the order of the same size as the words themselves. As more books are added to the library, larger phrases, quotations, and other words patterns will become common among the books. The larger the word patterns, the smaller the reference codes will be in relation to them as not all possible word patterns will be used. As entire collections of books are added to the library, sentences, paragraphs, pages, or even whole books will become repetitive. There may be many duplicates of books within a collection and across multiple collections, many references and quotations from one book to another, and much common phraseology within books on particular subjects. If each unique page of a book is stored only once in a common library and given a reference code, then a book of 1,000 pages or more could be stored on a few printed pages as a string of codes referencing the proper full-sized pages in the common library. The physical space taken up by the books would be dramatically reduced. The more collections that are added, the greater the likelihood that phrases, paragraphs, pages, or entire books will already be in the library, and the more information in each collection of books can be stored in reference form. Accessing entire collections of books is then limited not by physical shelf space, but by the ability to reprint and recycle the books as needed for use.

The projected increase in storage capacity using the method herein described is primarily dependent on two factors: 1) the ratio of the number of bits in a block to the number of bits in the reference code, and 2) the amount of repetition in data being stored by the system.

With respect to the first factor, the number of bits used in the reference codes to the sourceblocks must be smaller than the number of bits in the sourceblocks themselves in order for any additional data storage capacity to be obtained. As a simple example, 16-bit sourceblocks would require $2^{16}$, or 65536, unique reference codes to represent all possible patterns of bits. If all possible 65536 blocks patterns are utilized, then the reference code itself would also need to contain sixteen bits in order to refer to all possible 65,536 blocks patterns. In such case, there would be no storage savings. However, if only 16 of those block patterns are utilized, the reference code can be reduced to 4 bits in size, representing an effective compression of 4 times (16 bits/4 bits=4) versus conventional storage. Using a typical block size of 512 bytes, or 4,096 bits, the number of possible block patterns is $2^{4,096}$, which for all practical purposes is unlimited. A typical hard drive contains one terabyte (TB) of physical storage capacity, which represents 1,953,125,000, or roughly $2^{31}$, 512 byte blocks. Assuming that 1 TB of unique 512-byte sourceblocks were contained in the library, and that the reference code would thus need to be 31 bits long, the effective compression ratio for stored data would be on the order of 132 times (4,096/31≈132) that of conventional storage.

With respect to the second factor, in most cases it could be assumed that there would be sufficient repetition within a data set such that, when the data set is broken down into sourceblocks, its size within the library would be smaller than the original data. However, it is conceivable that the initial copy of a data set could require somewhat more storage space than the data stored in a conventional manner, if all or nearly all sourceblocks in that set were unique. For example, assuming that the reference codes are $\frac{1}{10}^{th}$ the size of a full-sized copy, the first copy stored as sourceblocks in the library would need to be 1.1 megabytes (MB), (1 MB for the complete set of full-sized sourceblocks in the library and 0.1 MB for the reference codes). However, since the sourceblocks stored in the library are universal, the more duplicate copies of something you save, the greater efficiency versus conventional storage methods. Conventionally, storing 10 copies of the same data requires 10 times the storage space of a single copy. For example, ten copies of a 1 MB file would take up 10 MB of storage space. However, using the method described herein, only a single full-sized copy is stored, and subsequent copies are stored as reference codes. Each additional copy takes up only a fraction of the space of the full-sized copy. For example, again assuming that the reference codes are $\frac{1}{10}^{th}$ the size of the full-size copy, ten copies of a 1 MB file would take up only 2 MB of space (1 MB for the full-sized copy, and 0.1 MB each for ten sets of reference codes). The larger the library, the more likely that part or all of incoming data will duplicate sourceblocks already existing in the library.

The size of the library could be reduced in a manner similar to storage of data. Where sourceblocks differ from each other only by a certain number of bits, instead of storing a new sourceblock that is very similar to one already existing in the library, the new sourceblock could be represented as a reference code to the existing sourceblock, plus information about which bits in the new block differ from the existing block. For example, in the case where 512 byte sourceblocks are being used, if the system receives a new sourceblock that differs by only one bit from a sourceblock already existing in the library, instead of storing a new 512 byte sourceblock, the new sourceblock could be stored as a reference code to the existing sourceblock, plus a reference to the bit that differs. Storing the new sourceblock as a reference code plus changes would require only a few bytes of physical storage space versus the 512 bytes that a full sourceblock would require. The algorithm could be optimized to store new sourceblocks in this reference code plus changes form unless the changes portion is large enough that it is more efficient to store a new, full sourceblock.

It will be understood by one skilled in the art that transfer and synchronization of data would be increased to the same extent as for storage. By transferring or synchronizing reference codes instead of full-sized data, the bandwidth requirements for both types of operations are dramatically reduced.

In addition, the method described herein is inherently a form of encryption. When the data is converted from its full form to reference codes, none of the original data is contained in the reference codes. Without access to the library of sourceblocks, it would be impossible to re-construct any portion of the data from the reference codes. This inherent property of the method described herein could obviate the need for traditional encryption algorithms, thereby offsetting most or all of the computational cost of conversion of data back and forth to reference codes. In theory, the method described herein should not utilize any additional computing power beyond traditional storage using encryption algorithms. Alternatively, the method described herein could be in addition to other encryption algorithms to increase data security even further.

In other embodiments, additional security features could be added, such as: creating a proprietary library of sourceblocks for proprietary networks, physical separation of the reference codes from the library of sourceblocks, storage of the library of sourceblocks on a removable device to enable easy physical separation of the library and reference codes from any network, and incorporation of proprietary sequences of how sourceblocks are read and the data reassembled.

Figure 7:
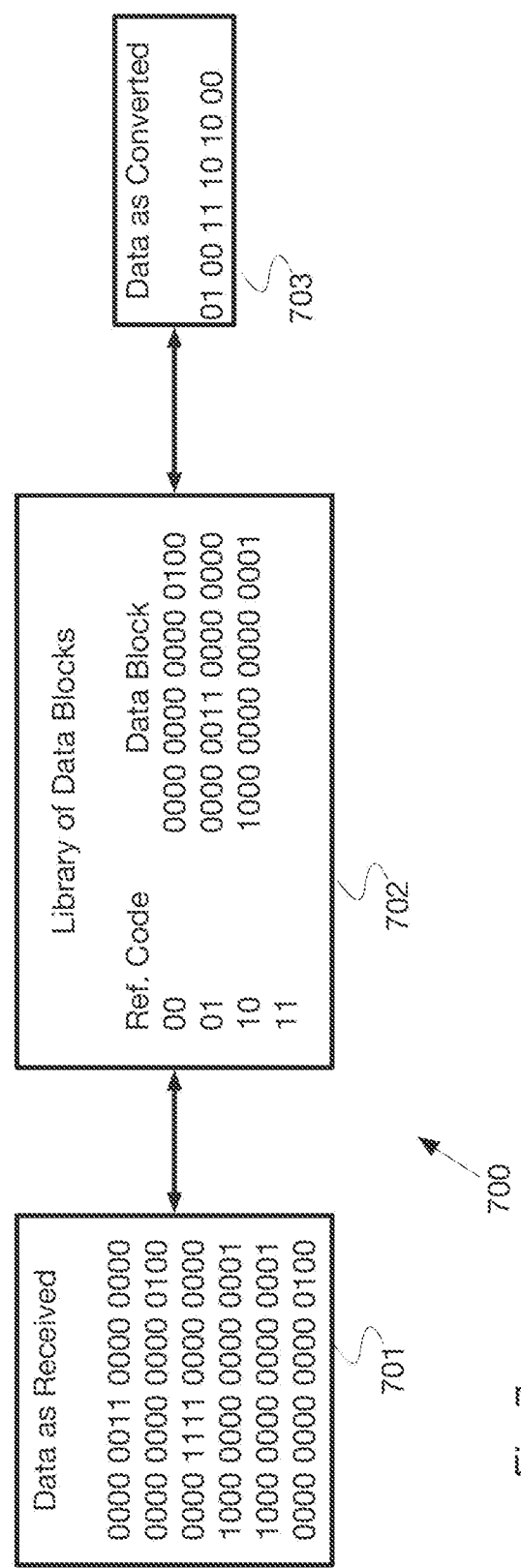
FIG. 7 is a diagram showing an example of how data might be converted into reference codes using an aspect of an embodiment.

FIG. 7 is a diagram showing an example of how data might be converted into reference codes using an aspect of an embodiment 700. As data is received 701, it is read by the processor in sourceblocks of a size dynamically determined by the previously disclosed sourceblock size optimizer 410. In this example, each sourceblock is 16 bits in length, and the library 702 initially contains three sourceblocks with reference codes 00, 01, and 10. The entry for reference code 11 is initially empty. As each 16 bit sourceblock is received, it is compared with the library. If that sourceblock is already contained in the library, it is assigned the corresponding reference code. So, for example, as the first line of data (0000 0011 0000 0000) is received, it is assigned the reference code (01) associated with that sourceblock in the library. If that sourceblock is not already contained in the library, as is the case with the third line of data (0000 1111 0000 0000) received in the example, that sourceblock is added to the library and assigned a reference code, in this case 11. The data is thus converted 703 to a series of reference codes to sourceblocks in the library. The data is stored as a collection of codewords, each of which contains the reference code to a sourceblock and information about the location of the sourceblocks in the data set. Reconstructing the data is performed by reversing the process. Each stored reference code in a data collection is compared with the reference codes in the library, the corresponding sourceblock is read from the library, and the data is reconstructed into its original form.

Figure 8:
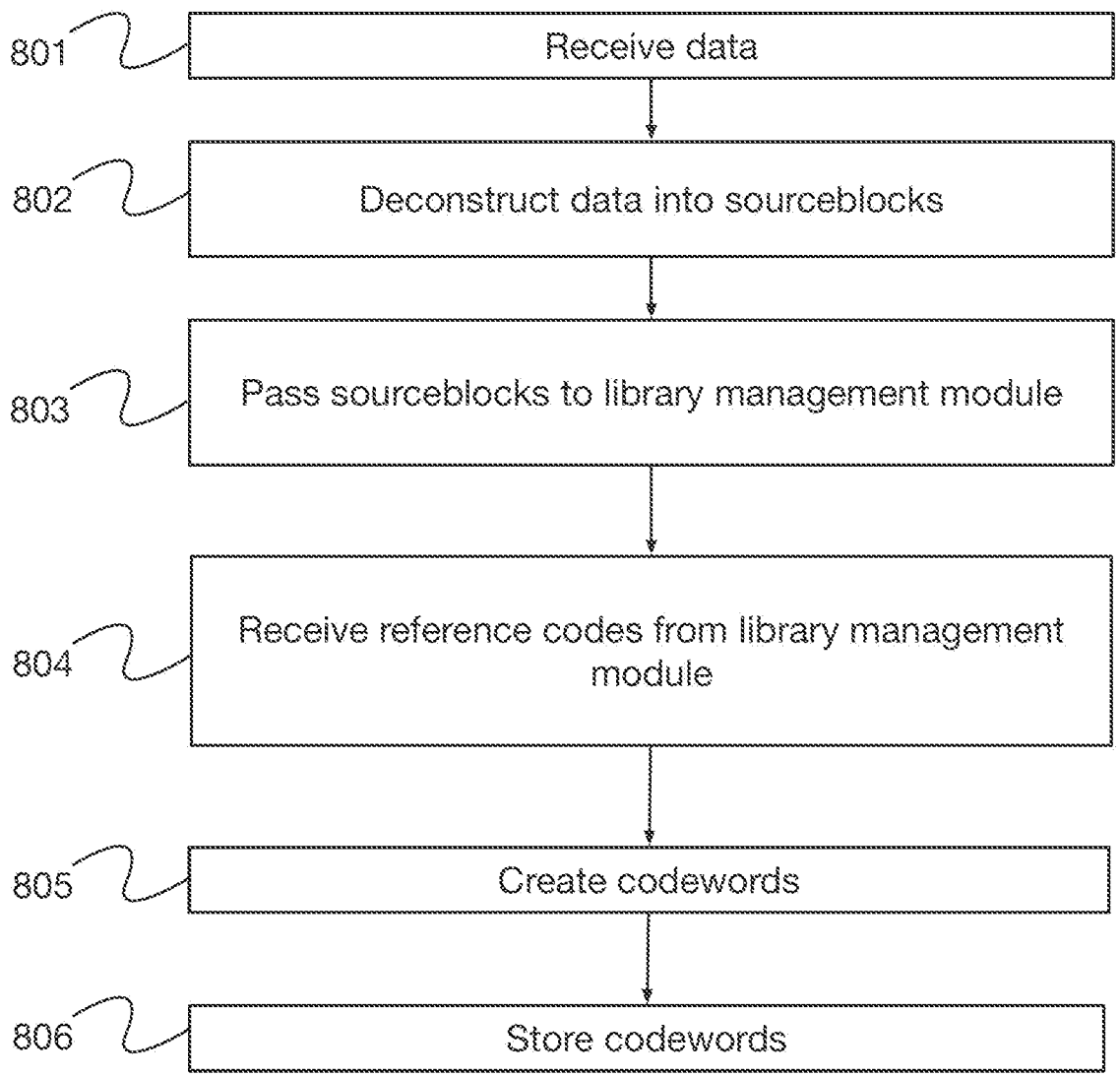
FIG. 8 is a method diagram showing the steps involved in using an embodiment to store data.

FIG. 8 is a method diagram showing the steps involved in using an embodiment 800 to store data. As data is received 801, it would be deconstructed into sourceblocks 802, and passed 803 to the library management module for processing. Reference codes would be received back 804 from the library management module and could be combined with location information to create codewords 805, which would then be stored 806 as representations of the original data.

Figure 9:
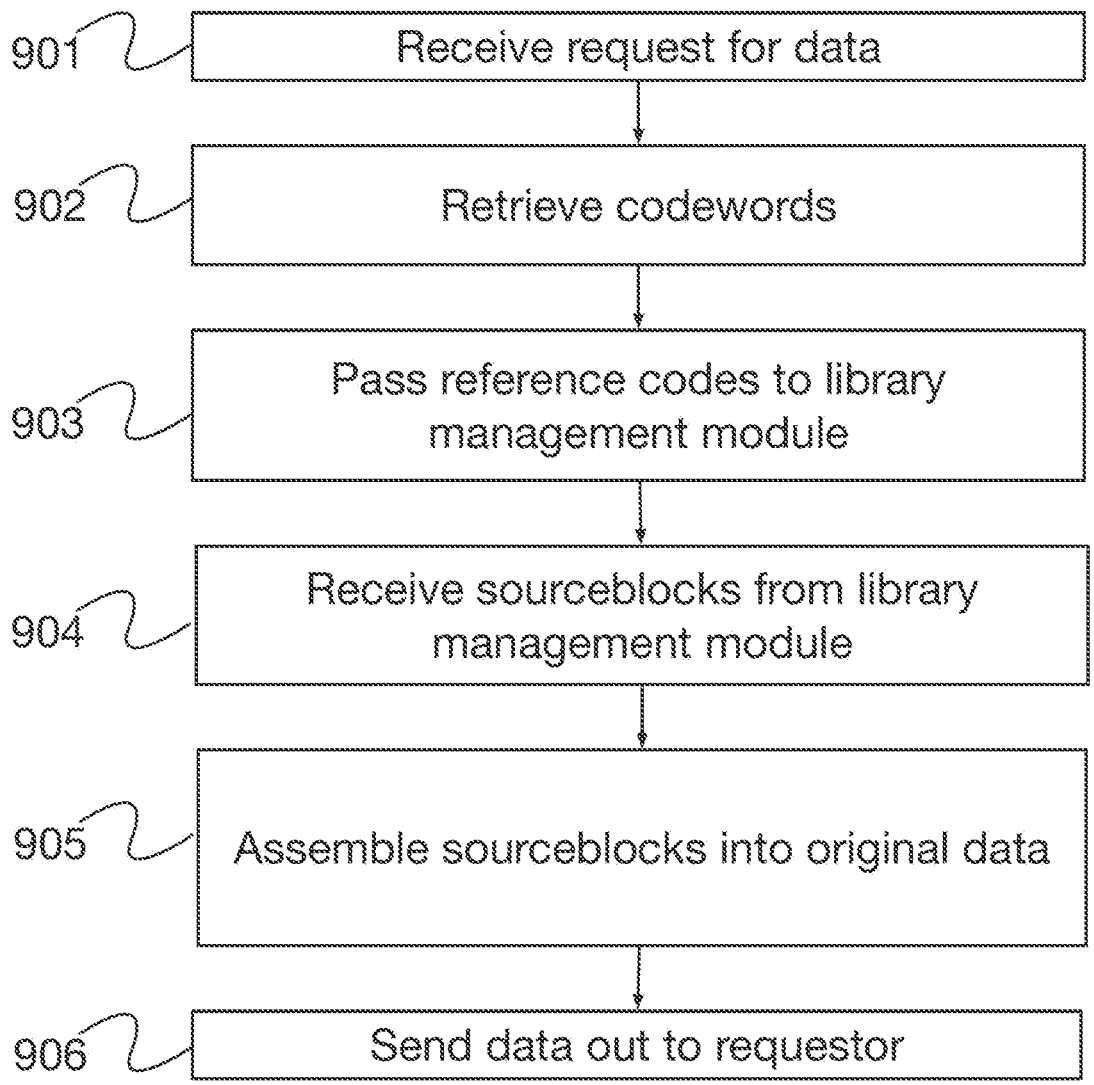
FIG. 9 is a method diagram showing the steps involved in using an embodiment to retrieve data.

FIG. 9 is a method diagram showing the steps involved in using an embodiment 900 to retrieve data. When a request for data is received 901, the associated codewords would be retrieved 902 from the library. The codewords would be passed 903 to the library management module, and the associated sourceblocks would be received back 904. Upon receipt, the sourceblocks would be assembled 905 into the original data using the location data contained in the codewords, and the reconstructed data would be sent out 906 to the requestor.

Figure 10:
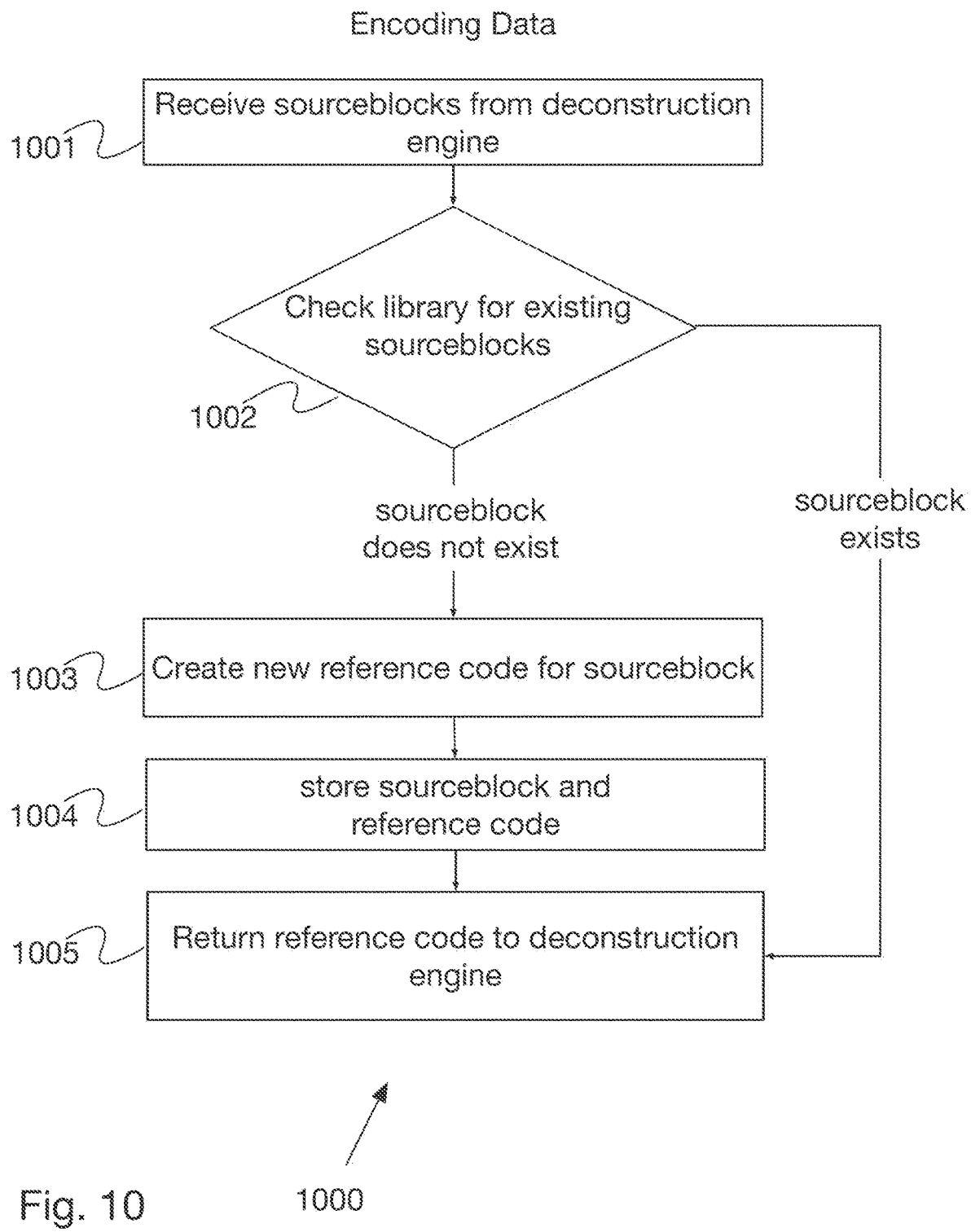
FIG. 10 is a method diagram showing the steps involved in using an embodiment to encode data.

FIG. 10 is a method diagram showing the steps involved in using an embodiment 1000 to encode data. As sourceblocks are received 1001 from the deconstruction engine, they would be compared 1002 with the sourceblocks already contained in the library. If that sourceblock already exists in the library, the associated reference code would be returned 1005 to the deconstruction engine. If the sourceblock does not already exist in the library, a new reference code would be created 1003 for the sourceblock. The new reference code and its associated sourceblock would be stored 1004 in the library, and the reference code would be returned to the deconstruction engine.

Figure 11:
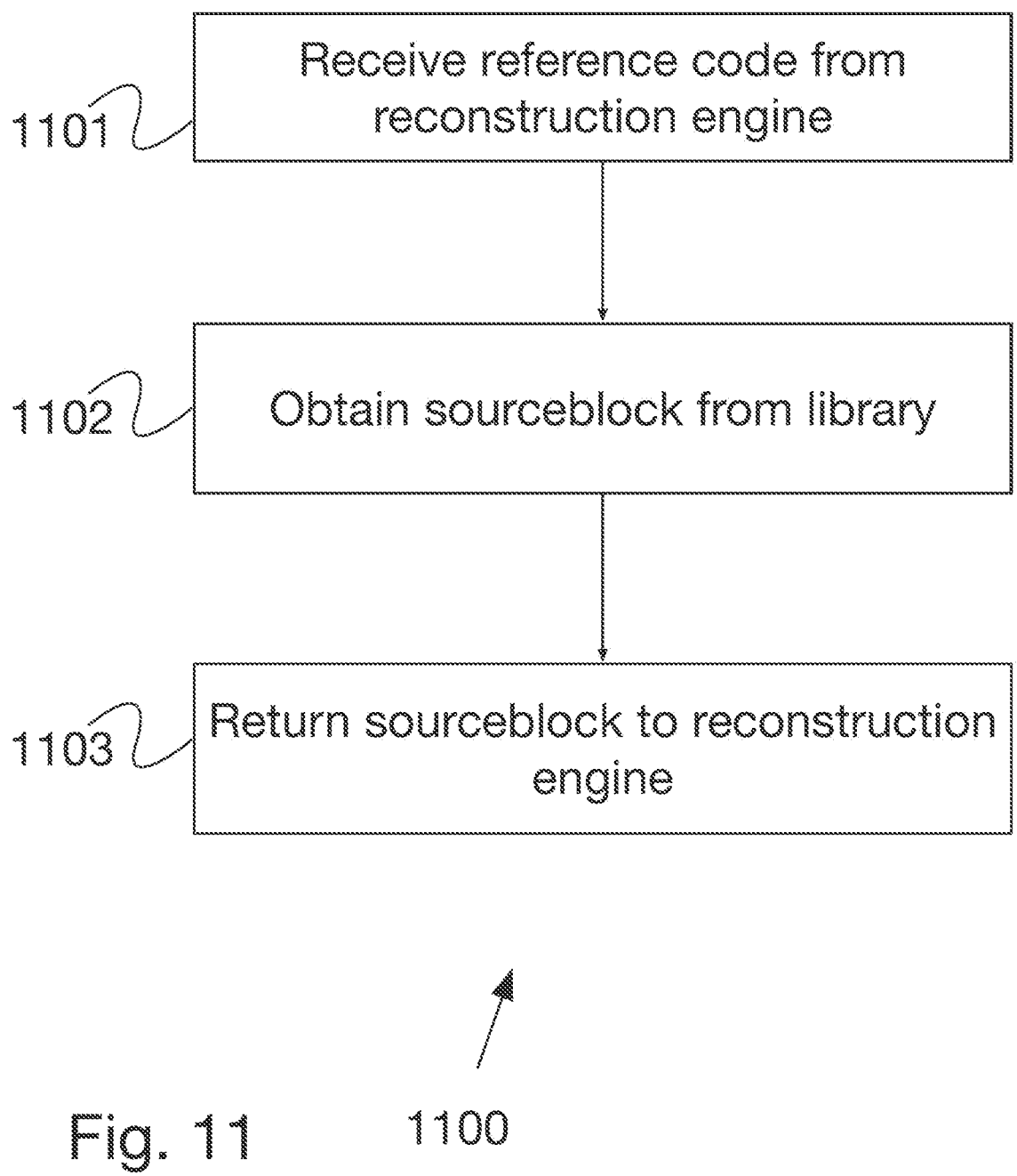
FIG. 11 is a method diagram showing the steps involved in using an embodiment to decode data.

FIG. 11 is a method diagram showing the steps involved in using an embodiment 1100 to decode data. As reference codes are received 1101 from the reconstruction engine, the associated sourceblocks are retrieved 1102 from the library, and returned 1103 to the reconstruction engine.

Figure 16:
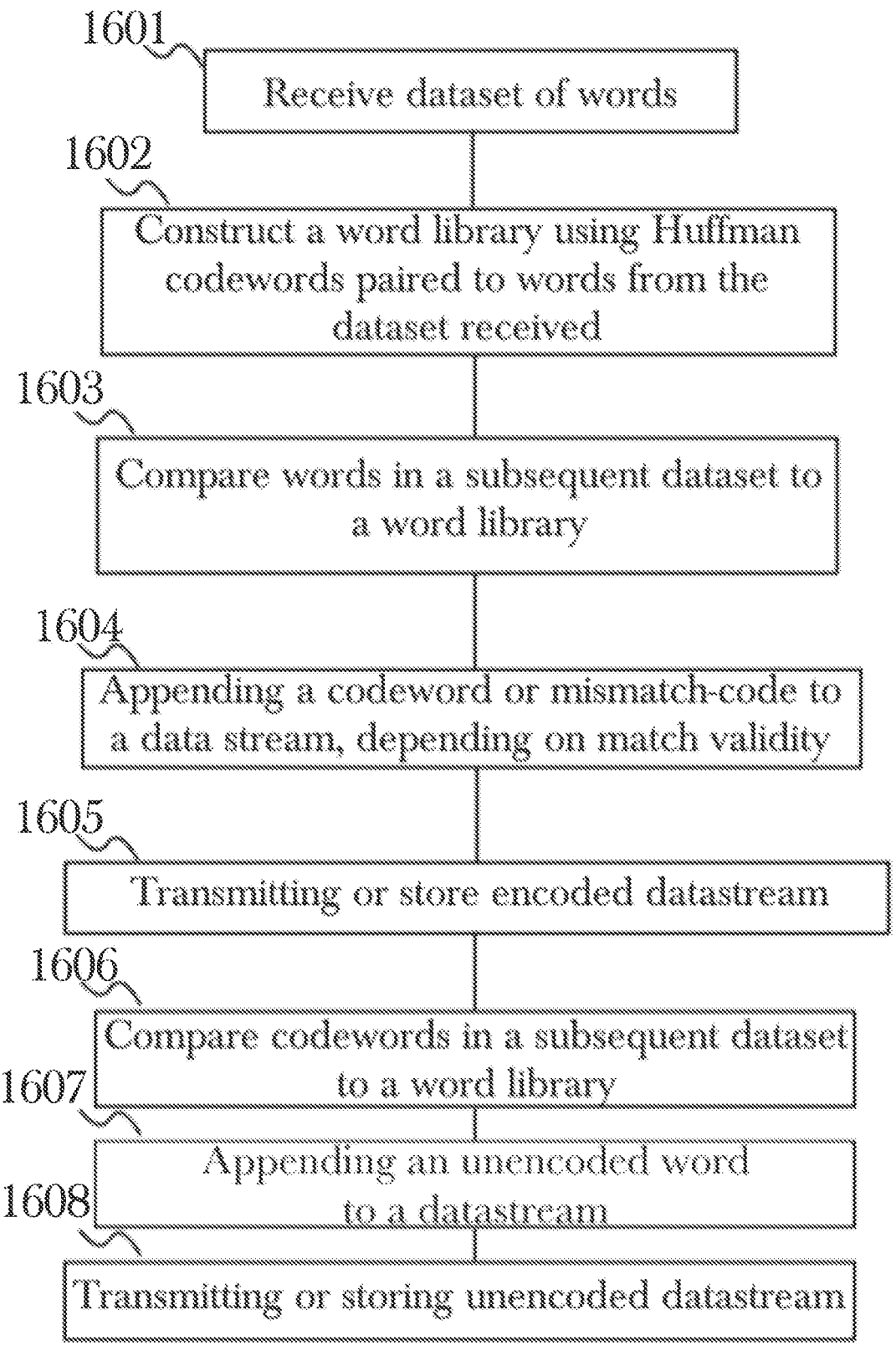
FIG. 16 is a method diagram illustrating key system functionality utilizing an encoder and decoder pair.

FIG. 16 is a method diagram illustrating key system functionality utilizing an encoder and decoder pair, according to a preferred embodiment. In a first step 1601, at least one incoming data set may be received at a customized library generator 1300 that then 1602 processes data to produce a customized word library 1201 comprising key-value pairs of data words (each comprising a string of bits) and their corresponding calculated binary Huffman codewords. A subsequent dataset may be received and compared to the word library 1603 to determine the proper codewords to use in order to encode the dataset. Words in the dataset are checked against the word library and appropriate encodings are appended to a data stream 1604. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 1605 to a destination as desired. For the purposes of decoding, an already-encoded data stream may be received and compared 1606, and un-encoded words may be appended to a new data stream 1607 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream, the inverse of the process of encoding described earlier. Such a data stream may then be stored or transmitted 1608 as desired.

Figure 17:
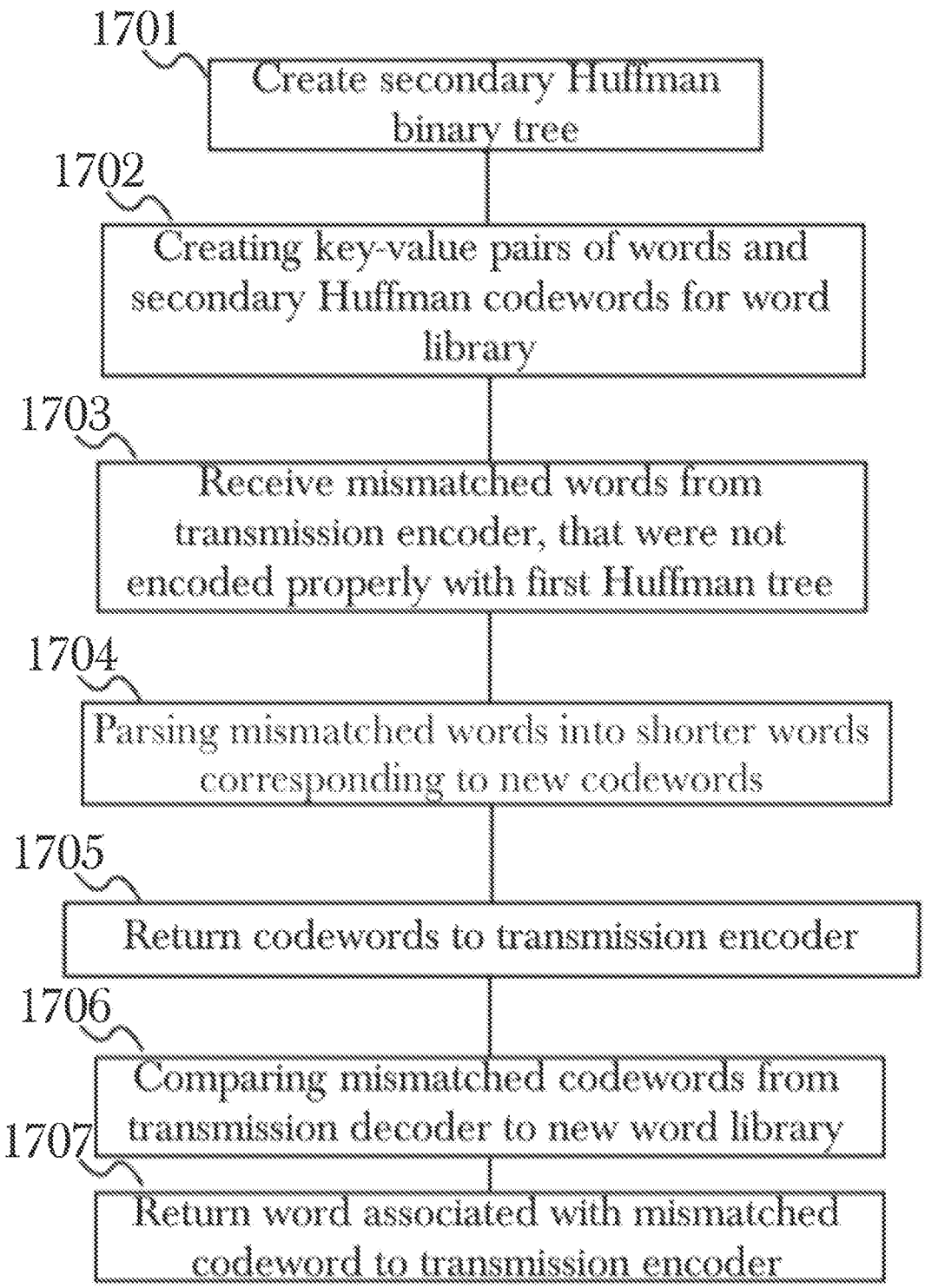
FIG. 17 is a method diagram illustrating possible use of a hybrid encoder/decoder to improve the compression ratio.

FIG. 17 is a method diagram illustrating possible use of a hybrid encoder/decoder to improve the compression ratio, according to a preferred aspect. A second Huffman binary tree may be created 1701, having a shorter maximum length of codewords than a first Huffman binary tree 1602, allowing a word library to be filled with every combination of codeword possible in this shorter Huffman binary tree 1702. A word library may be filled with these Huffman codewords and words from a dataset 1702, such that a hybrid encoder/decoder 1304, 1503 may receive any mismatched words from a dataset for which encoding has been attempted with a first Huffman binary tree 1703, 1604 and parse previously mismatched words into new partial codewords (that is, codewords that are each a substring of an original mismatched codeword) using the second Huffman binary tree 1704. In this way, an incomplete word library may be supplemented by a second word library. New codewords attained in this way may then be returned to a transmission encoder 1705, 1500. In the event that an encoded dataset is received for decoding, and there is a mismatch code indicating that additional coding is needed, a mismatch code may be removed and the unencoded word used to generate a new codeword as before 1706, so that a transmission encoder 1500 may have the word and newly generated codeword added to its word library 1707, to prevent further mismatching and errors in encoding and decoding.

It will be recognized by a person skilled in the art that the methods described herein can be applied to data in any form. For example, the method described herein could be used to store genetic data, which has four data units: C, G, A, and T. Those four data units can be represented as 2 bit sequences: 00, 01, 10, and 11, which can be processed and stored using the method described herein.

It will be recognized by a person skilled in the art that certain embodiments of the methods described herein may have uses other than data storage. For example, because the data is stored in reference code form, it cannot be reconstructed without the availability of the library of source-blocks. This is effectively a form of encryption, which could be used for cyber security purposes. As another example, an embodiment of the method described herein could be used to store backup copies of data, provide for redundancy in the event of server failure, or provide additional security against cyberattacks by distributing multiple partial copies of the library among computers are various locations, ensuring that at least two copies of each sourceblock exist in different locations within the network.

Figure 18:
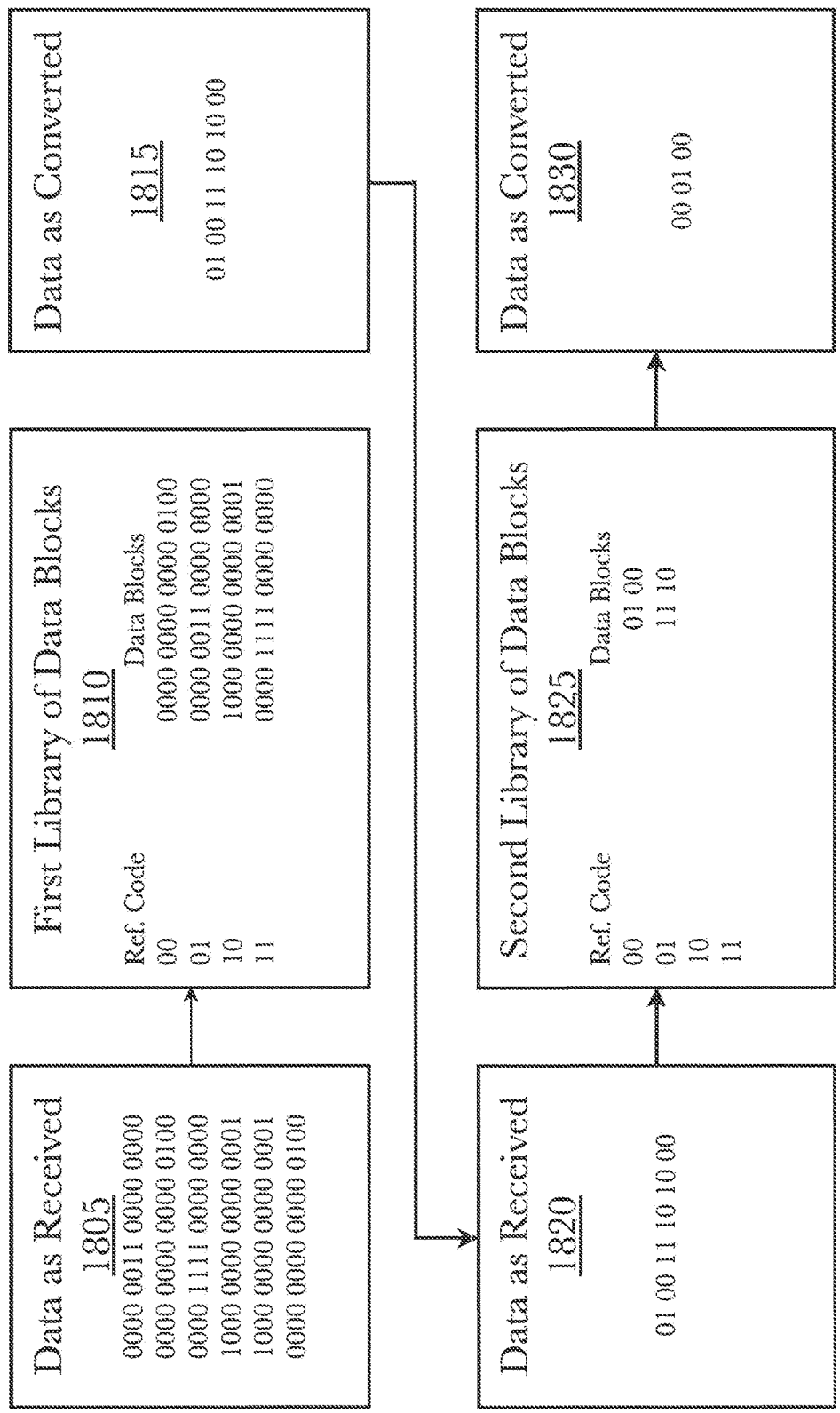
FIG. 18 is a flow diagram illustrating the use of a data encoding system used to recursively encode data to further reduce data size.

FIG. 18 is a flow diagram illustrating the use of a data encoding system used to recursively encode data to further reduce data size. Data may be input 1805 into a data deconstruction engine 102 to be deconstructed into code references, using a library of code references based on the input 1810. Such example data is shown in a converted, encoded format 1815, highly compressed, reducing the example data from 96 bits of data, to 12 bits of data, before sending this newly encoded data through the process again 1820, to be encoded by a second library 1825, reducing it even further. The newly converted data 1830 is shown as only 6 bits in this example, thus a size of 6.25% of the original data packet. With recursive encoding, then, it is possible and implemented in the system to achieve increasing compression ratios, using multi-layered encoding, through recursively encoding data. Both initial encoding libraries 1810 and subsequent libraries 1825 may be achieved through machine learning techniques to find optimal encoding patterns to reduce size, with the libraries being distributed to recipients prior to transfer of the actual encoded data, such that only the compressed data 1830 must be transferred or stored, allowing for smaller data footprints and bandwidth requirements. This process can be reversed to reconstruct the data. While this example shows only two levels of encoding, recursive encoding may be repeated any number of times. The number of levels of recursive encoding will depend on many factors, a non-exhaustive list of which includes the type of data being encoded, the size of the original data, the intended usage of the data, the number of instances of data being stored, and available storage space for codebooks and libraries. Additionally, recursive encoding can be applied not only to data to be stored or transmitted, but also to the codebooks and/or libraries, themselves. For example, many installations of different libraries could take up a substantial amount of storage space. Recursively encoding those different libraries to a single, universal library would dramatically reduce the amount of storage space required, and each different library could be reconstructed as necessary to reconstruct incoming streams of data.

Figure 20:
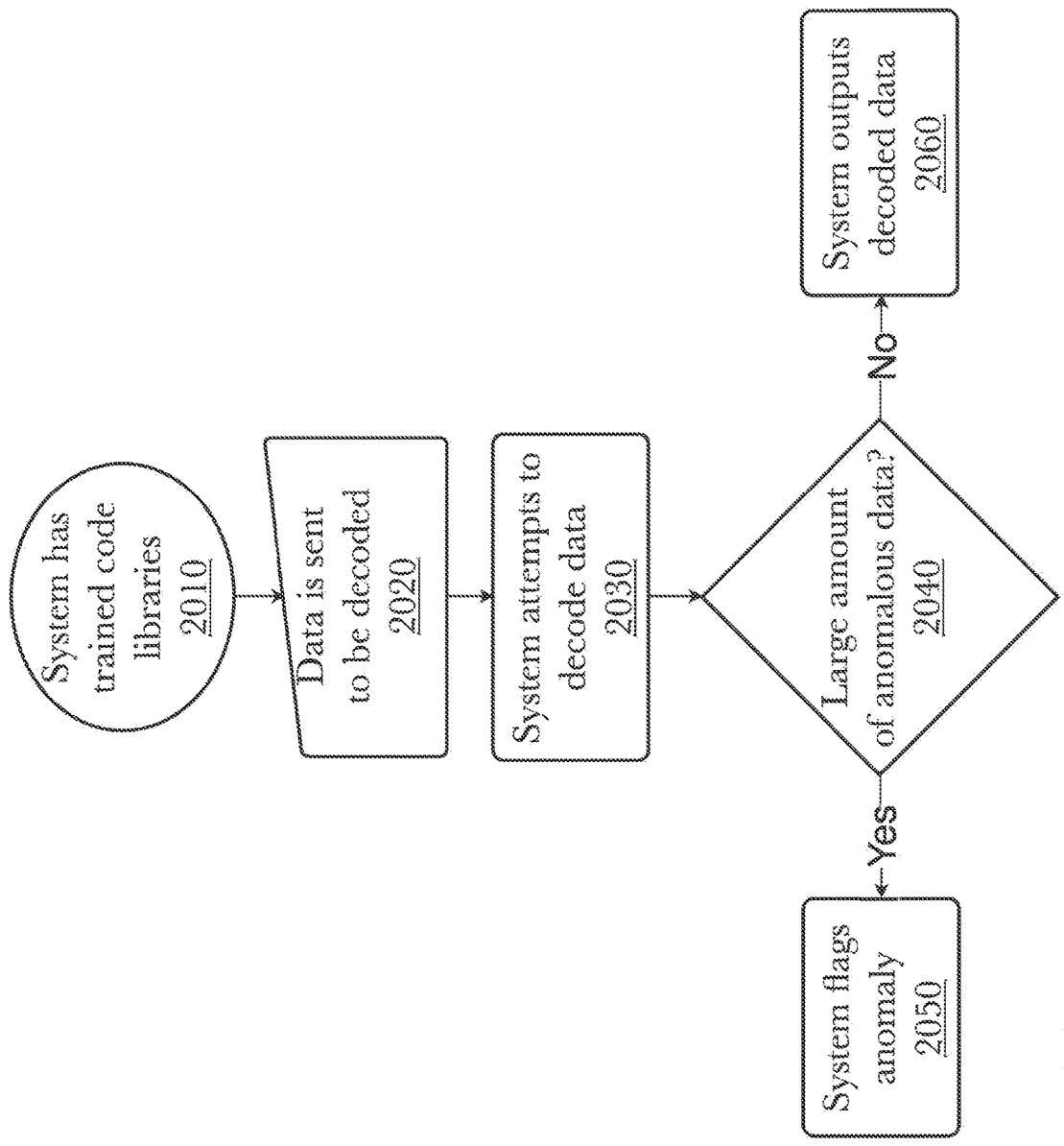
FIG. 20 is a flow diagram of an exemplary method used to detect anomalies in received encoded data and producing a warning.

FIG. 20 is a flow diagram of an exemplary method used to detect anomalies in received encoded data and producing a warning. A system may have trained encoding libraries 2010, before data is received from some source such as a network connected device or a locally connected device including USB connected devices, to be decoded 2020. Decoding in this context refers to the process of using the encoding libraries to take the received data and attempt to use encoded references to decode the data into its original source 2030, potentially more than once if recursive encoding was used, but not necessarily more than once. An anomaly detector 1910 may be configured to detect a large amount of un-encoded data 2040 in the midst of encoded data, by locating data or references that do not appear in the encoding libraries, indicating at least an anomaly, and potentially data tampering or faulty encoding libraries. A flag or warning is set by the system 2050, allowing a user to be warned at least of the presence of the anomaly and the characteristics of the anomaly. However, if a large amount of invalid references or unencoded data are not present in the encoded data that is attempting to be decoded, the data may be decoded and output as normal 2060, indicating no anomaly has been detected.

Figure 21:
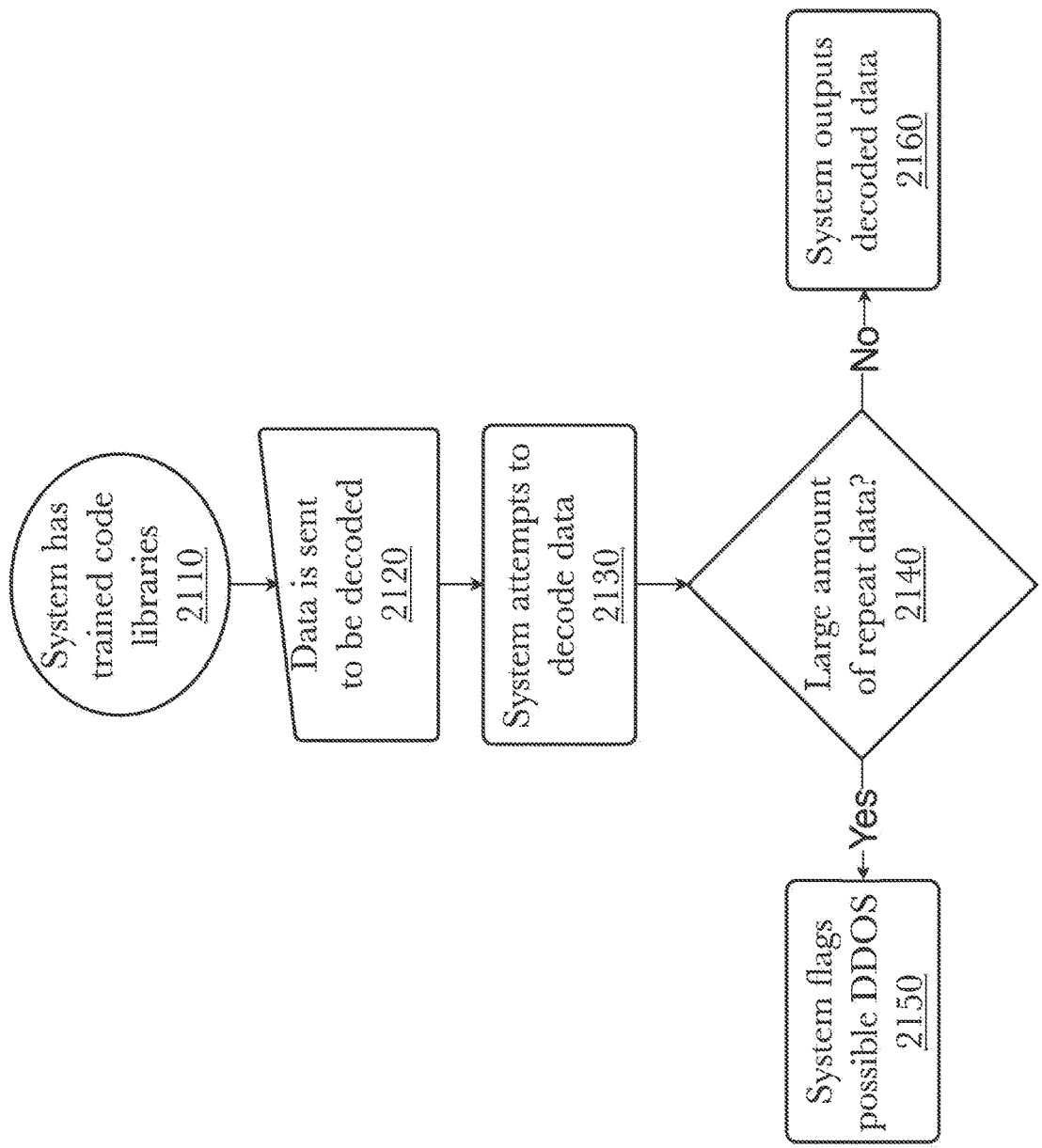
FIG. 21 is a flow diagram of a data encoding system used for distributed denial of service (DDOS) attack denial.

FIG. 21 is a flow diagram of a method used for Distributed Denial of Service (DDOS) attack denial. A system may have trained encoding libraries 2110, before data is received from some source such as a network connected device or a locally connected device including USB connected devices, to be decoded 2120. Decoding in this context refers to the process of using the encoding libraries to take the received data and attempt to use encoded references to decode the data into its original source 2130, potentially more than once if recursive encoding was used, but not necessarily more than once. A DDOS detector 1920 may be configured to detect a large amount of repeating data 2140 in the encoded data, by locating data or references that repeat many times over (the number of which can be configured by a user or administrator as need be), indicating a possible DDOS attack. A flag or warning is set by the system 2150, allowing a user to be warned at least of the presence of a possible DDOS attack, including characteristics about the data and source that initiated the flag, allowing a user to then block incoming data from that source. However, if a large amount of repeat data in a short span of time is not detected, the data may be decoded and output as normal 2160, indicating no DDOS attack has been detected.

Figure 23:
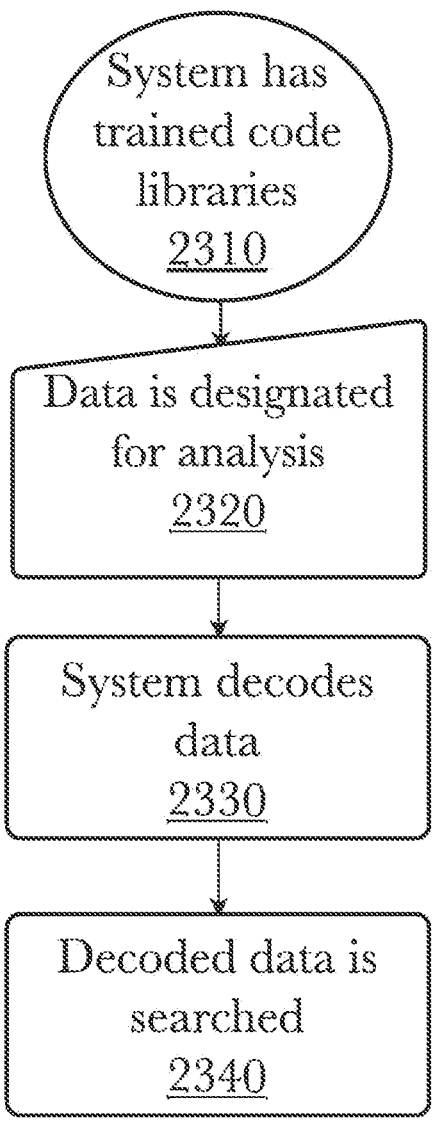
FIG. 23 is a flow diagram of an exemplary method used to enable high-speed data mining of repetitive data.

FIG. 23 is a flow diagram of an exemplary method used to enable high-speed data mining of repetitive data. A system may have trained encoding libraries 2310, before data is received from some source such as a network connected device or a locally connected device including USB connected devices, to be analyzed 2320 and decoded 2330. When determining data for analysis, users may select specific data to designate for decoding 2330, before running any data mining or analytics functions or software on the decoded data 2340. Rather than having traditional decryption and decompression operate over distributed drives, data can be regenerated immediately using the encoding libraries disclosed herein, as it is being searched. Using methods described in FIG. 9 and FIG. 11, data can be stored, retrieved, and decoded swiftly for searching, even across multiple devices, because the encoding library may be on each device. For example, if a group of servers host codewords relevant for data mining purposes, a single computer can request these codewords, and the codewords can be sent to the recipient swiftly over the bandwidth of their connection, allowing the recipient to locally decode the data for immediate evaluation and searching, rather than running slow, traditional decompression algorithms on data stored across multiple devices or transfer larger sums of data across limited bandwidth.

Figure 25:
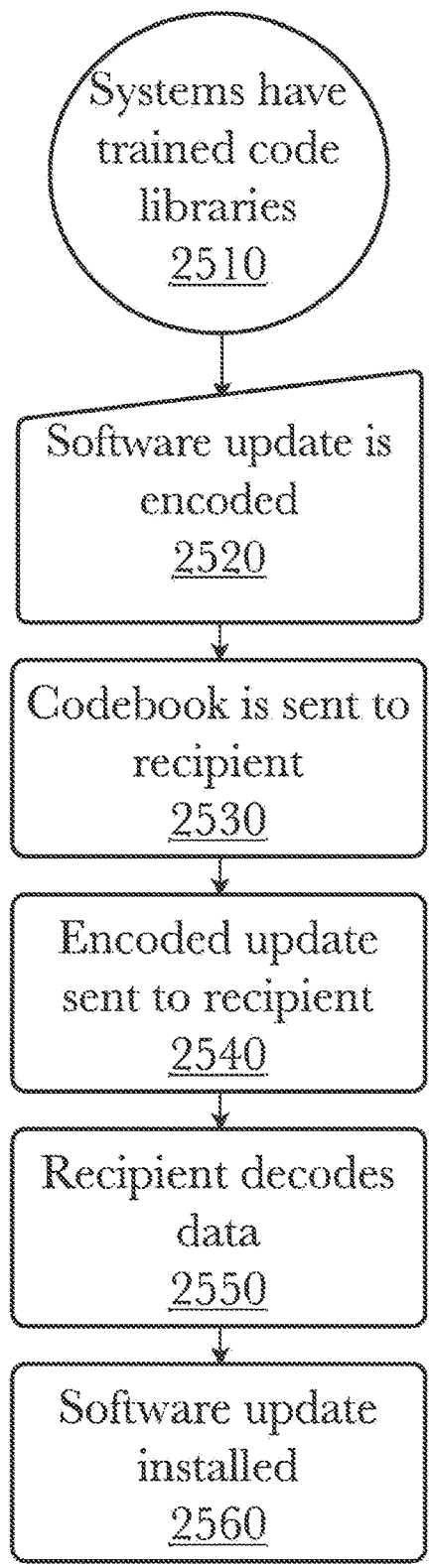
FIG. 25 is a flow diagram of an exemplary method used to encode and transfer software and firmware updates to a device for installation, for the purposes of reduced bandwidth consumption.

FIG. 25 is a flow diagram of an exemplary method used to encode and transfer software and firmware updates to a device for installation, for the purposes of reduced bandwidth consumption. A first system may have trained code libraries or "codebooks" present 2510, allowing for a software update of some manner to be encoded 2520. Such a software update may be a firmware update, operating system update, security patch, application patch or upgrade, or any other type of software update, patch, modification, or upgrade, affecting any computer system. A codebook for the patch must be distributed to a recipient 2530, which may be done beforehand and either over a network or through a local or physical connection, but must be accomplished at some point in the process before the update may be installed on the recipient device 2560. An update may then be distributed to a recipient device 2540, allowing a recipient with a codebook distributed to them 2530 to decode the update 2550 before installation 2560. In this way, an encoded and thus heavily compressed update may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 27:
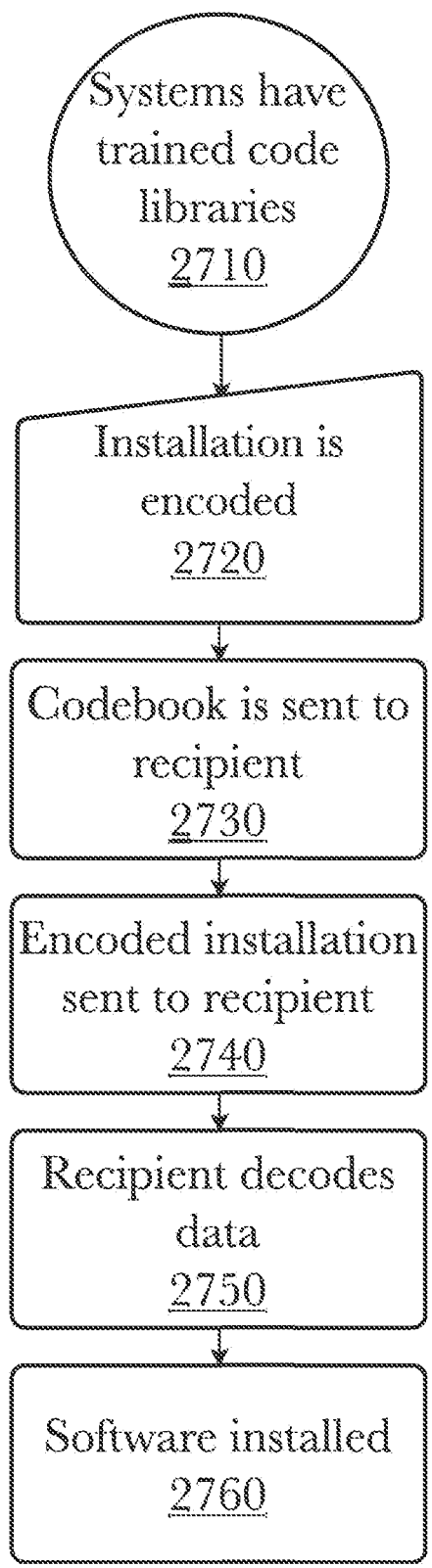
FIG. 27 is a flow diagram of an exemplary method used to encode new software and operating system installations for reduced bandwidth required for transference.

FIG. 27 is a flow diagram of an exemplary method used to encode new software and operating system installations for reduced bandwidth required for transference. A first system may have trained code libraries or "codebooks" present 2710, allowing for a software installation of some manner to be encoded 2720. Such a software installation may be a software update, operating system, security system, application, or any other type of software installation, execution, or acquisition, affecting a computer system. An encoding library or "codebook" for the installation must be distributed to a recipient 2730, which may be done beforehand and either over a network or through a local or physical connection but must be accomplished at some point in the process before the installation can begin on the recipient device 2760. An installation may then be distributed to a recipient device 2740, allowing a recipient with a codebook distributed to them 2730 to decode the installation 2750 before executing the installation 2760. In this way, an encoded and thus heavily compressed software installation may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 31:
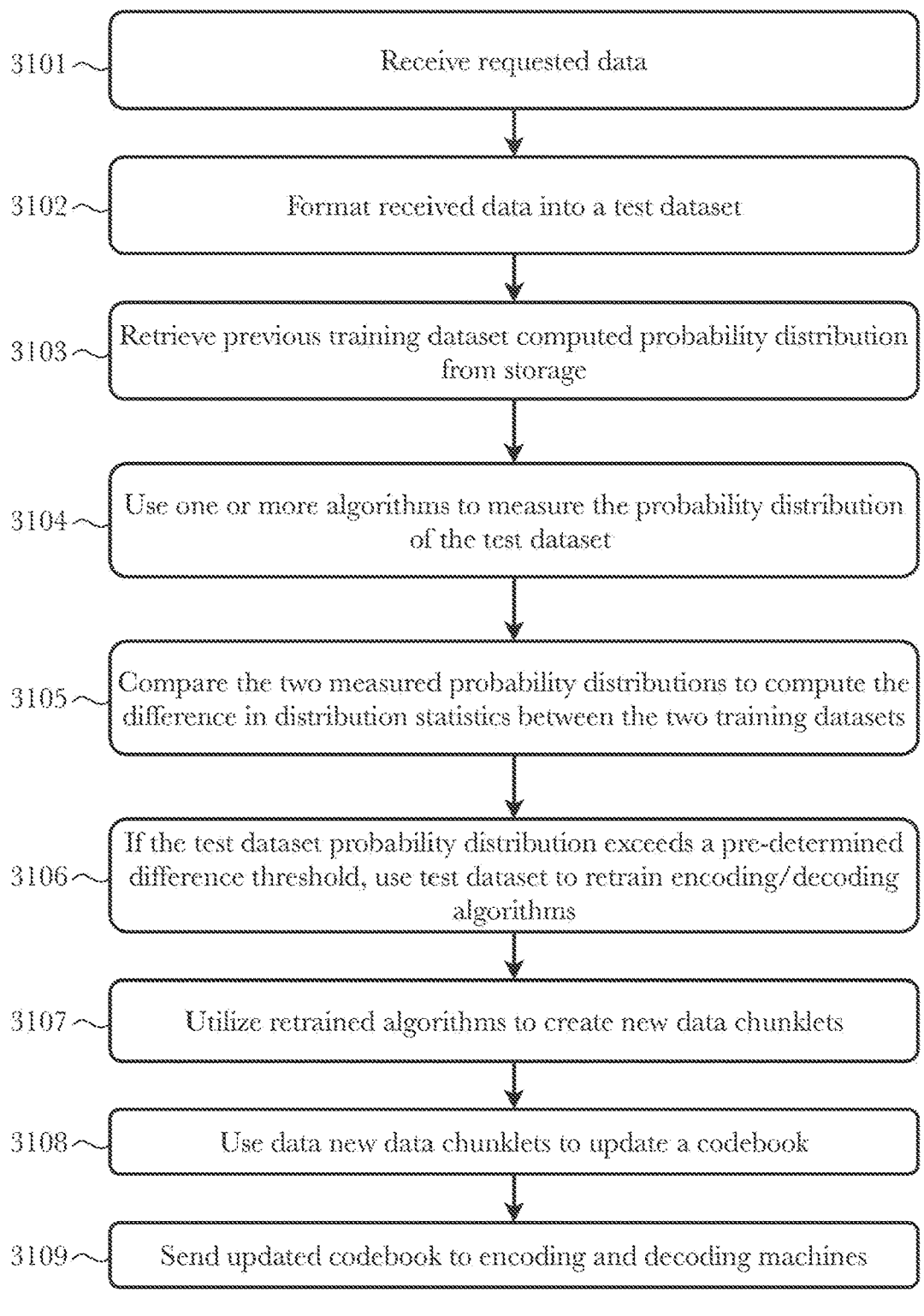
FIG. 31 is a method diagram illustrating the steps involved in using an embodiment of the codebook training system to update a codebook.

FIG. 31 is a method diagram illustrating the steps 3100 involved in using an embodiment of the codebook training system to update a codebook. The process begins when requested data is received 3101 by a codebook training module. The requested data may comprise a plurality of sourceblocks. Next, the received data may be stored in a cache and formatted into a test dataset 3102. The next step is to retrieve the previously computed probability distribution associated with the previous (most recent) training dataset from a storage device 3103. Using one or more algorithms, measure and record the probability distribution of the test dataset 3104. The step after that is to compare the measured probability distributions of the test dataset and the previous training dataset to compute the difference in distribution statistics between the two datasets 3105. If the test dataset probability distribution exceeds a pre-determined difference threshold, then the test dataset will be used to retrain the encoding/decoding algorithms 3106 to reflect the new distribution of the incoming data to the encoder/decoder system. The retrained algorithms may then be used to create new data sourceblocks 3107 that better capture the nature of the data being received. These newly created data sourceblocks may then be used to create new codewords and update a codebook 3108 with each new data sourceblock and its associated new codeword. Last, the updated codebooks may be sent to encoding and decoding machines 3109 in order to ensure the encoding/decoding system function properly.

Figure 37:
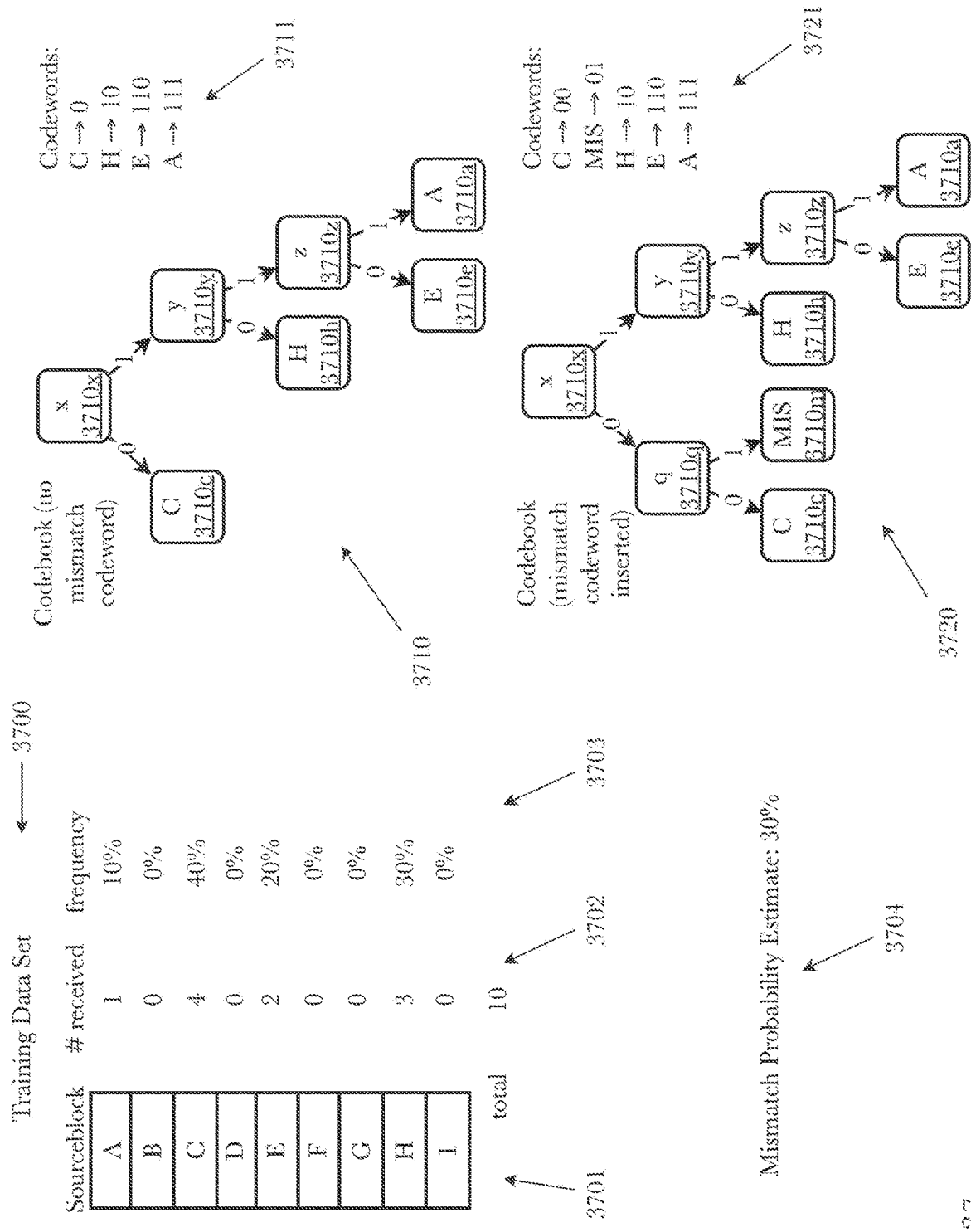
FIG. 37 is a diagram illustrating an exemplary method for codebook generation from a training data set.

FIG. 37 is a diagram illustrating an exemplary method for codebook generation from a training data set. In this simplified example, a training data set 3700 comprised of nine different potential types of sourceblocks 3701 is received. The number of sourceblocks actually received is 10, one of sourceblock A, four of sourceblock C, two of sourceblock E, and three of sourceblock H. This is a low-entropy data set in that the types of sourceblocks actually received are highly regular (lots of A, C, E, and H, and none of B, D, F, G, and I). None of the other types of sourceblocks are received. The frequency of occurrence of each sourceblock, therefore, is 10% A, 40% C, 20% E, and 30% H. Using these frequencies of occurrence, a codebook could be created with no mismatch codeword as shown in the codebook 3710 represented by a Huffman binary tree having three empty nodes, x 3710$x$, y 3710$y$, and z 3710$z$, leading to leaf nodes for sourceblocks C 3710$c$, H 3710$h$, E 3710$e$, and A 3710$a$, according to their frequencies of occurrence in training data set 3700. This codebook 3710 represents codewords for sourceblocks C, H, E, and A as follows: C→0, H→10, E→110, and A→111 by following the appropriate paths of the codebook 3710. However, this codebook does not account for the relatively high probability of occurrence of mismatches during encoding if sourceblocks B, D, F, G, and I appear in the data to be encoded. If this codebook 3710 is used, sourceblocks B, D, F, G, and I could not be encoded. If a Huffman binary tree was created to include sourceblocks B, D, F, G, and I, each of them would be assigned increasingly inefficient leaf nodes after the lowest probability leaf node in the tree, A 3710a. For example, if B was assigned after A 3701a, its codeword would be 1110, followed by D with a codeword of 11110, and so on.

To address this problem of inability to assign codewords or inefficiency in assigning codewords using a low-entropy training data set, a codebook 3720 can be created with a mismatch codeword MIS 3710m inserted representing the probability of mismatch during encoding. If the mismatch probability estimate 3704 is 30% (equivalent in probability to receiving sourceblock H), for example, the resulting codebook 3720 would include an additional empty node q 3710q leading to leaf node MIS 3710m, at a roughly equivalent level of probability (and corresponding short codeword) as sourceblock C 3710c and sourceblock H 3710h. This codebook 3720 represents codewords for sourceblocks C, MIS, H, E, and A as follows: C→00, MIS→01, H→10, E→110, and A→111 by following the appropriate paths of the codebook 3720. Unlike codebook 3710, however, codebook 3720 is capable of coding for any arbitrary mismatch sourceblock received, including but not limited to sourceblocks B, D, F, G, and I. During encoding, a codework result of 01 (MIS) triggers a secondary encoding method for the mismatched sourceblock. A variety of secondary encoding methods may be used including, but not limited to no encoding (i.e., using the sourceblock as received) or using a suboptimal but guaranteed-to-work entropy encoding method that uses a shorter block-length for encoding.

While this example uses a single mismatch codeword, in other embodiments, multiple mismatch codewords may be used, signaling, for example, different probabilities of mismatches for different types of sourceblocks. Further, while this example uses a single secondary encoding method, other embodiments may use a plurality of such secondary methods, or additional levels of encoding methods (tertiary, quaternary, etc.). Multiple mismatch codewords may be associated with the plurality of secondary methods and/or additional levels of encoding methods.

Decoding of data compressed using this method is the reverse of the encoding process. A stream of codewords are received. Any codewords from the codebook (the primary encoding) are looked up in the codebook to retrieve their associated sourceblocks. Any codewords from secondary encoding are looked up using the secondary encoding method to retrieve their associated sourceblocks.

Figure 38:
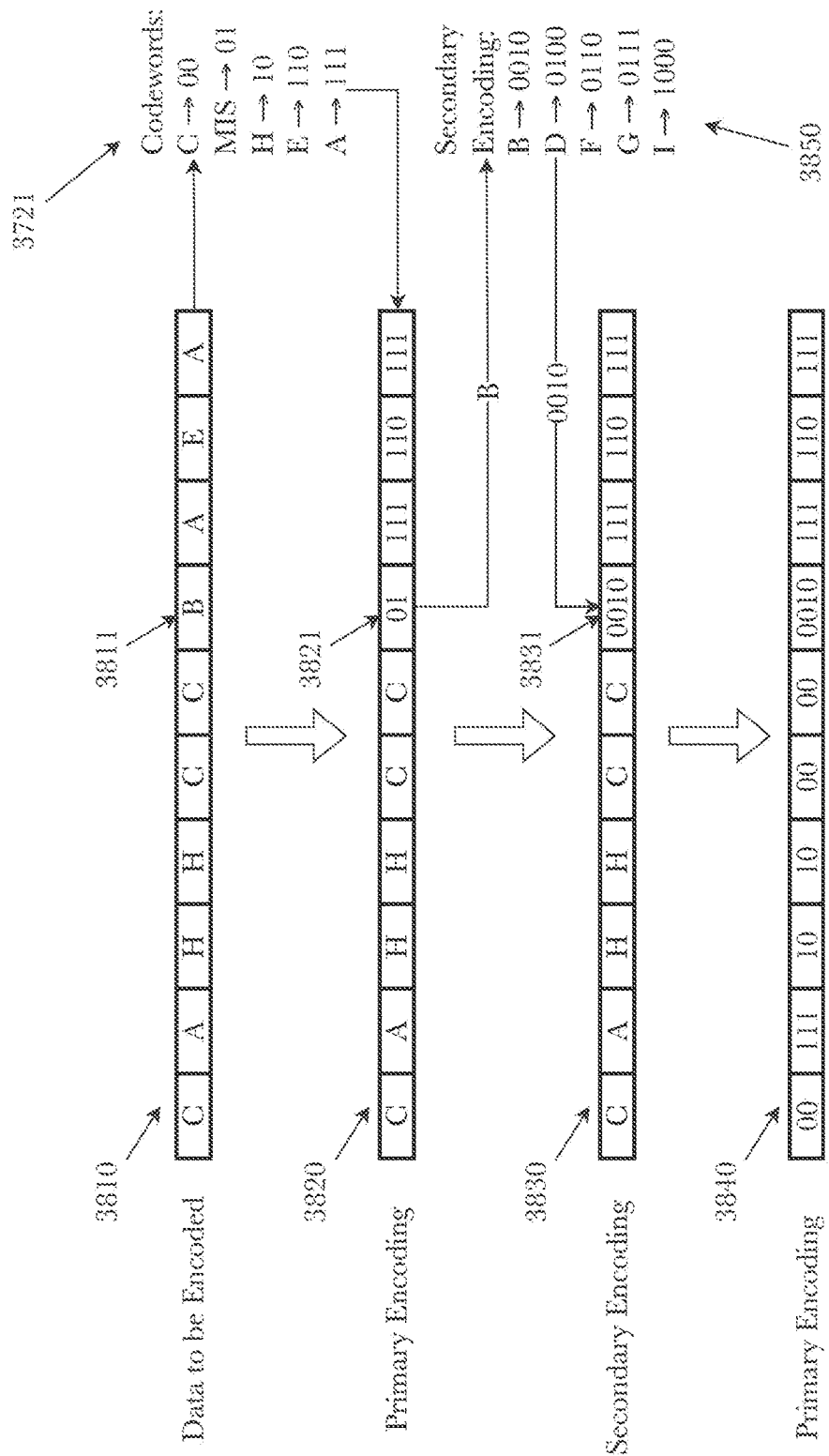
FIG. 38 is a diagram illustrating an exemplary encoding using a codebook and secondary encoding.

FIG. 38 is a diagram illustrating an exemplary encoding using a codebook and secondary encoding. In this example, the sourceblocks A-I 3701, codebook 3720, and codewords 3721 are the same as in FIG. 37. Codebook 3720 contains the same codewords 3721 The data to be encoded 3810 consists of a stream of sourceblocks in the order from first to last: AEABCCHHCC. The first three sourceblocks processed are AEA, and are encoded as 111, 110, and 111 using codebook 3720 as the primary encoding method as shown at 3820. However, the fourth sourceblock 3811 is B, which is not contained in codebook 3720. Thus, when B is processed, codebook 3720 returns the mismatch code 01 3821, which triggers a secondary encoding method 3820 for encoding sourceblock B. In this example, secondary encoding method 3850 is a suboptimal 4-bit encoding of sourceblocks A-I 3701, wherein the codewords for B, D, F, G, and I are as follows: B→0010, D→0100, F→0110, G→0111, and I→1000. The secondary encoding 3820 of B is 0010, which is inserted into the encoded data stream 3831. From there, encoding reverts to the primary encoding method using codebook 3720 as shown at 3840, and the remainder of the sourceblocks are encoded according to codebook 3720. Note that while the secondary encoding is shown as being performed while primary encoding is occurring, other embodiments may allow primary encoding to complete before performing secondary encoding, and may even allow the primary encoding with the mismatched codewords to be stored such that the secondary encoding is performed at a later time, although such embodiments would need some record of the association between the mismatch codeword and the sourceblock that it replaced (which could be done by several means including, but not limited to, reprocessing the data to be encoded, storing a separate record of the associations, and using multiple mismatch codewords).

Decoding of data compressed using this method is the reverse of the encoding process. A stream of codewords are received. Any codewords from the codebook (the primary encoding) are looked up in the codebook to retrieve their associated sourceblocks. Any codewords from secondary encoding are looked up using the secondary encoding method to retrieve their associated sourceblocks.

Hardware Architecture

Figure 43:
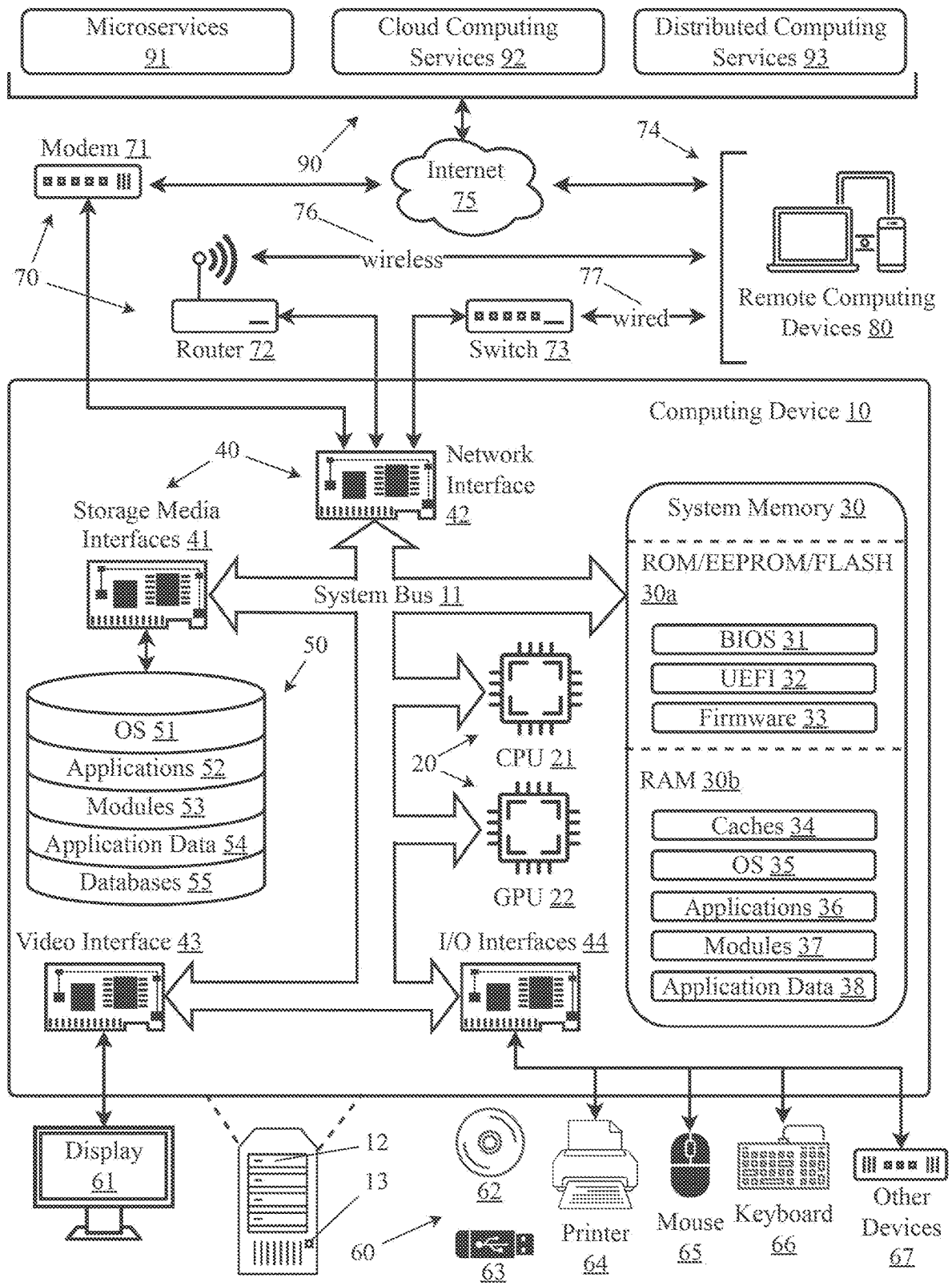
FIG. 43 illustrates an exemplary computing environment on which an embodiment described herein may be implemented.

FIG. 43 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between, those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busture (ISA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions. Further, computing device 10 may comprise one or more specialized processors such as a graphics processing unit (GPU) 22 configured to accelerate processing of computer graphics and images via a large array of specialized processing cores arranged in parallel.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IOT) devices where processing power and data storage space is limited. Volatile memory 30b is erased when power to the memory is removed and is typically used for short-term storage of data for processing. Volatile memory 30b includes memory types such as random access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, and graph databases.

Applications (also known as computer software or software applications) are sets of programming instructions designed to perform specific tasks or provide specific functionality on a computer or other computing devices. Applications are typically written in high-level programming languages such as C++, Java, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network. Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices.

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, main frame computers, network nodes, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP or message queues. Microservices 91 can be combined to perform more complex processing tasks.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over the Internet on a subscription basis.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A system for compressing volumetric medical imaging data using codebooks, comprising:
   a computing system comprising at least a memory and a processor;
   an encoder comprising a first plurality of programming instructions that, when operating on the processor, cause the computing system to:
     receive volumetric medical imaging data, the volumetric medical imaging data comprising a sequence of images;
     deconstruct the volumetric medical imaging data into a plurality of sourceblocks; and
     generate an image codebook from the plurality of sourceblocks using an entropy encoding method wherein codewords are assigned to each sourceblock based on the codeword's frequency of occurrence;
   a transformation estimation subsystem comprising a second plurality of programming instructions that, when operating on the processor, cause the computing system to:
     receive the volumetric medical imaging data;
     select an image from the sequence of images to be a reference image;
     for each remaining image of the sequence of images:
       estimate a transformation between the reference image and the image by representing the estimate transformation as a matrix, wherein the matrix elements correspond to parameters of the transformation;
       construct a transformation matrix based on the estimated parameters;
     store the plurality of transformation matrices in a data storage system.

2. The system of claim 1, wherein the volumetric medical imaging data comprises tomosynthesis imaging data.

3. The system of claim 1, wherein the encoder is further configured to:
   obtain the plurality of transformation matrices;
   deconstruct the plurality of transformation matrices into a plurality of sourceblocks;
   generate a matrix codebook from the plurality of sourceblocks using an entropy encoding method wherein codewords are assigned to each sourceblock based on the codeword's frequency of occurrence; and
   store the matrix codebook and the image codebook in the data storage system.

4. The system of claim 1, wherein the transformation estimation subsystem is further configured to decompose each transformation matrix into two or more matrices.

5. The system of claim 4, wherein the encoder is further configured to:
   obtain the decomposed transformation matrices;
   deconstruct the decomposed transformation matrices into a plurality of sourceblocks;
   generate a matrix codebook from the plurality of sourceblocks using an entropy encoding method wherein codewords are assigned to each sourceblock based on the codeword's frequency of occurrence; and
   store the matrix codebook and the image codebook in the data storage system.

6. A method for compressing volumetric medical imaging data using codebooks, comprising the steps of:
- receiving volumetric medical imaging data, the volumetric medical imaging data comprising a sequence of images;
- deconstructing the volumetric medical imaging data into a plurality of sourceblocks; and
- generating an image codebook from the plurality of sourceblocks using an entropy encoding method wherein codewords are assigned to each sourceblock based on the codeword's frequency of occurrence;
- selecting an image from the sequence of images to be a reference image;
- for each remaining image of the sequence of images:
  - estimating a transformation between the reference image and the image by representing the estimate transformation as a matrix, wherein the matrix elements correspond to parameters of the transformation;
  - constructing a transformation matrix based on the estimated parameters;
- storing the plurality of transformation matrices in a data storage system.

7. The method of claim 6, wherein the volumetric medical imaging data comprises tomosynthesis imaging data.

8. The method of claim 6, further comprising the steps of:
- obtaining the plurality of transformation matrices;
- deconstructing the plurality of transformation matrices into a plurality of sourceblocks;
- generating a matrix codebook from the plurality of sourceblocks using an entropy encoding method wherein codewords are assigned to each sourceblock based on the codeword's frequency of occurrence; and
- storing the matrix codebook and the image codebook in the data storage system.

9. The method of claim 6, further comprising the step of decomposing each transformation matrix into two or more matrices.

10. The method of claim 9, further comprising the steps of:
- obtaining the decomposed transformation matrices;
- deconstructing the decomposed transformation matrices into a plurality of sourceblocks;
- generating a matrix codebook from the plurality of sourceblocks using an entropy encoding method wherein codewords are assigned to each sourceblock based on the codeword's frequency of occurrence; and
- storing the matrix codebook and the image codebook in the data storage system.

\* \* \* \* \*